(12) United States Patent
Cernea

(10) Patent No.: US 9,331,091 B1
(45) Date of Patent: May 3, 2016

(54) 3D NAND MEMORY WITH SOCKETED FLOATING GATE CELLS AND PROCESS THEREFOR

(71) Applicant: SanDisk Technologies, Inc., Plano, TX (US)

(72) Inventor: Raul Adrian Cernea, Santa Clara, CA (US)

(73) Assignee: SANDISK TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 14/825,405

(22) Filed: Aug. 13, 2015

(51) Int. Cl.
*H01L 27/115* (2006.01)

(52) U.S. Cl.
CPC .... *H01L 27/11556* (2013.01); *H01L 27/11524* (2013.01)

(58) Field of Classification Search
CPC ............... H01L 27/11524; H01L 27/11556; H01L 27/11529; H01L 27/1157; G11C 2213/75
USPC ............ 257/66, 324; 438/128, 257, 261, 267; 365/51, 66, 185.03
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 7,558,141 B2 | 7/2009 | Katsumata et al. | |
| 7,626,864 B2 | 12/2009 | Wang | |
| 8,405,142 B2 | 3/2013 | Katsumata et al. | |
| 8,958,228 B2 | 2/2015 | Samachisa et al. | |
| 2006/0270156 A1 | 11/2006 | Kim et al. | |
| 2011/0309429 A1 | 12/2011 | Kiyotoshi | |
| 2012/0147650 A1* | 6/2012 | Samachisa ......... | G11C 13/0002 365/51 |

(Continued)

OTHER PUBLICATIONS

U.S. Appl. No. 14/494,869 entitled "3D NAND Memory With Socketed Floating Gate Cells," filed Sep. 24, 2014, 102 pages.

(Continued)

*Primary Examiner* — Selim Ahmed
(74) *Attorney, Agent, or Firm* — Davis Wright Tremaine LLP

(57) ABSTRACT

A 3D NAND memory has vertical NAND strings across multiple memory layers above a substrate, with each memory cell of a NAND string residing in a different memory layer. Word lines in each memory layer each has a series of socket components aligned to embed respective floating gates of a group memory cells. In this way, the word line to floating gate capacitive coupling is enhanced thereby allowing a 4 to 8 times reduction in cell dimension as well as reducing floating-gate perturbations between neighboring cells. At the same time floating-gate to floating-gate crosstalk is reduced. The memory is fabricated by using odd and even subarrays of vertical shafts on a multi-layer slab to create at different times odd and even socket components that overlap to form continuous word lines with socket components. A self-aligned 4-masks process is employed on the multi-layer slab.

19 Claims, 65 Drawing Sheets

(56) References Cited

U.S. PATENT DOCUMENTS

| | | |
|---|---|---|
| 2012/0220088 A1 | 8/2012 | Alsmeier |
| 2012/0314468 A1 | 12/2012 | Siau et al. |
| 2013/0083601 A1 | 4/2013 | Liu et al. |
| 2013/0107628 A1 | 5/2013 | Dong et al. |
| 2013/0153984 A1 | 6/2013 | Ramaswamy |
| 2013/0194871 A1 | 8/2013 | Lin et al. |
| 2014/0252363 A1 | 9/2014 | Liu et al. |

OTHER PUBLICATIONS

U.S. Appl. No. 14/494,873 entitled "Process for 3D NAND Memory With Socketed Floating Gate Cells," filed Sep. 24, 2014, Raul Adrian Cernea, Applicant, 102 pages.

U.S. Appl. No. 14/494,877 entitled "3D Memory Having NAND Strings Switched by Transistors With Elongated Polysilicon Gates," filed Sep. 24, 2014, Raul Adrian Cernea, Applicant, 102 pages.

U.S. Appl. No. 14/825,405 entitled "3D NAND Memory With Socketed Floating Gate Cells and Process Therefor," filed Aug. 13, 2015, Raul Adrian Cernea, Applicant, 143 pages.

U.S. Appl. No. 14/825,408 entitled "Efficient Process for 3D NAND Memory With Socketed Floating Gate Cells," filed Aug. 13, 2015, Raul Adrian Cernea, Applicant, 142 pages.

U.S. Appl. No. 14/825,433 entitled "Process for Word Line Connections in 3D Memory," filed Aug. 13, 2015, Raul Adrian Cernea, Applicant, 141 pages.

U.S. Appl. No. 14/825,506 entitled "Process for 3D NAND Memory With Socketed Floating Gate Cells," filed Aug. 13, 2015, Raul Adrian Cernea, Applicant, 143 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

Non-Final Office Action issued in U.S. Appl. No. 14/825,506, mailed Feb. 8, 2016, 5 pages.

Non-Final Office Action issued in U.S. Appl. No. 14/825,408, mailed Feb. 12, 2016, 5 pages.

\* cited by examiner

2D NAND MEMORY

3D NAND MEMORY

4-Mask Process for forming 3D Memory with Socketed Word lines

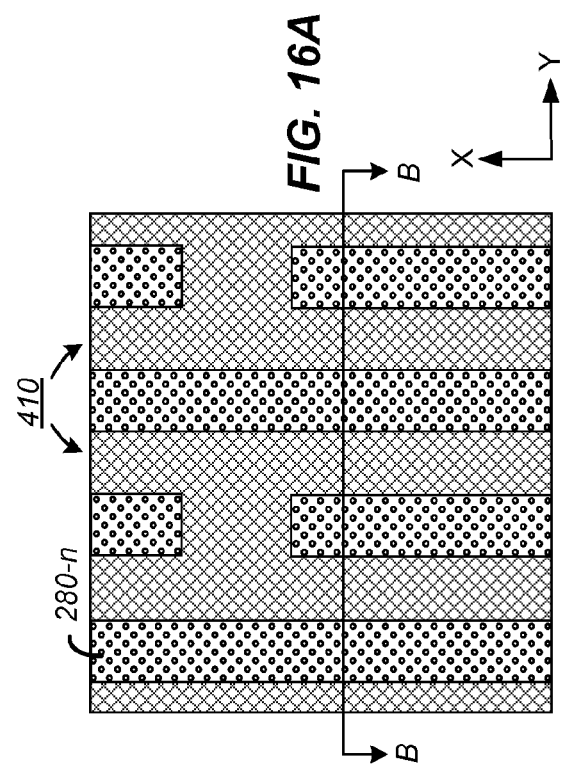
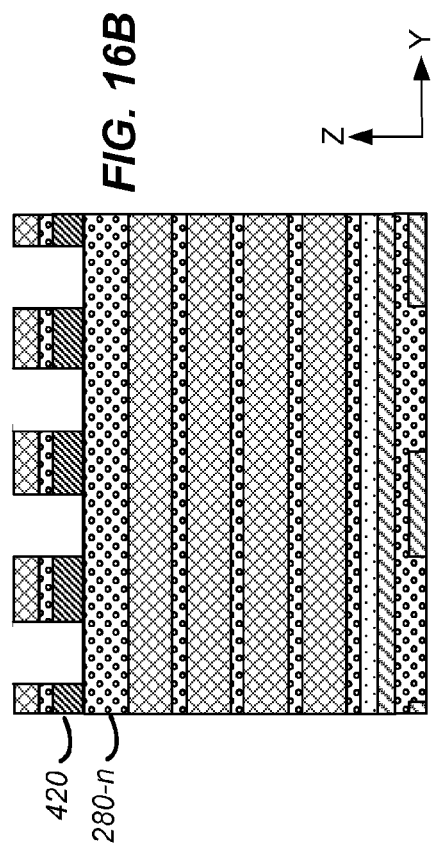
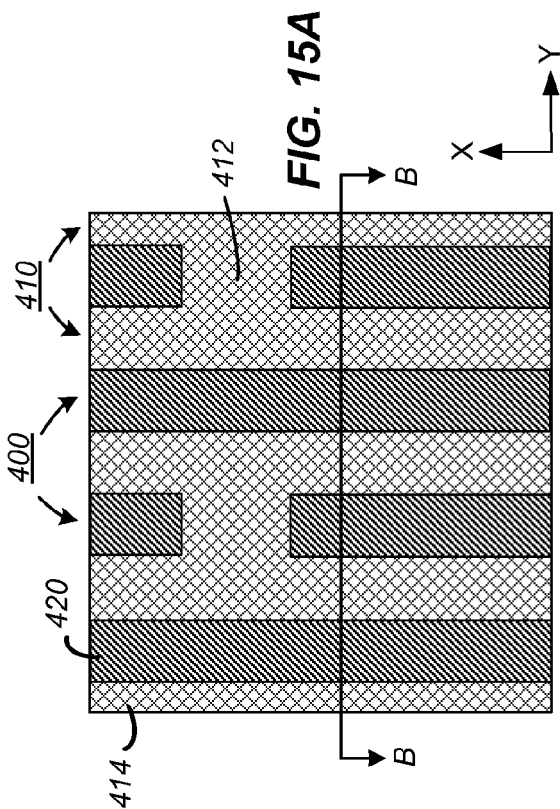
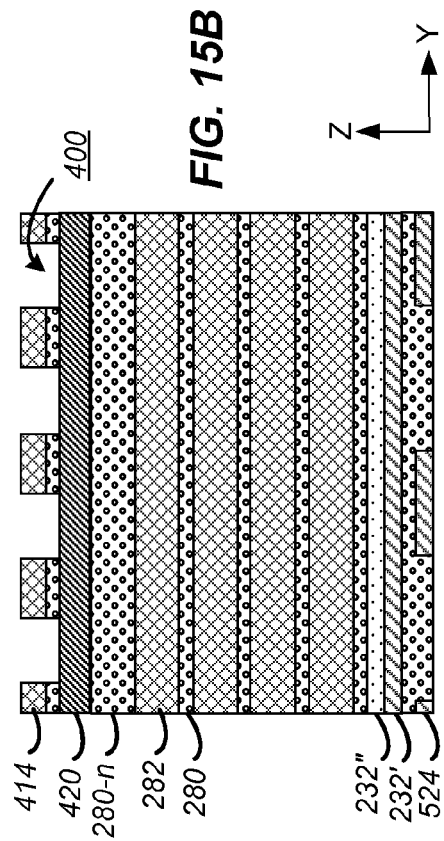

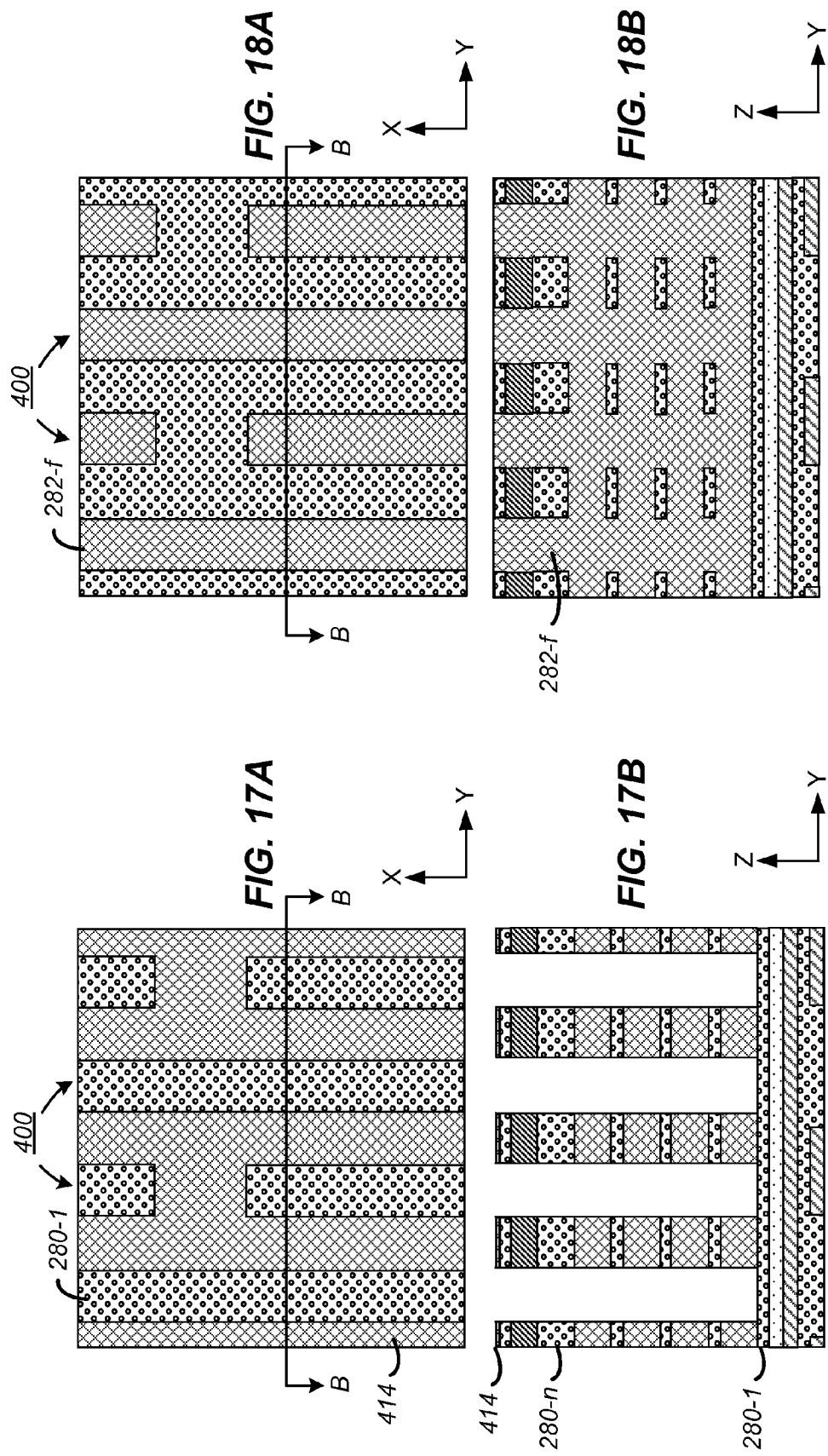

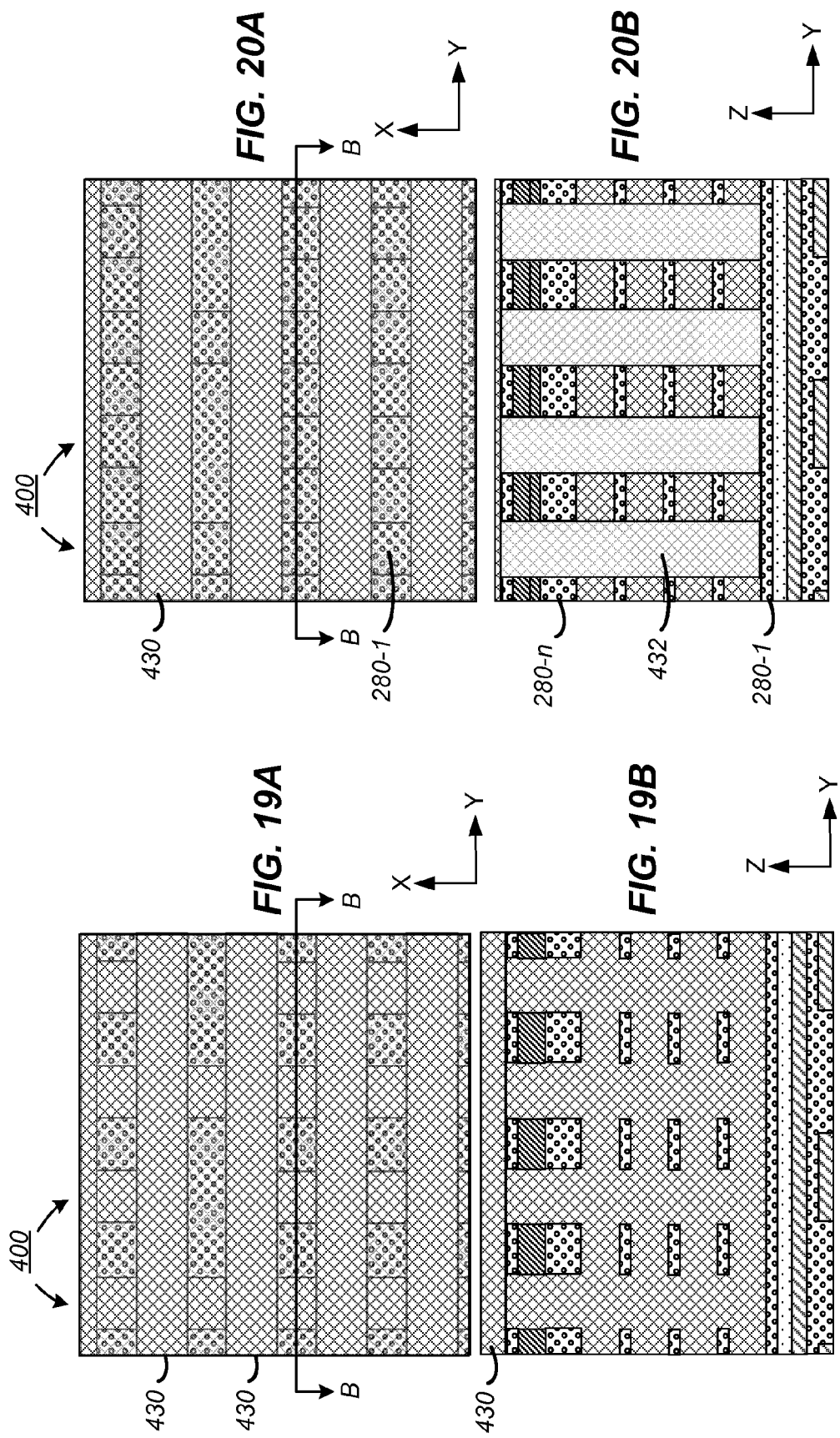

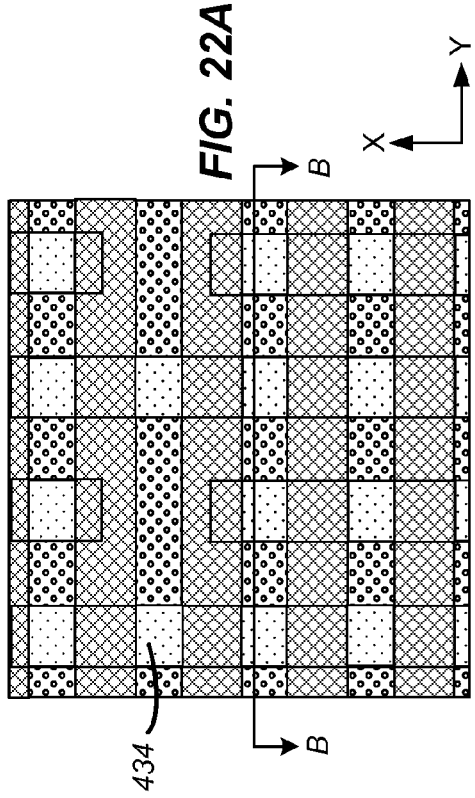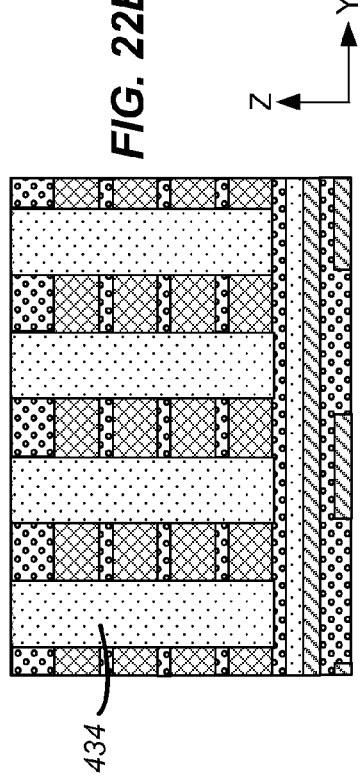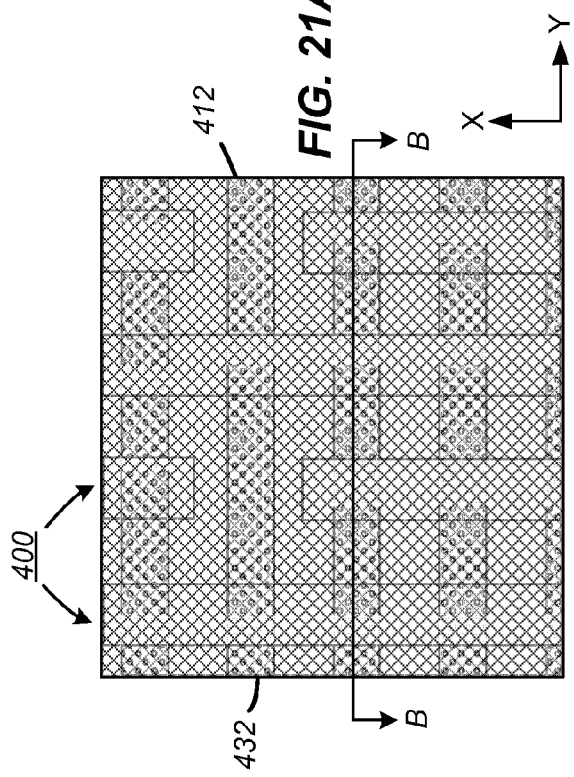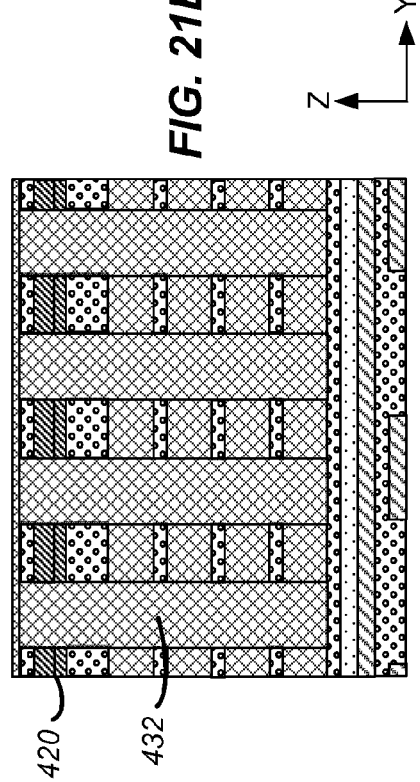

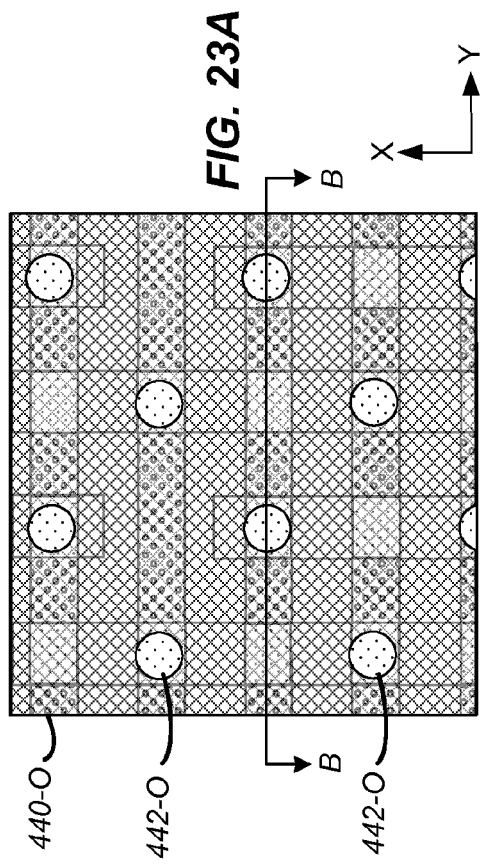
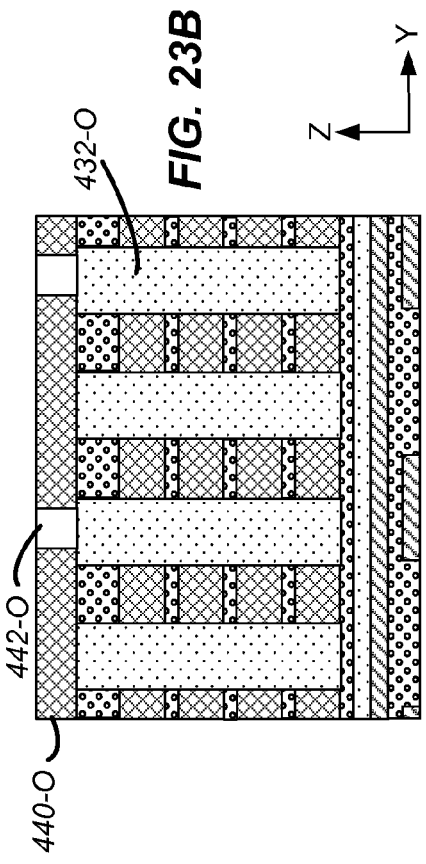
FIG. 23A
FIG. 23B
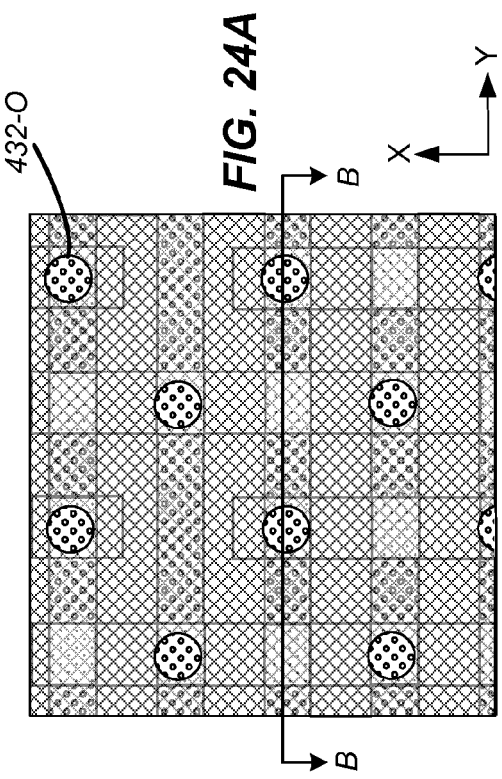
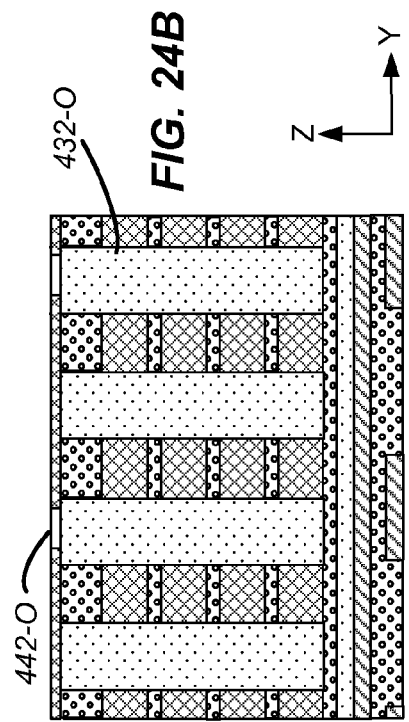
FIG. 24A
FIG. 24B

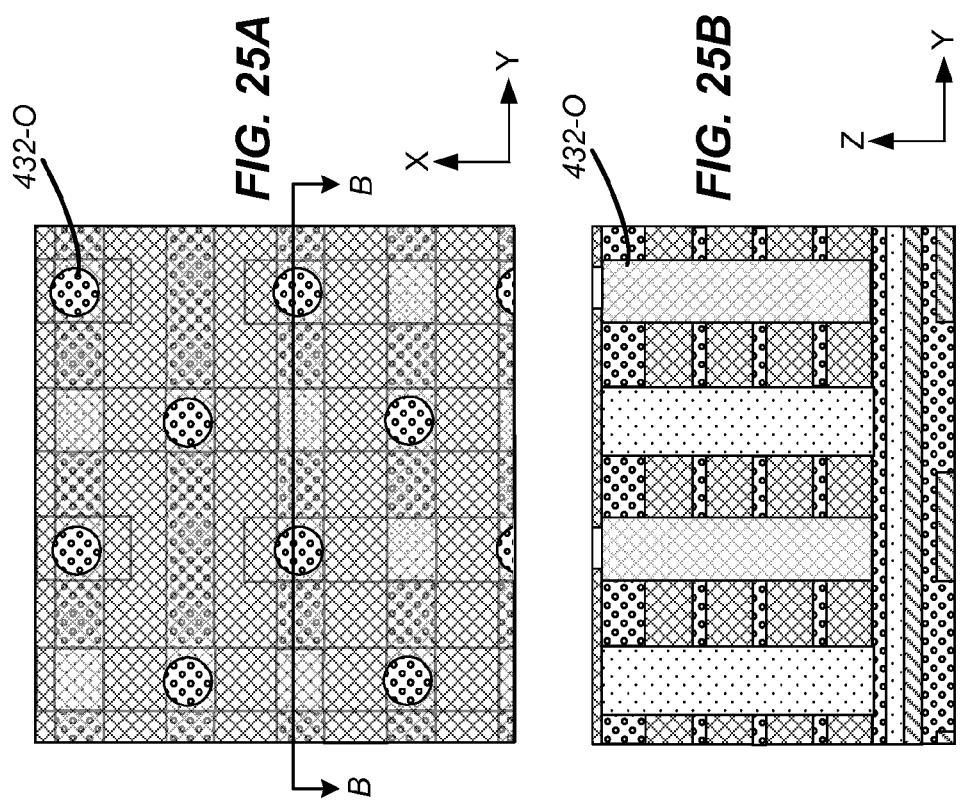

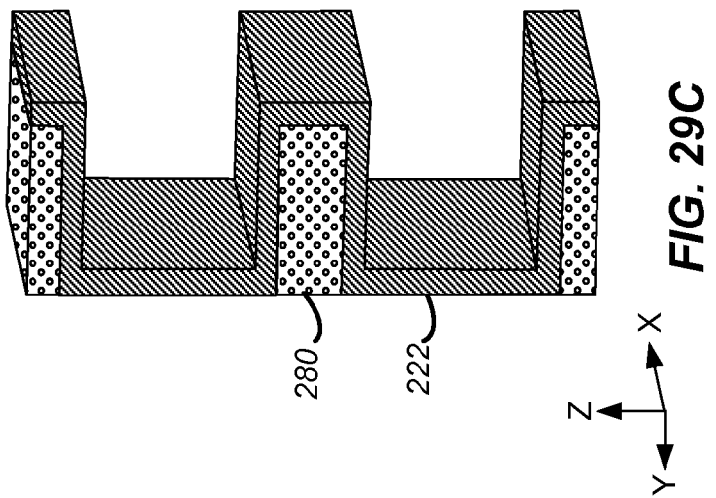
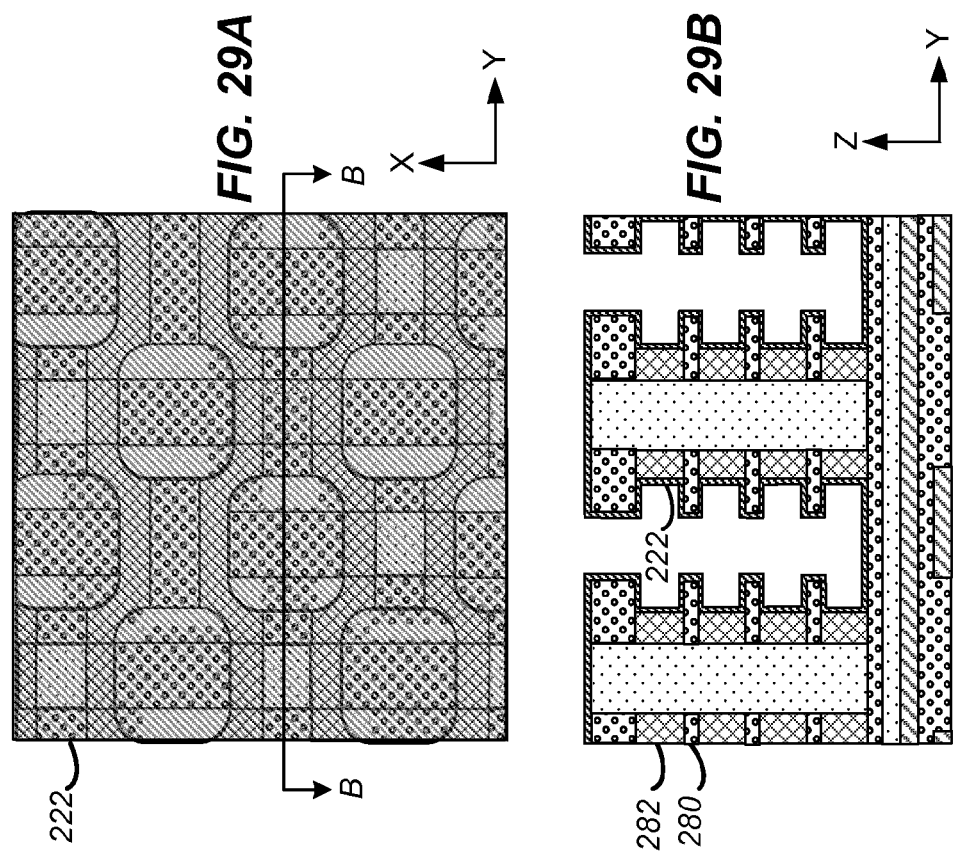
FIG. 29C
FIG. 29A
FIG. 29B

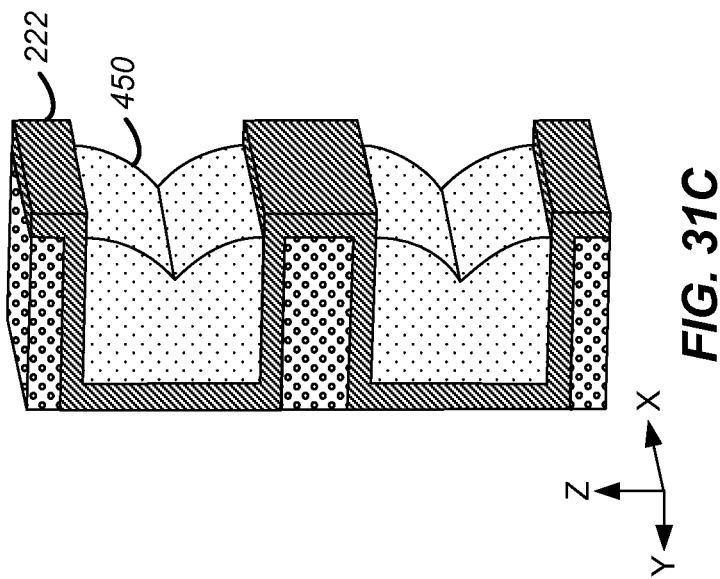
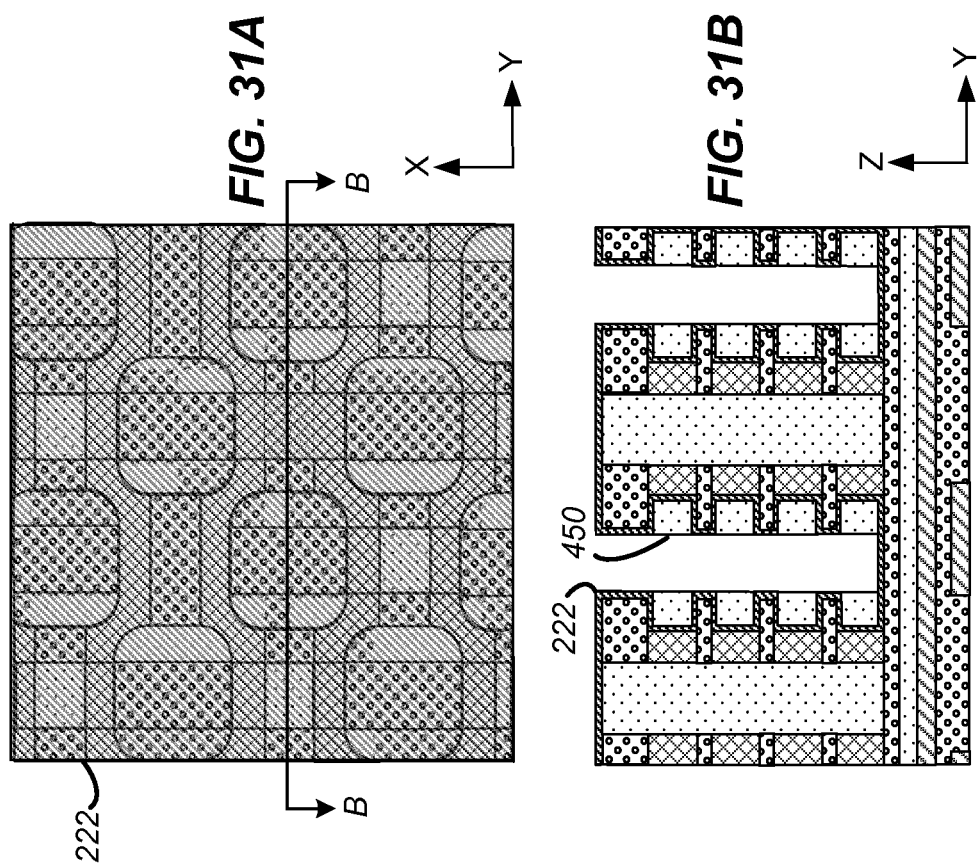

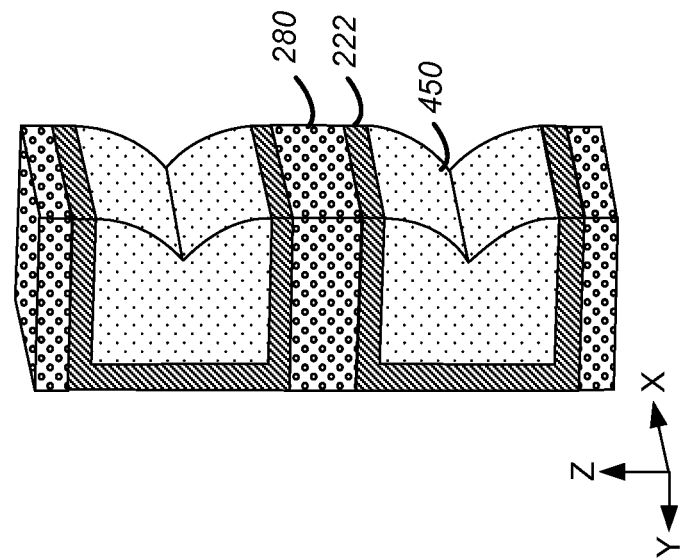
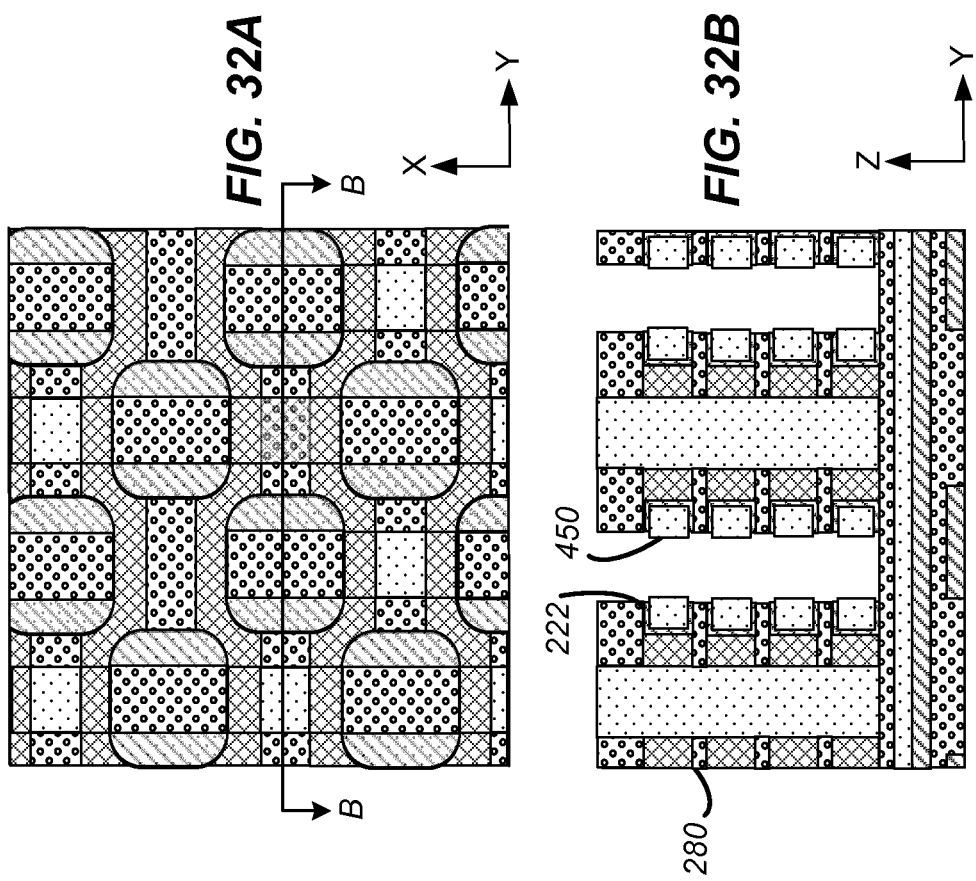
FIG. 32C
FIG. 32A
FIG. 32B

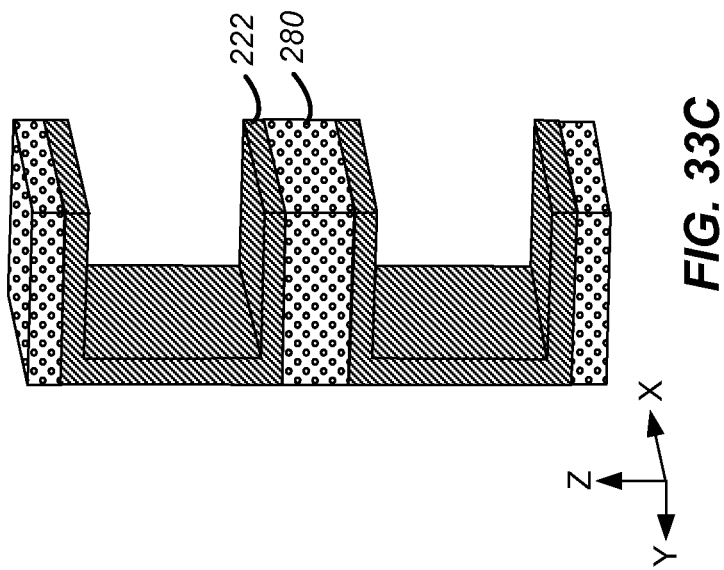
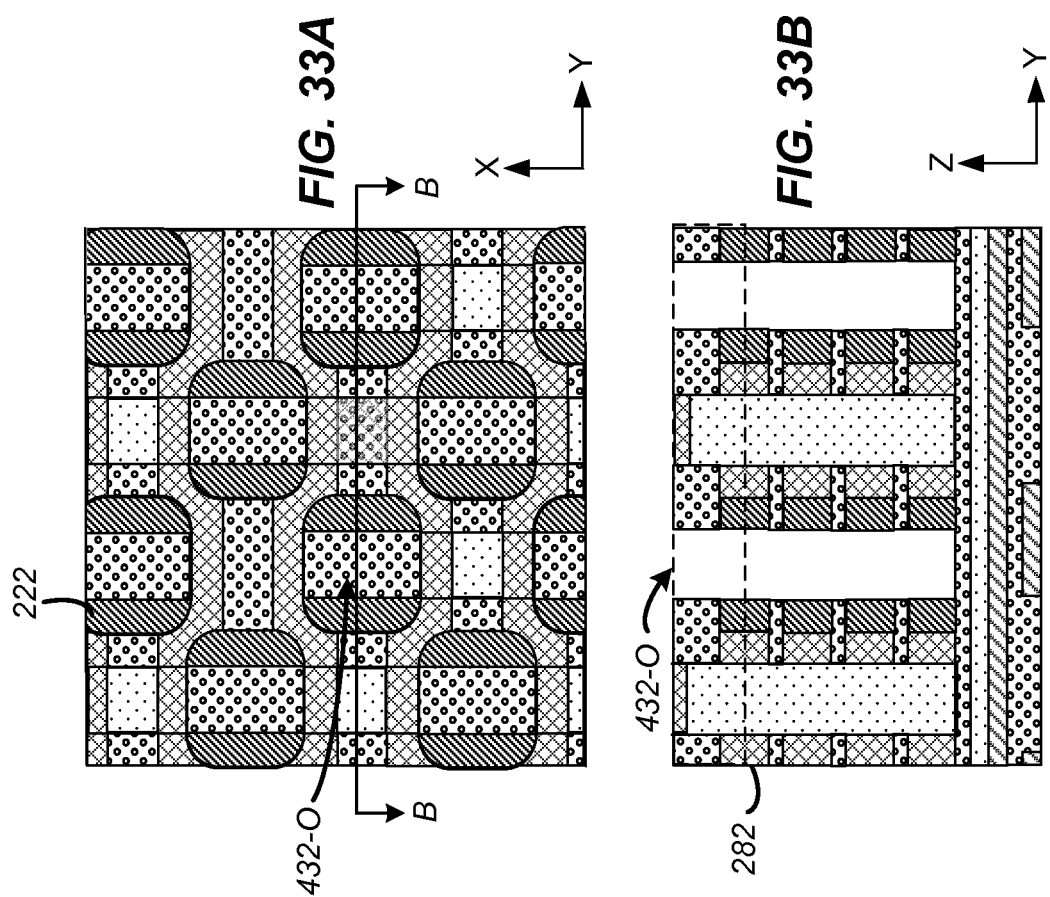

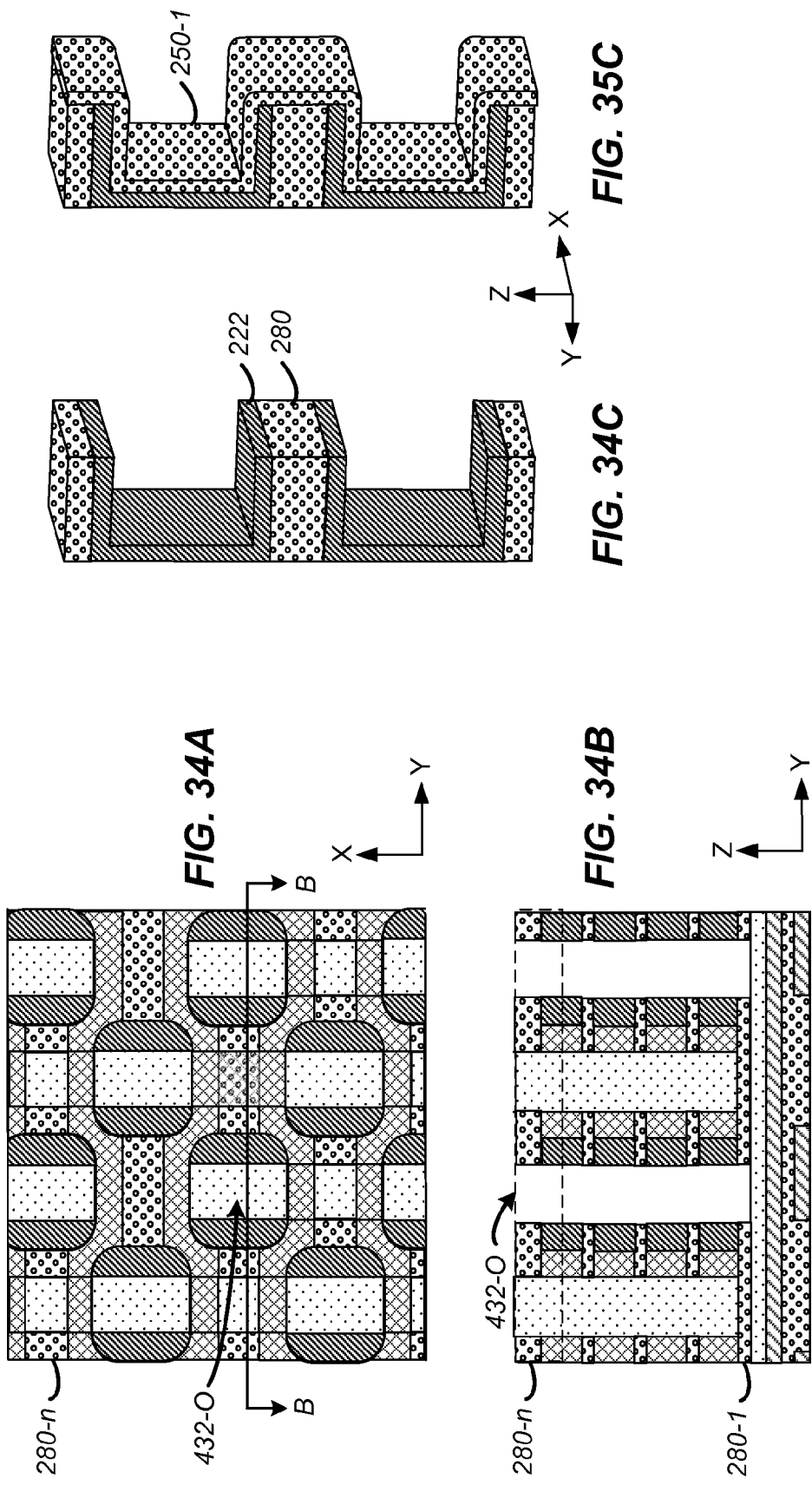

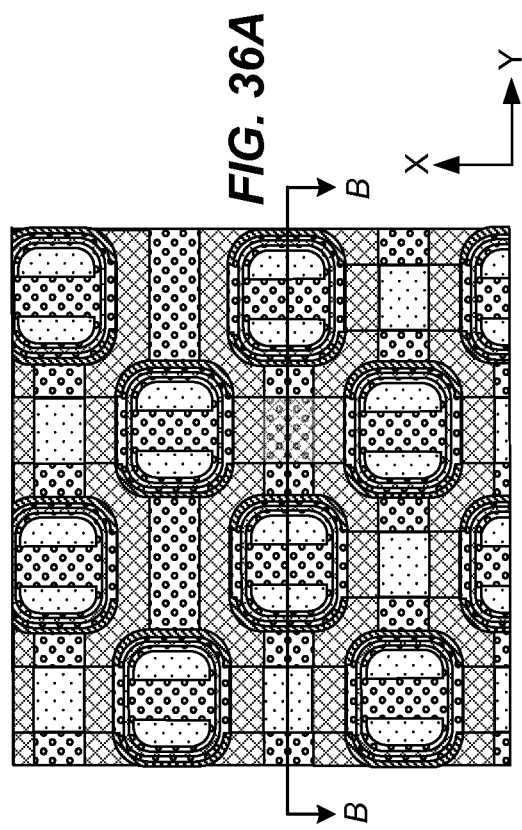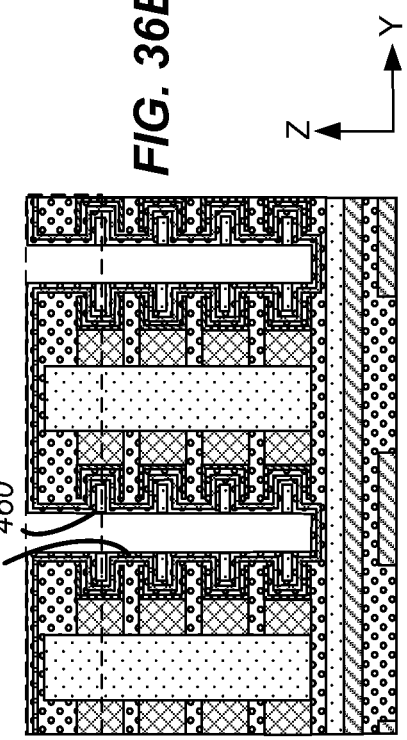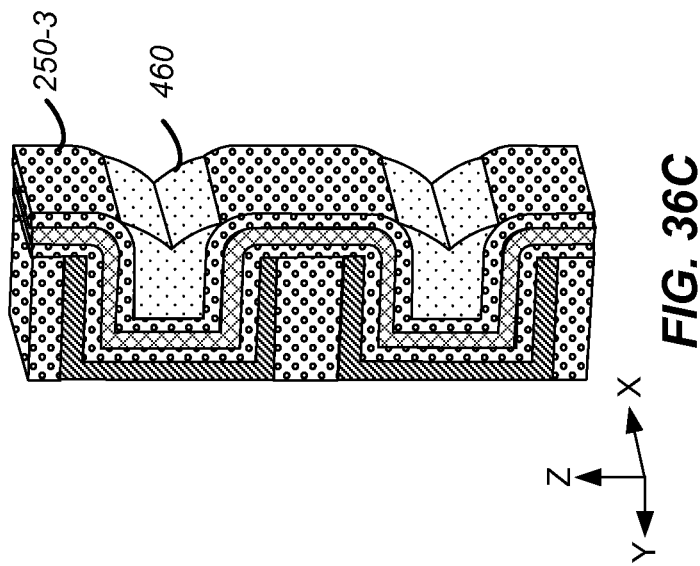
FIG. 36A
FIG. 36B
FIG. 36C

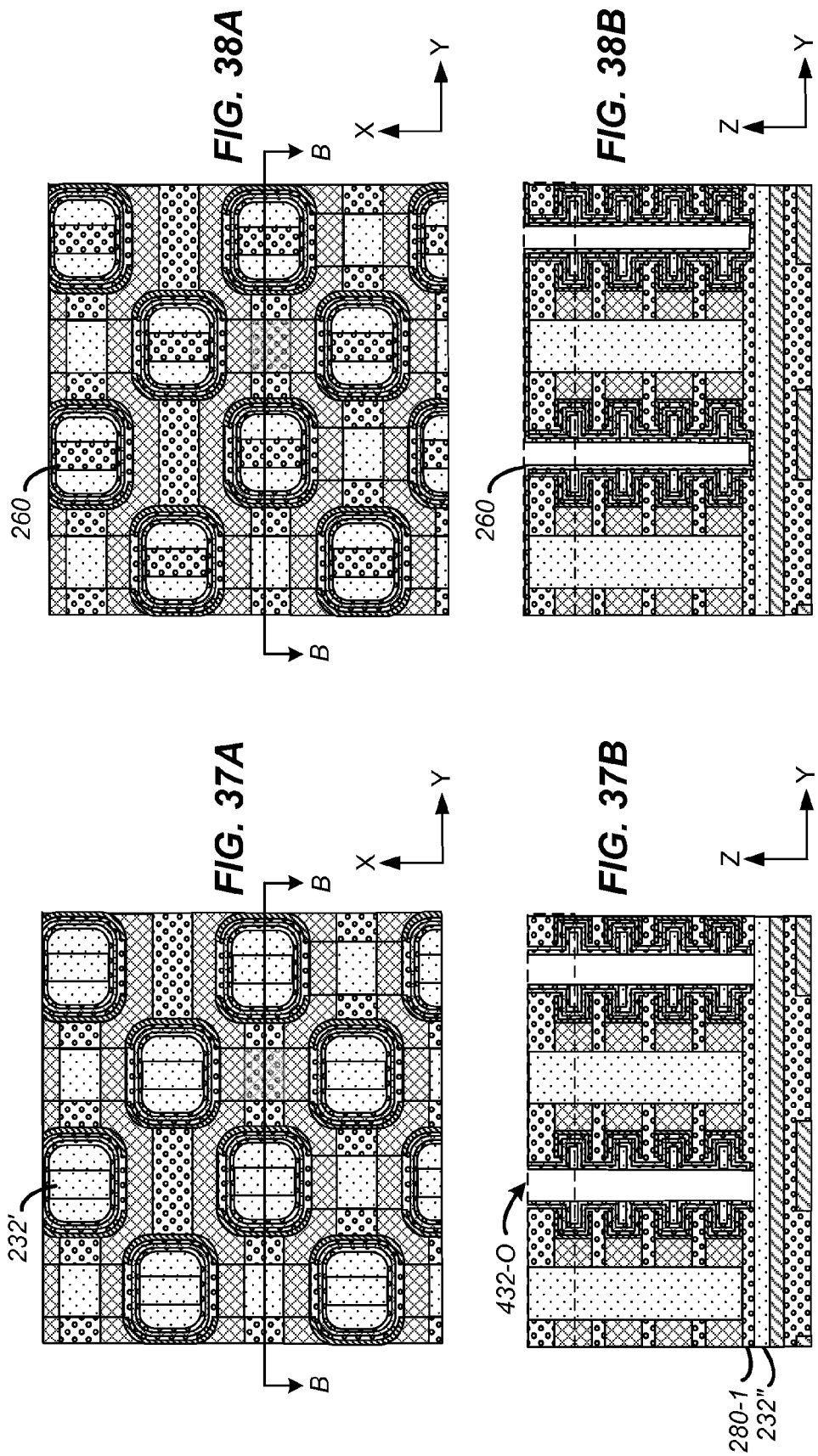

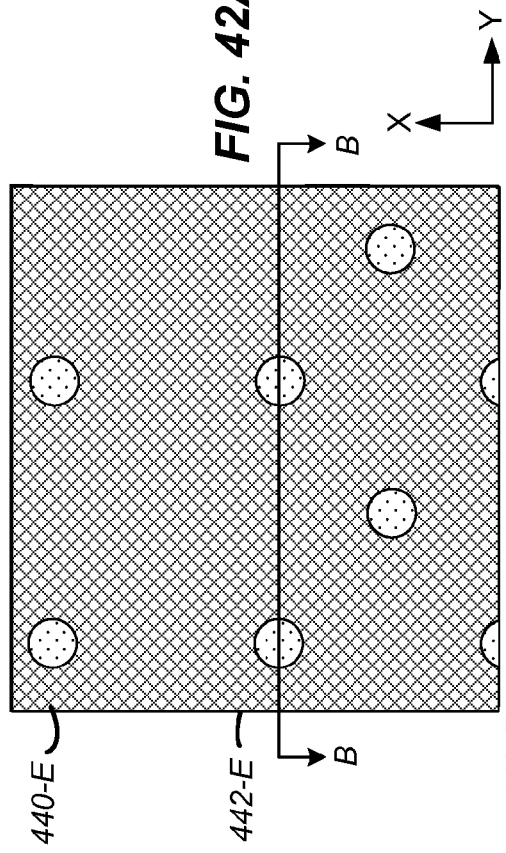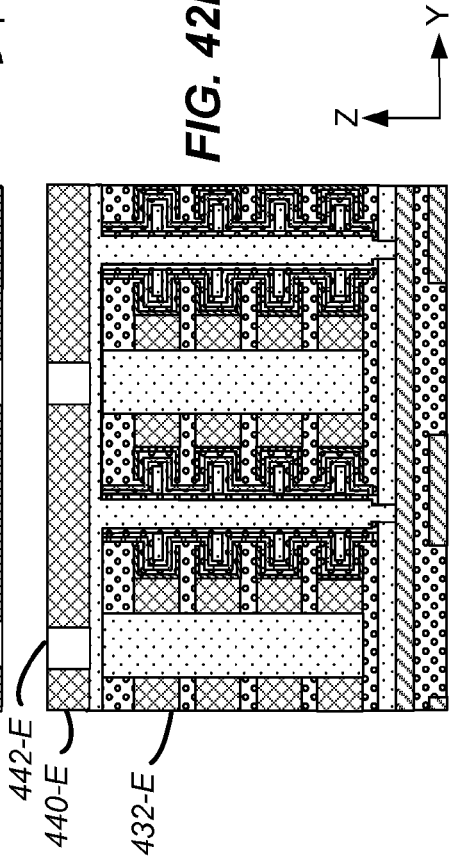

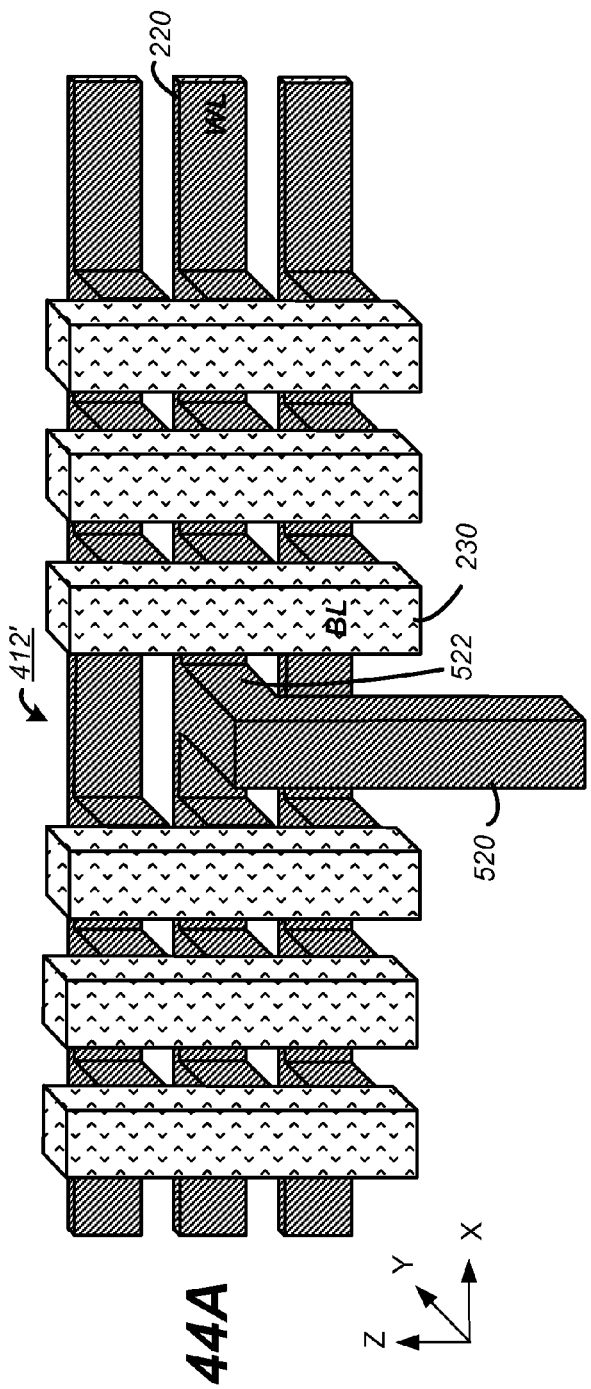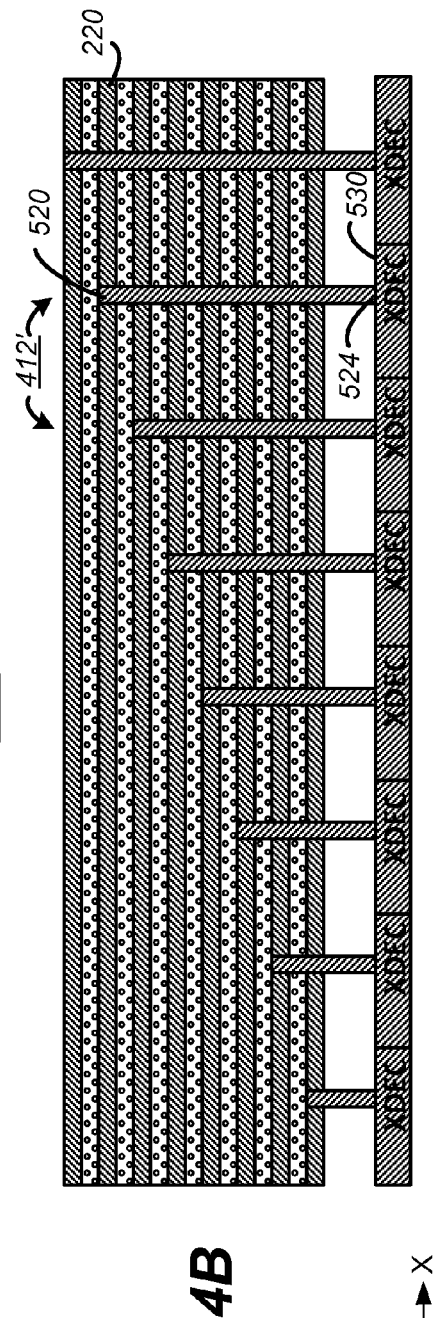
FIG. 44A
FIG. 44B

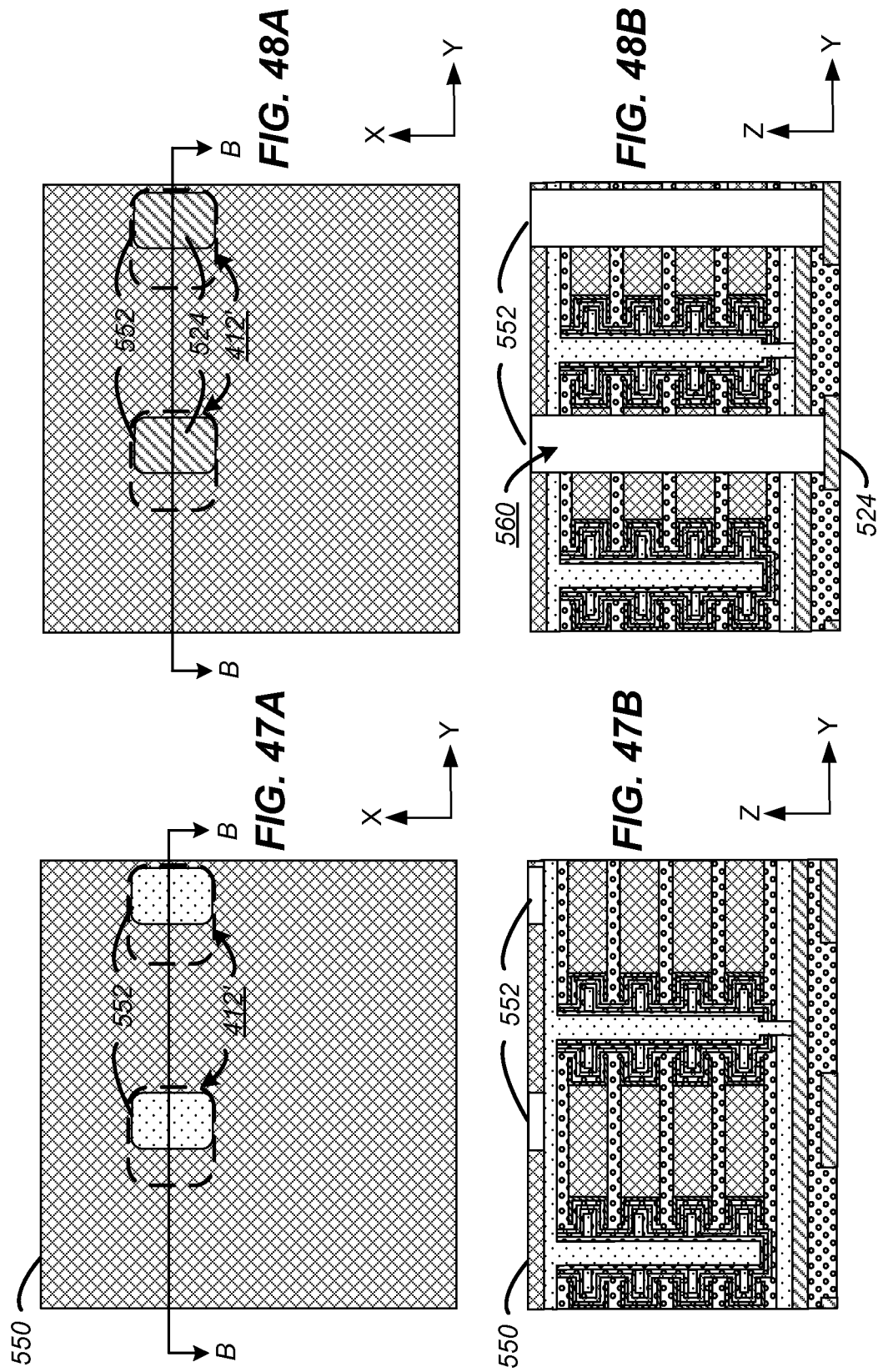

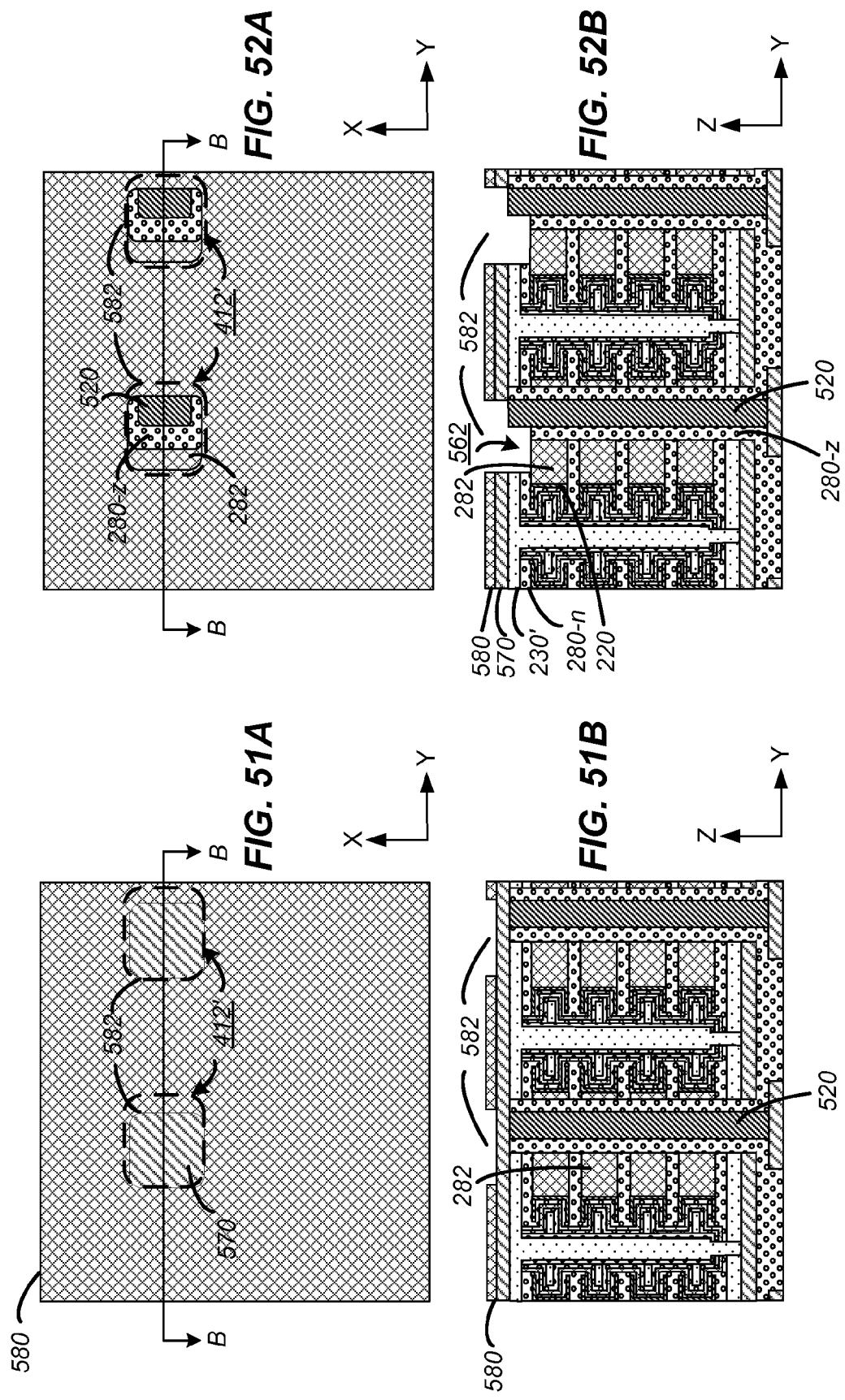

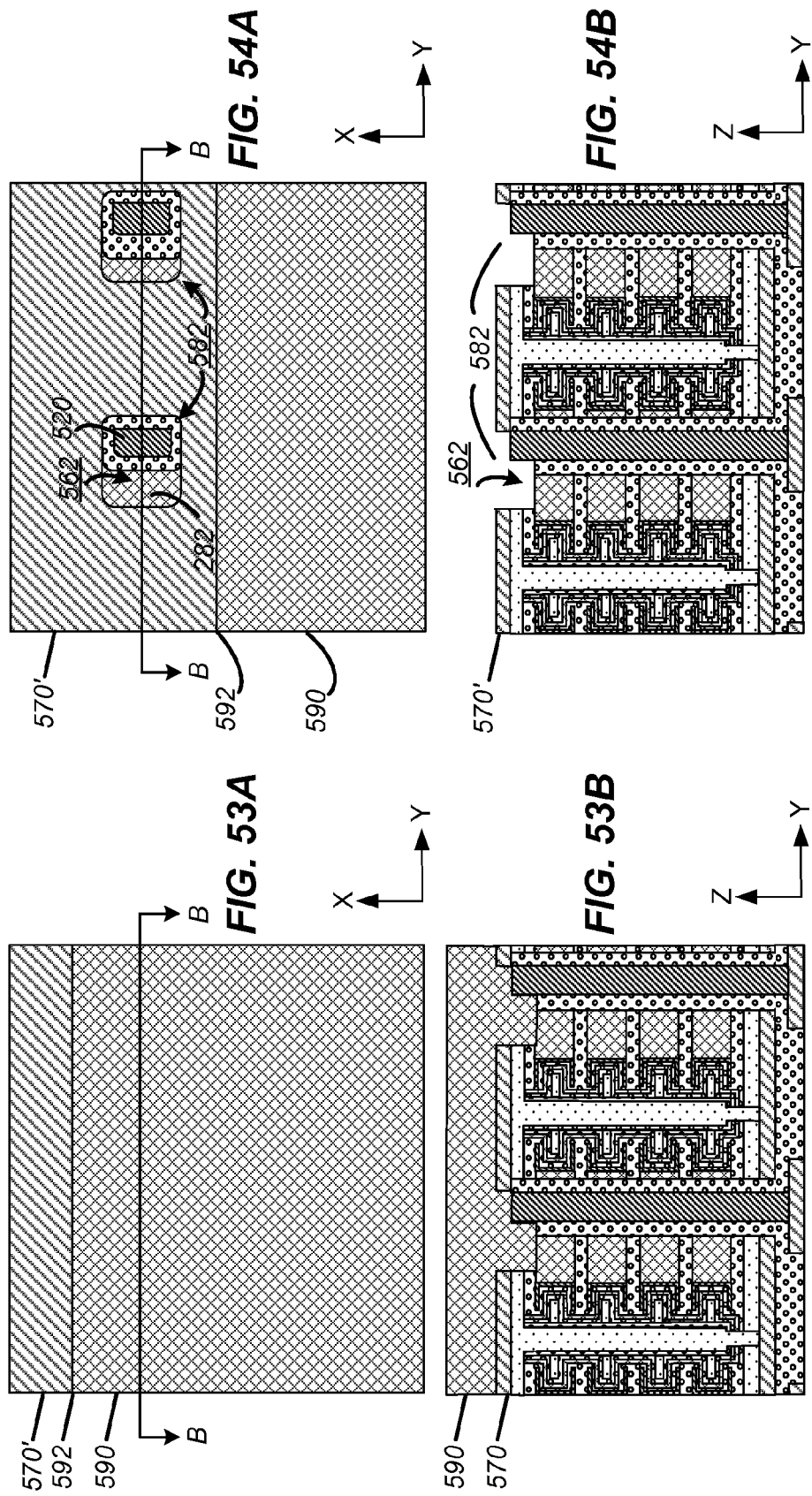

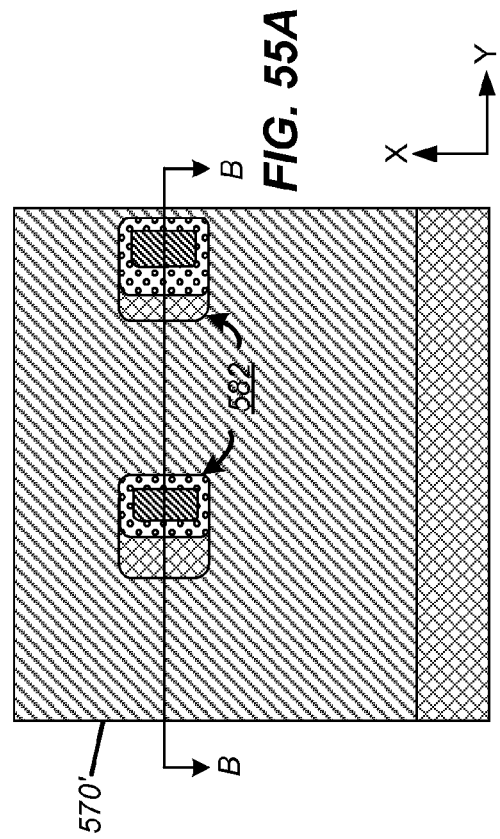
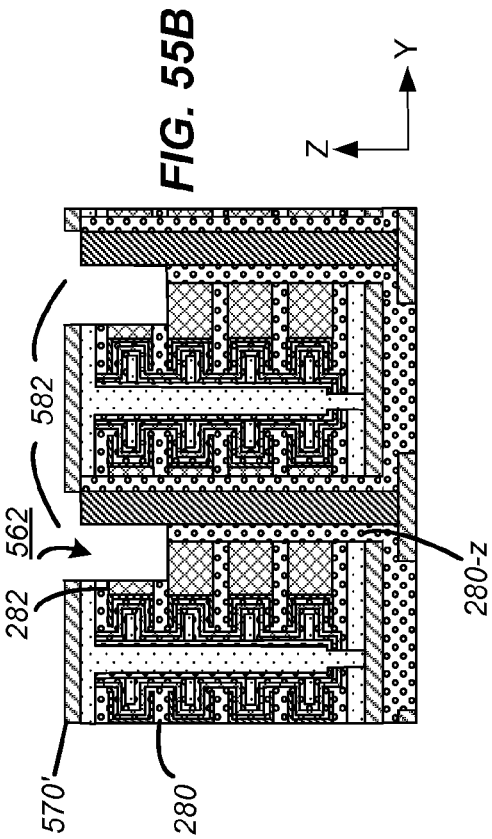
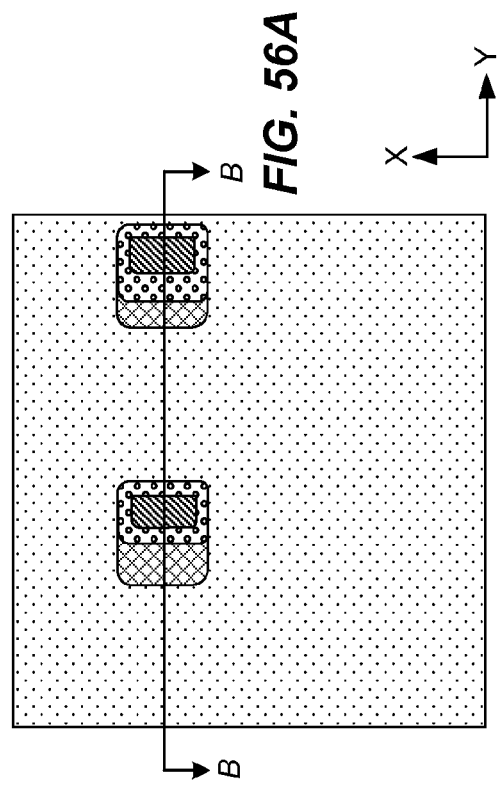
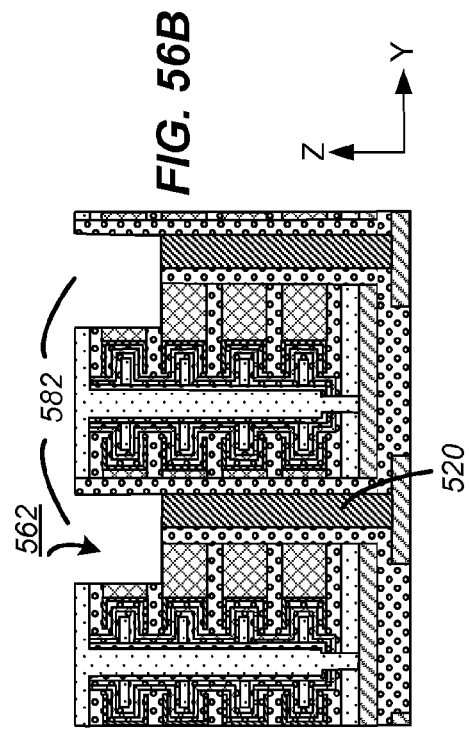

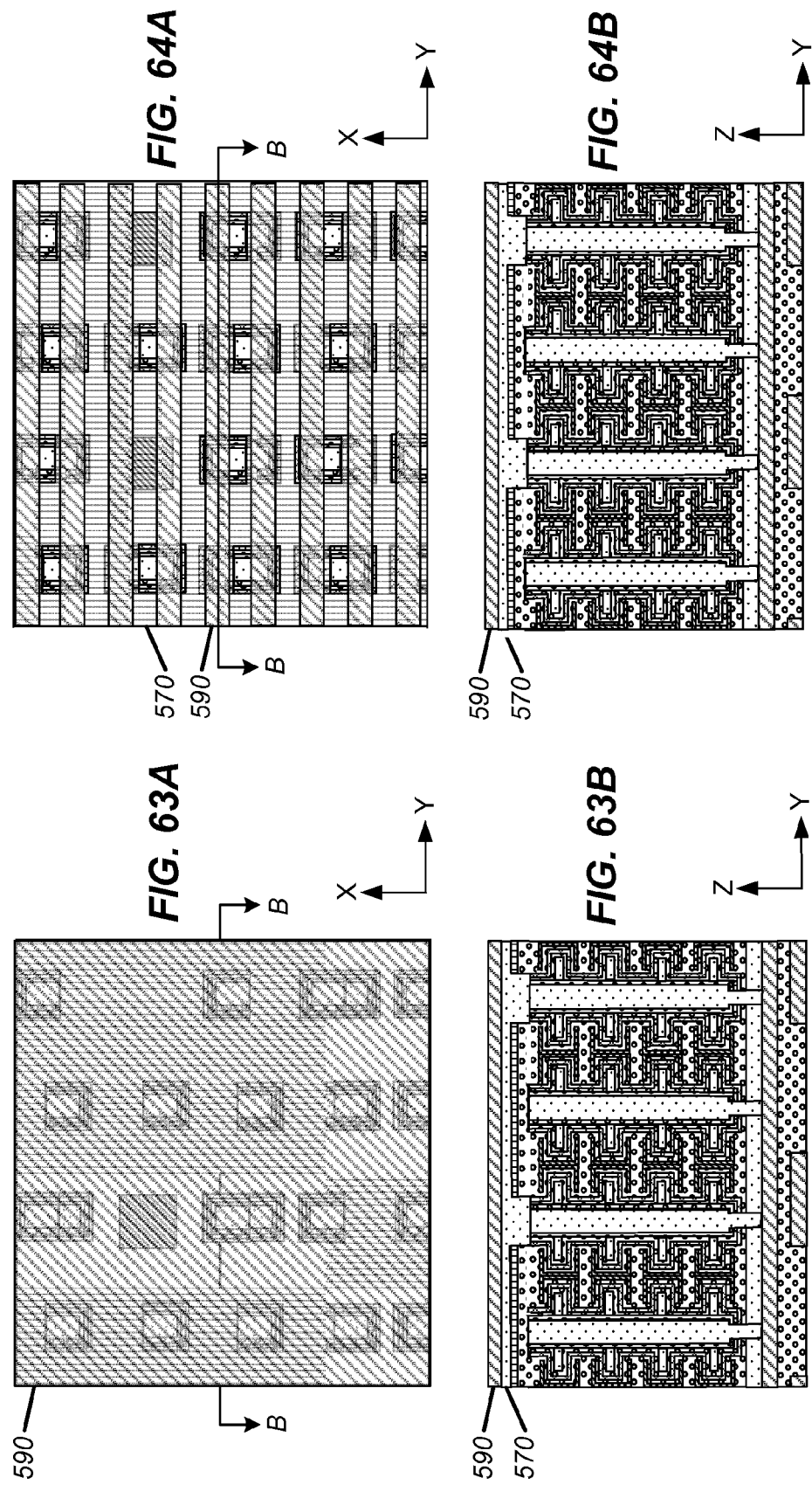

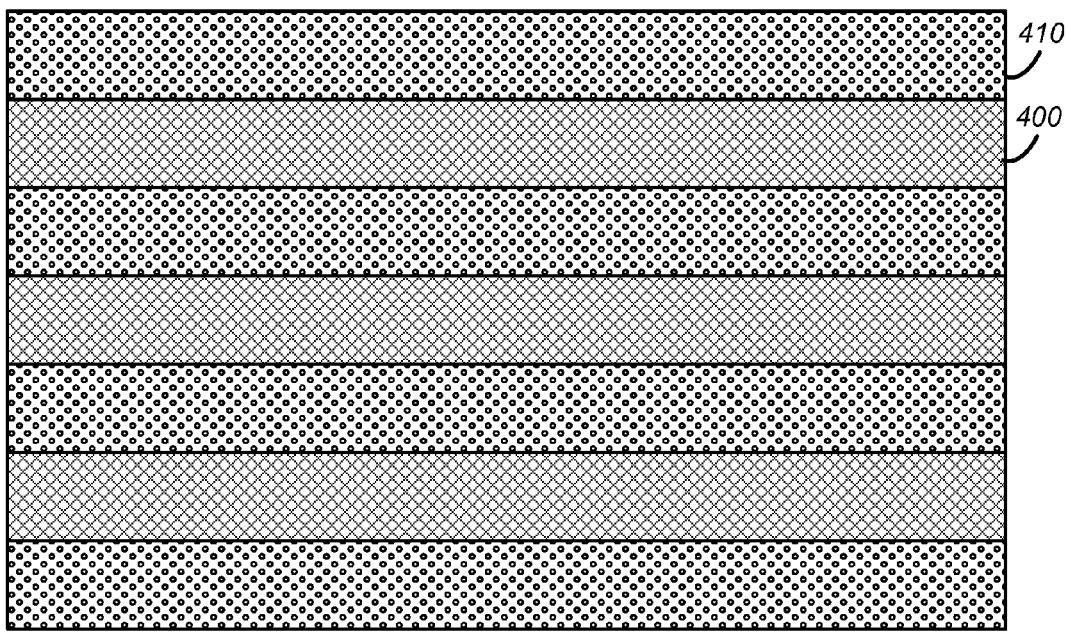
FIG. 66
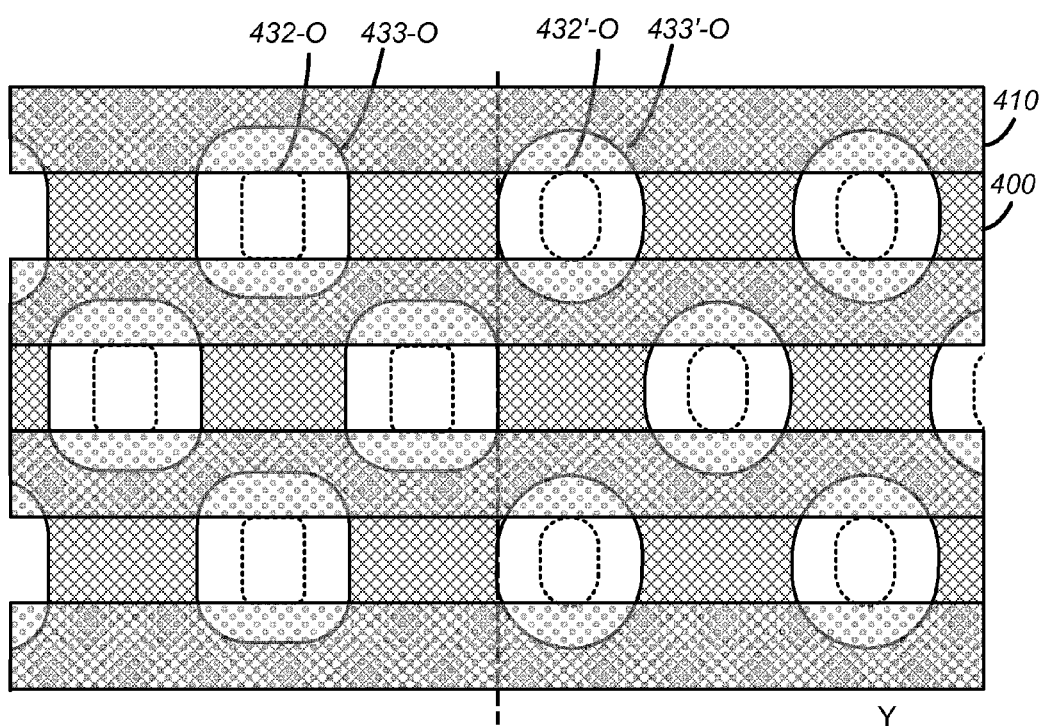
FIG. 67A  FIG. 67B

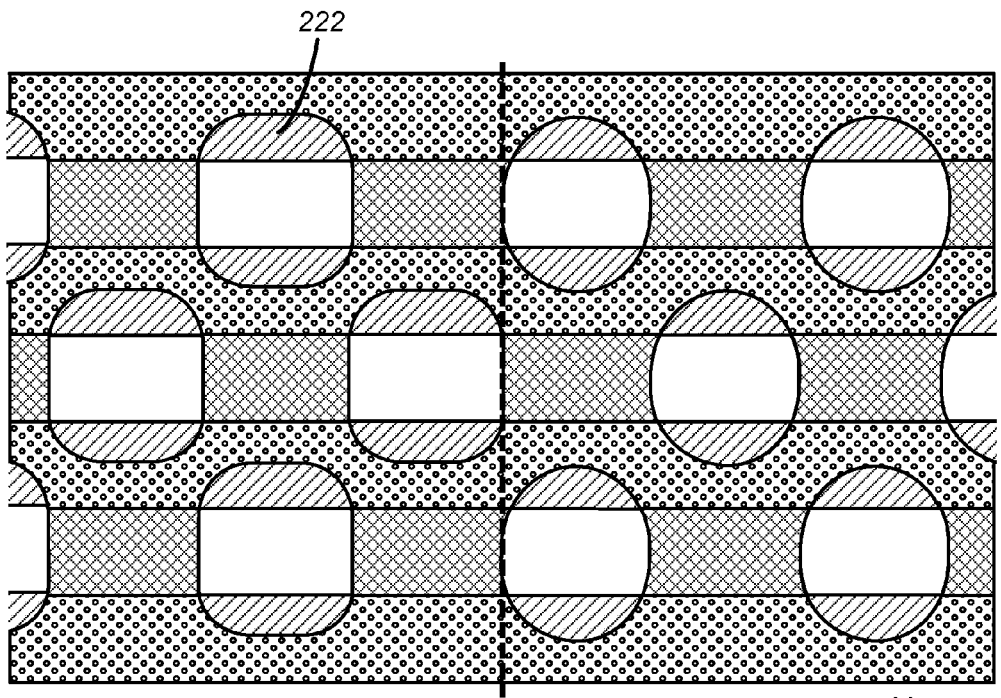
FIG. 68A  FIG. 68B
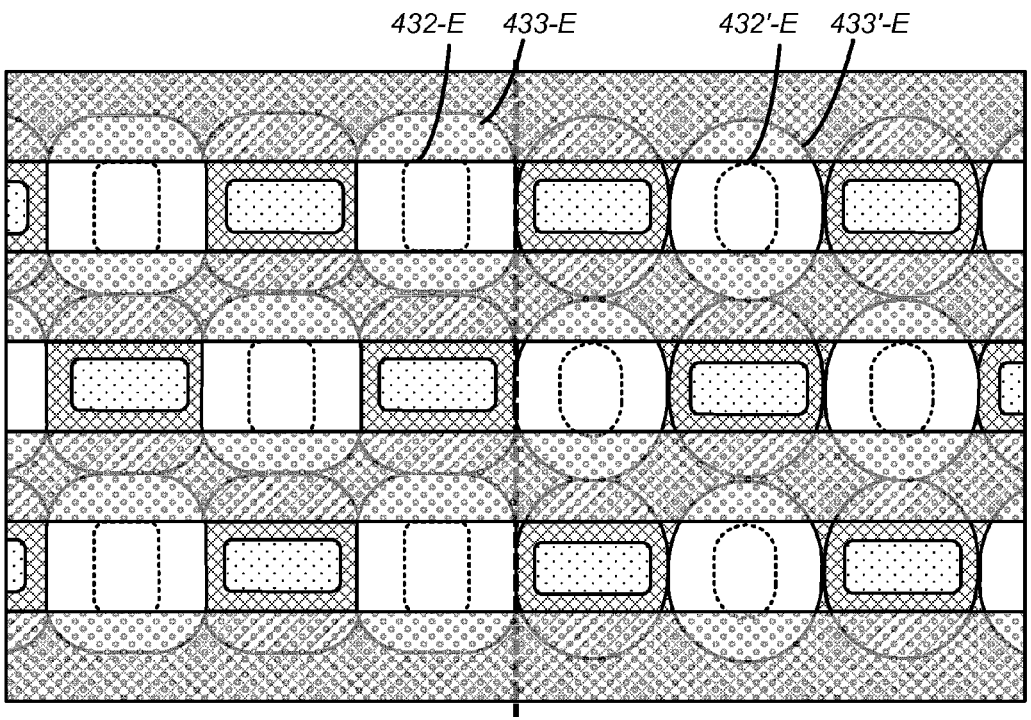
FIG. 69A  FIG. 69B

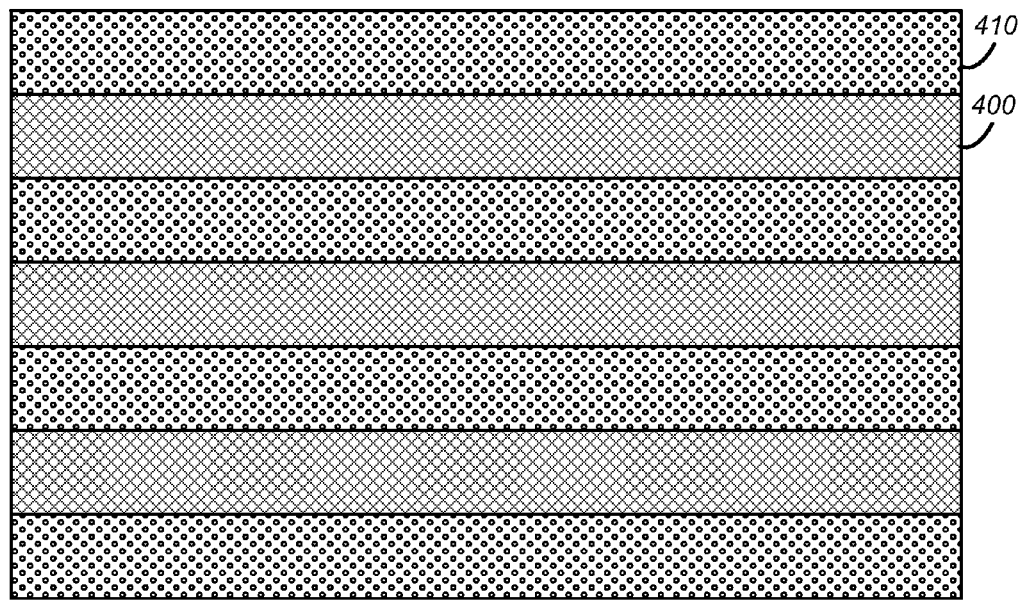
FIG. 71
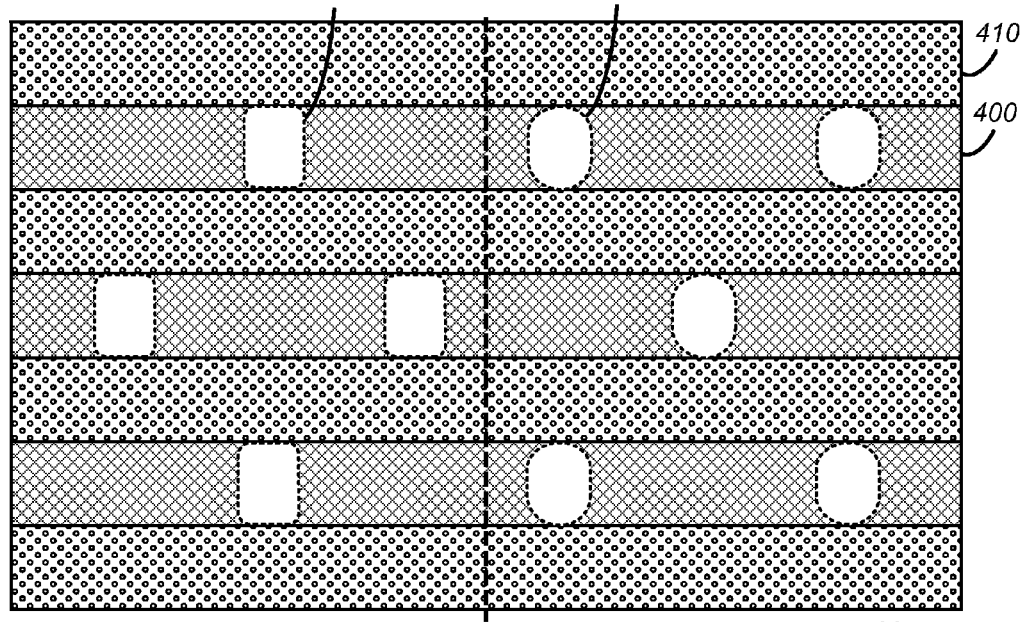
FIG. 72A  FIG. 72B

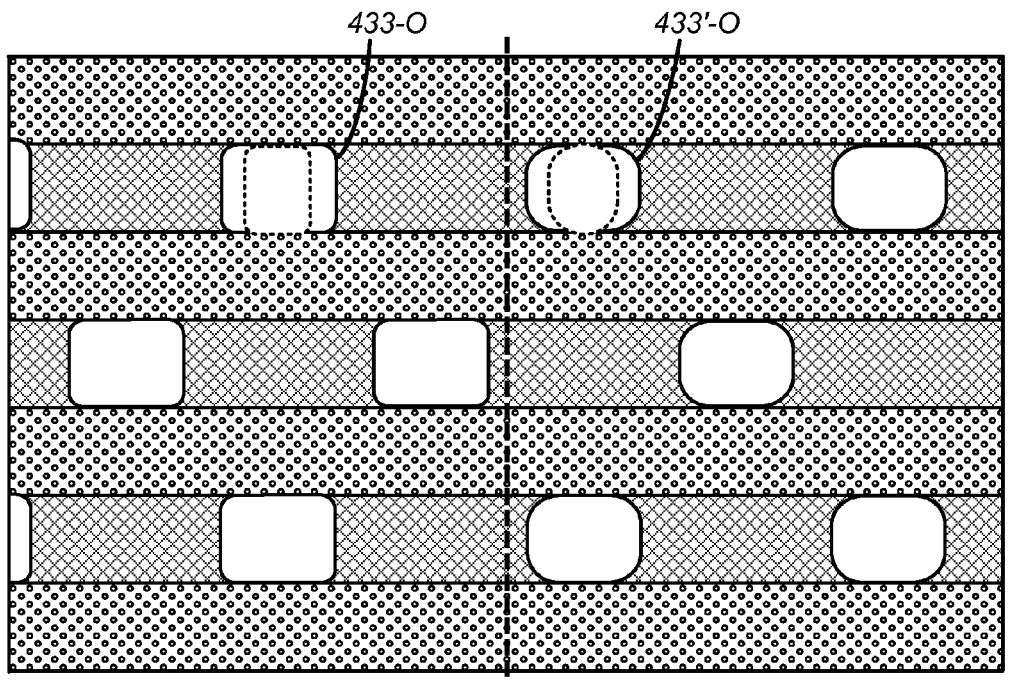
FIG. 73A   FIG. 73B
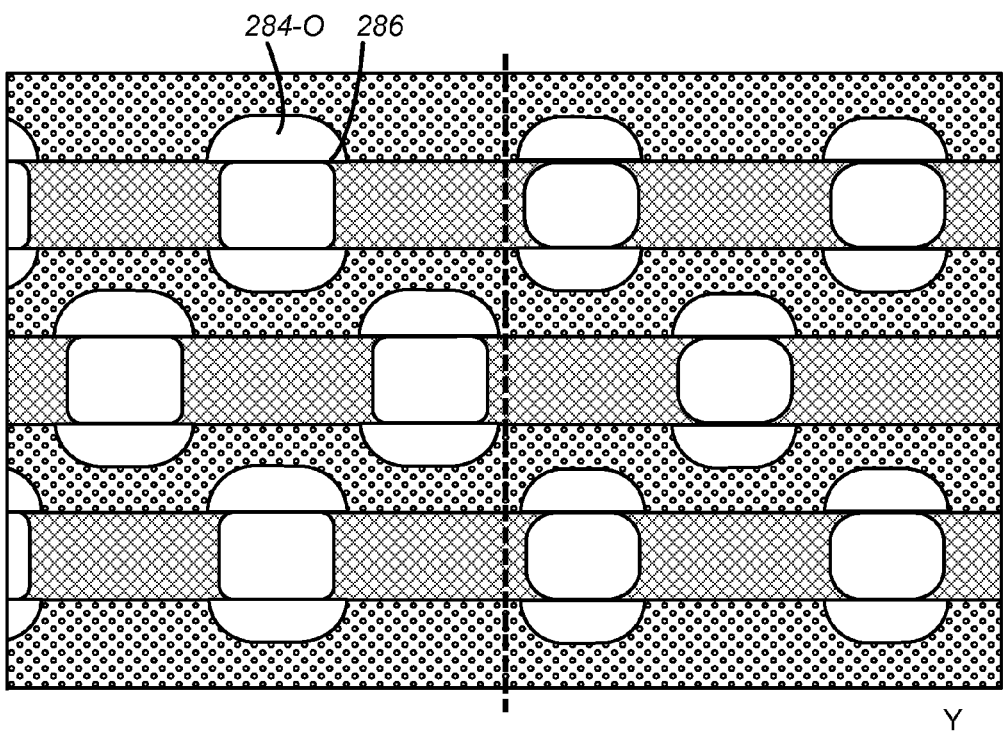
FIG. 74A   FIG. 74B

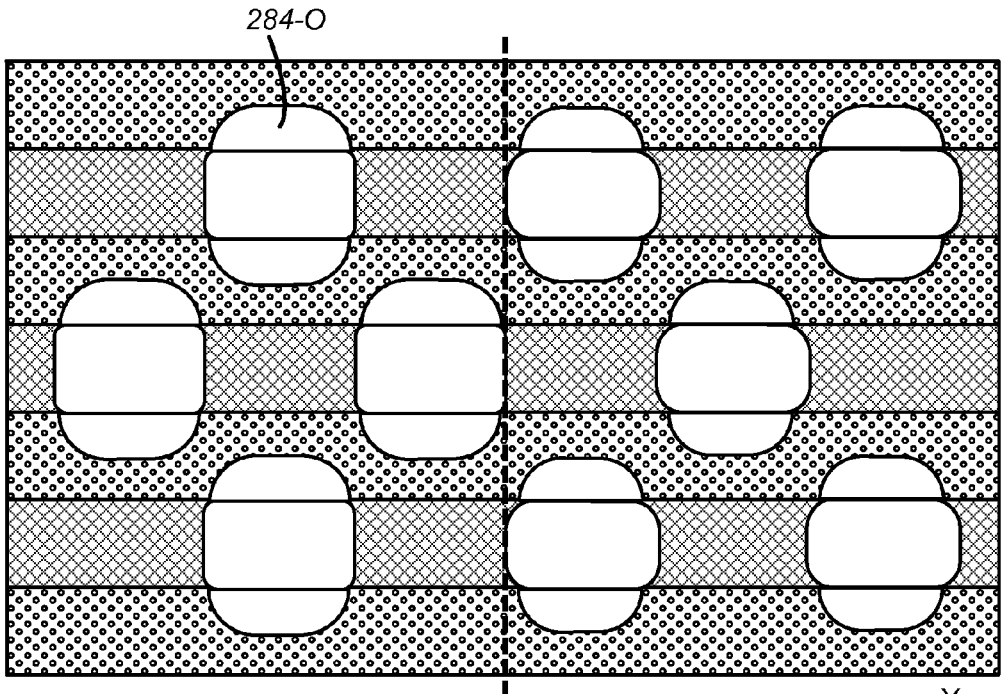
FIG. 75A  FIG. 75B
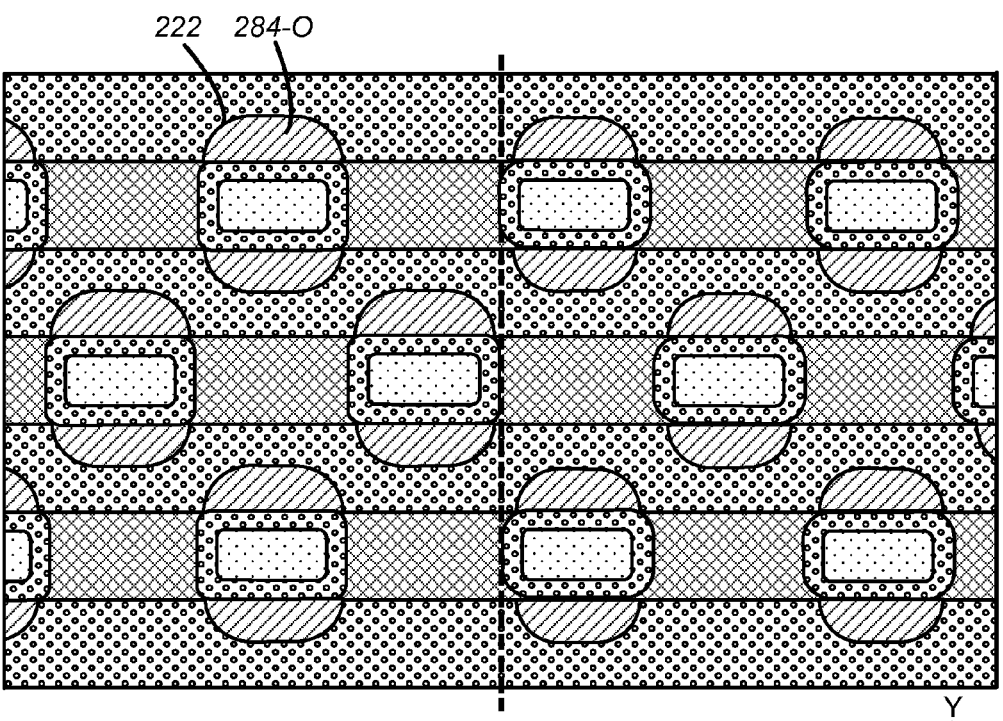
FIG. 76A  FIG. 76B

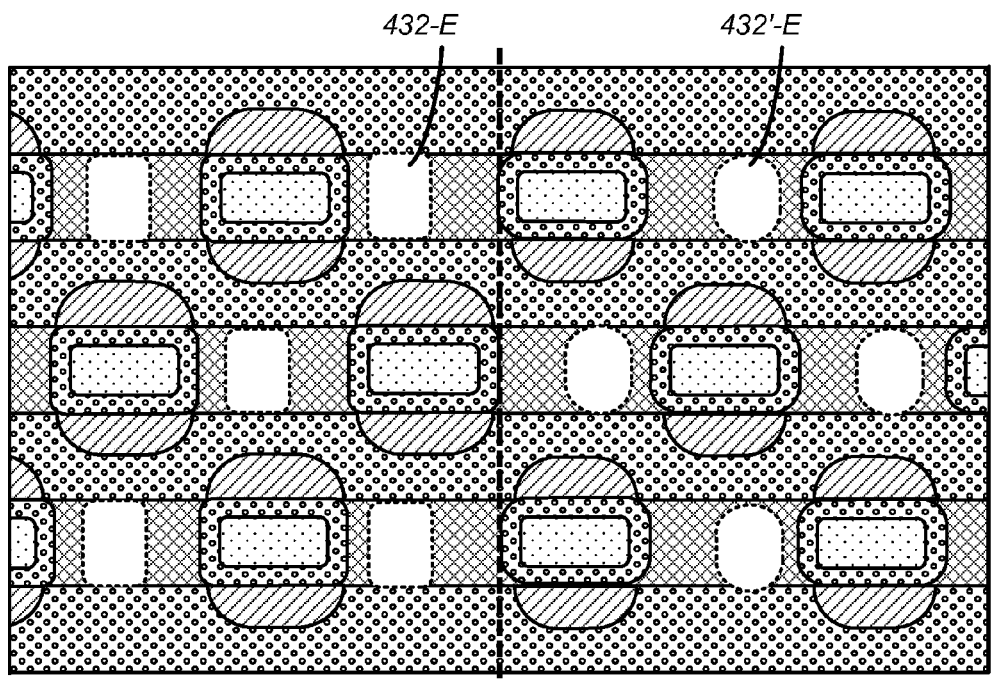
FIG. 77A  FIG. 77B
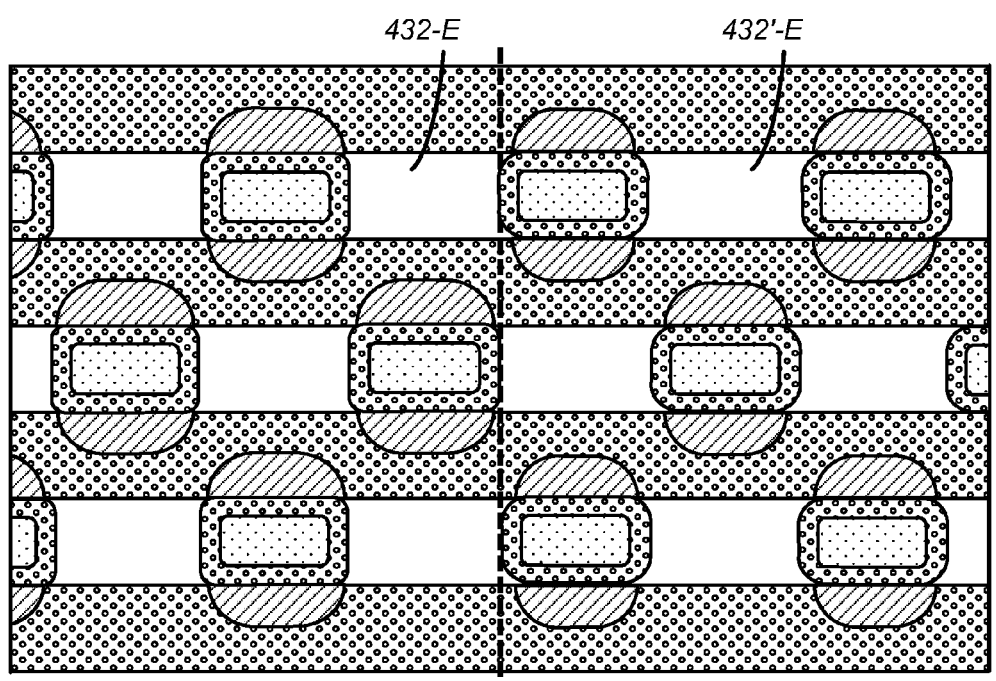
FIG. 78A  FIG. 78B

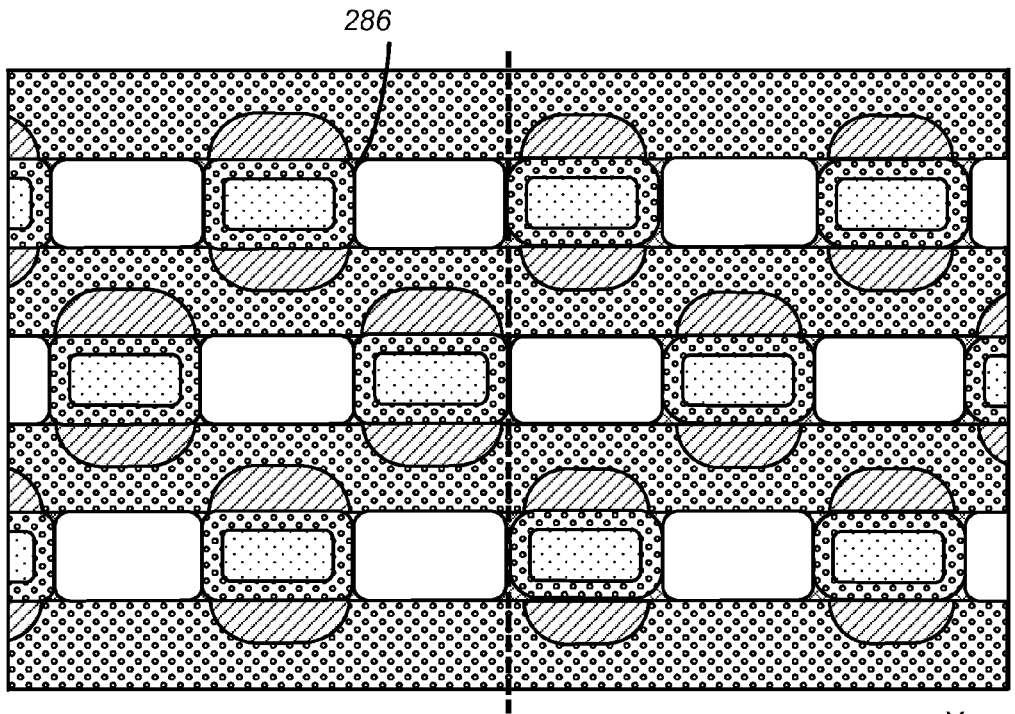
FIG. 79A  FIG. 79B
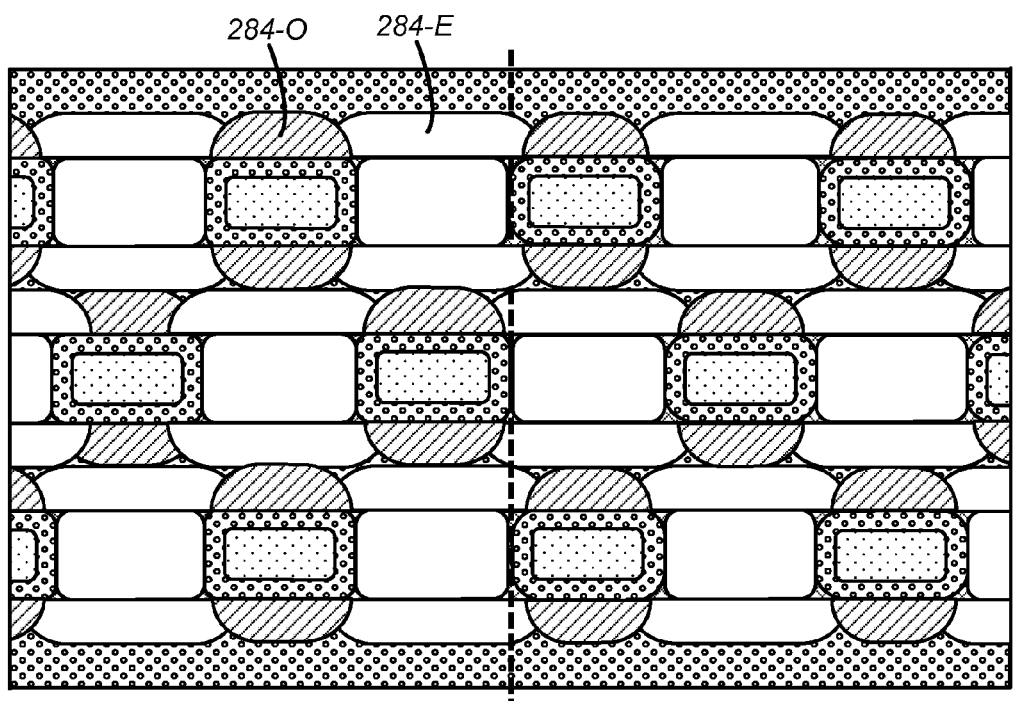
FIG. 80A  FIG. 80B

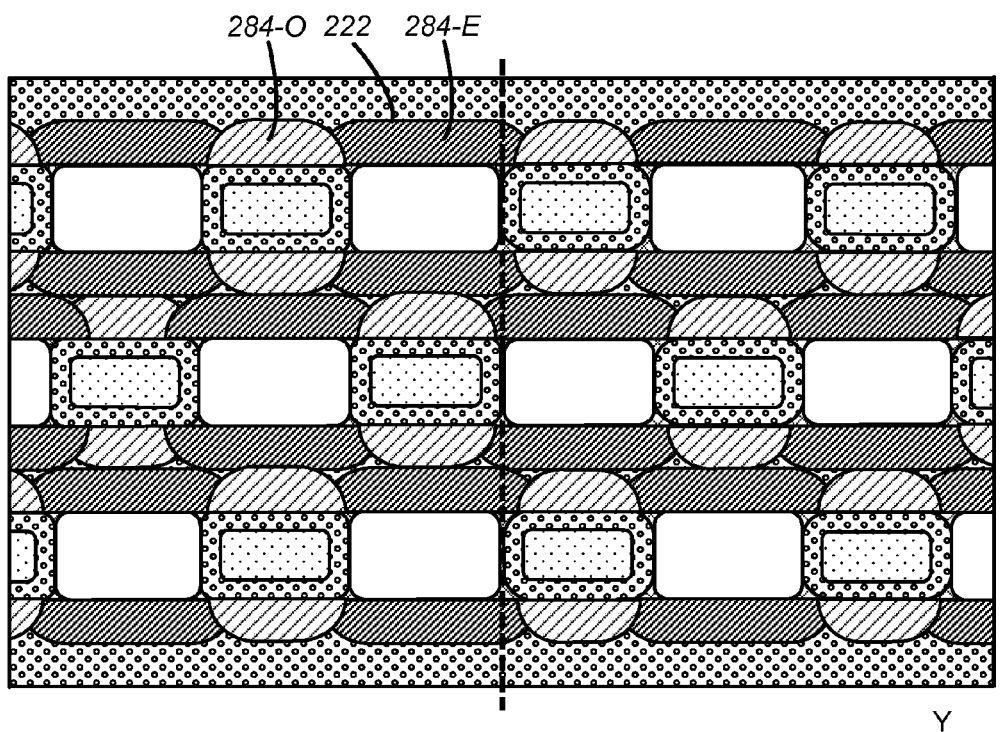
FIG. 81A  FIG. 81B

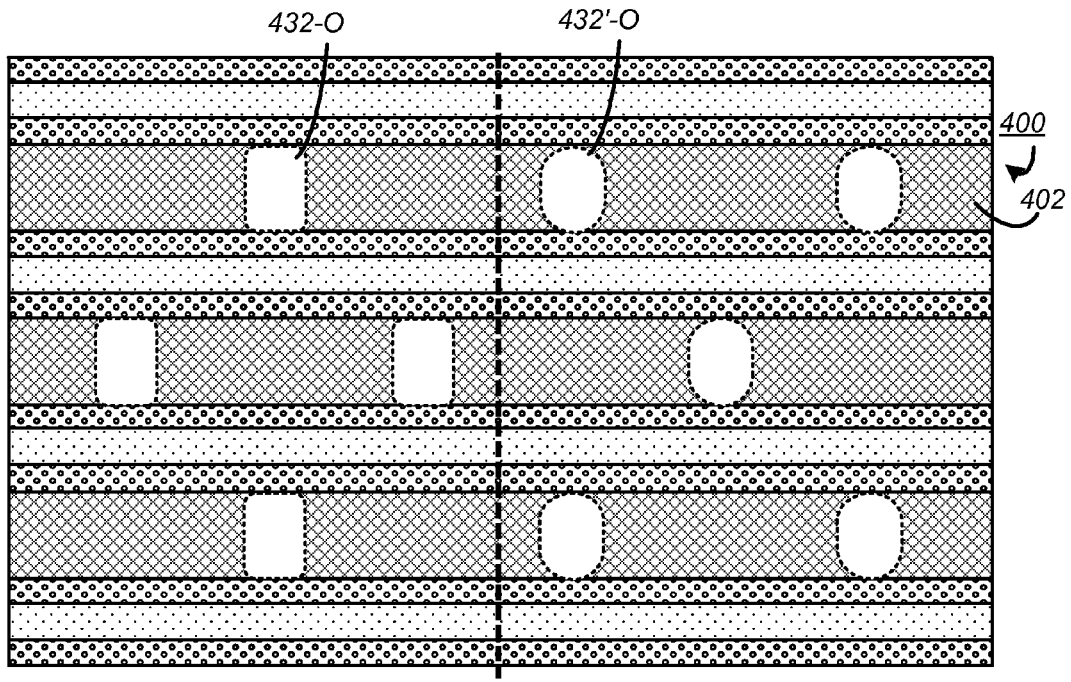
FIG. 85A   FIG. 85B
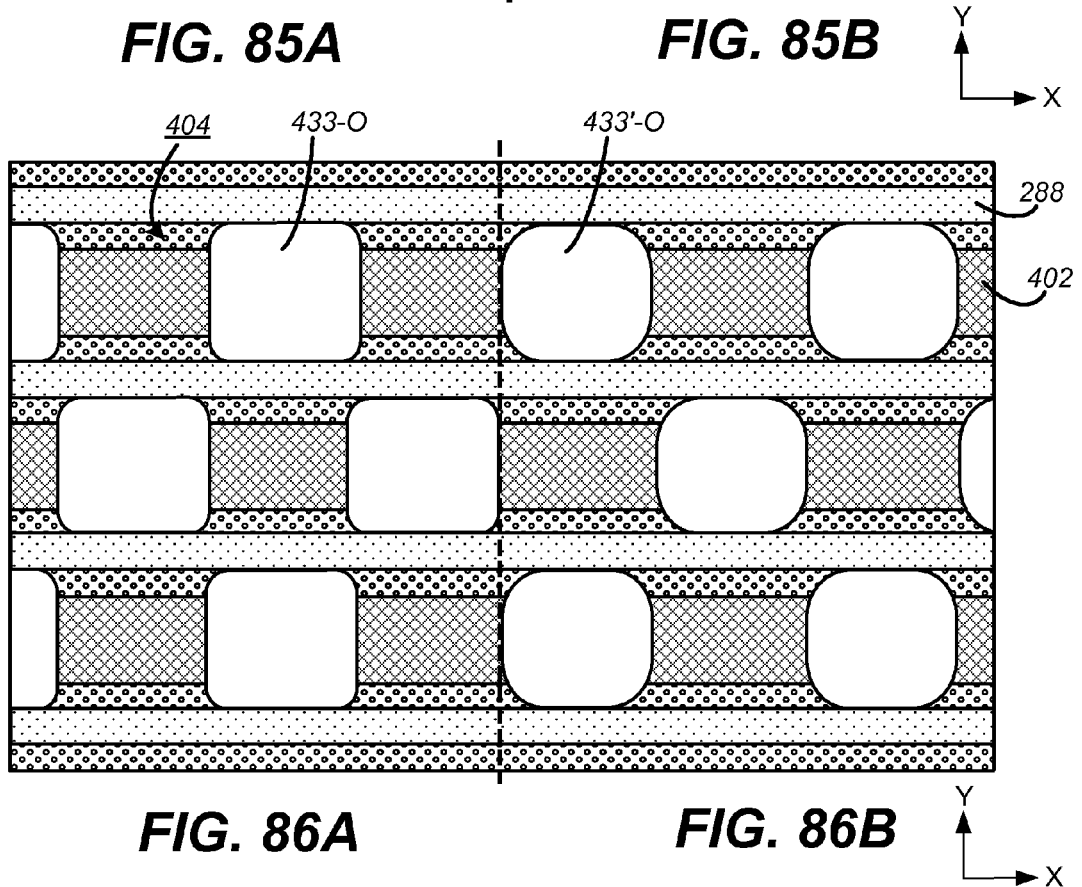
FIG. 86A   FIG. 86B

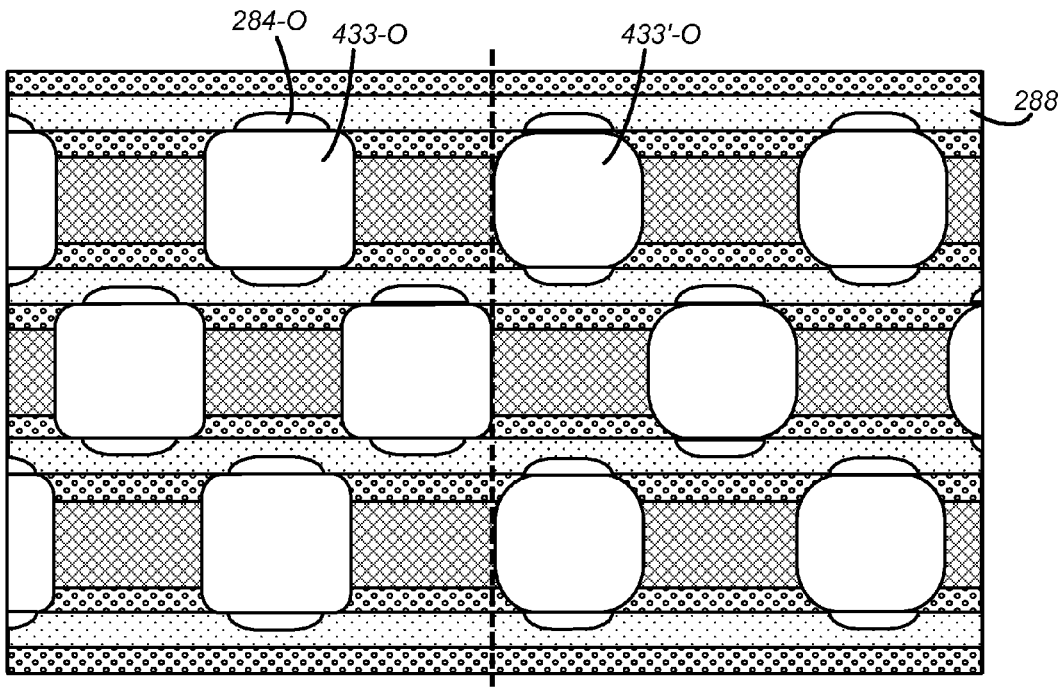
FIG. 87A  FIG. 87B
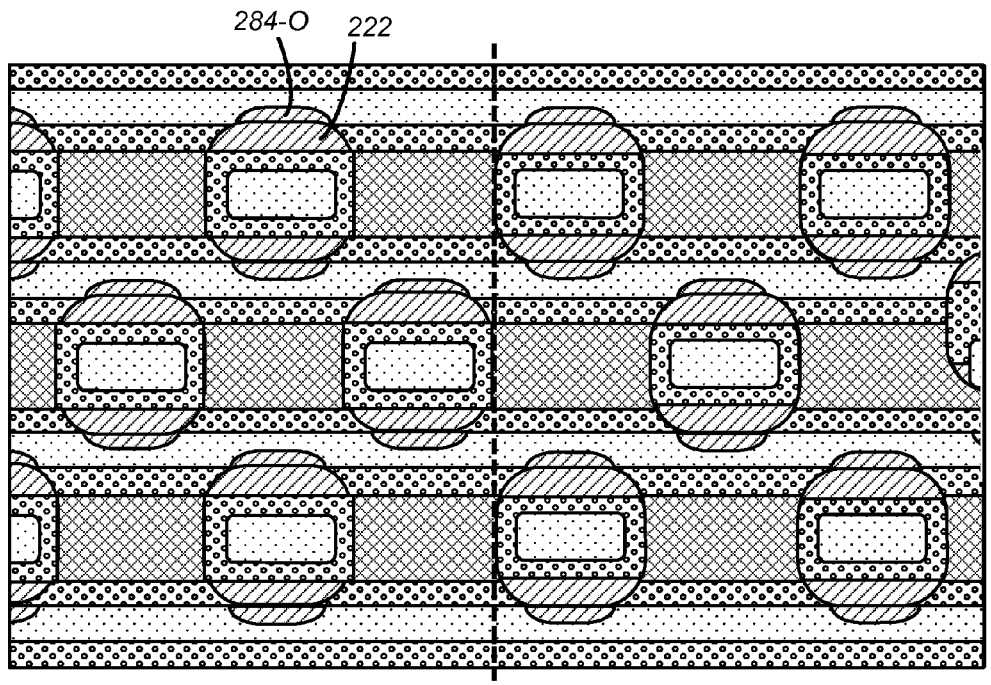
FIG. 88A  FIG. 88B

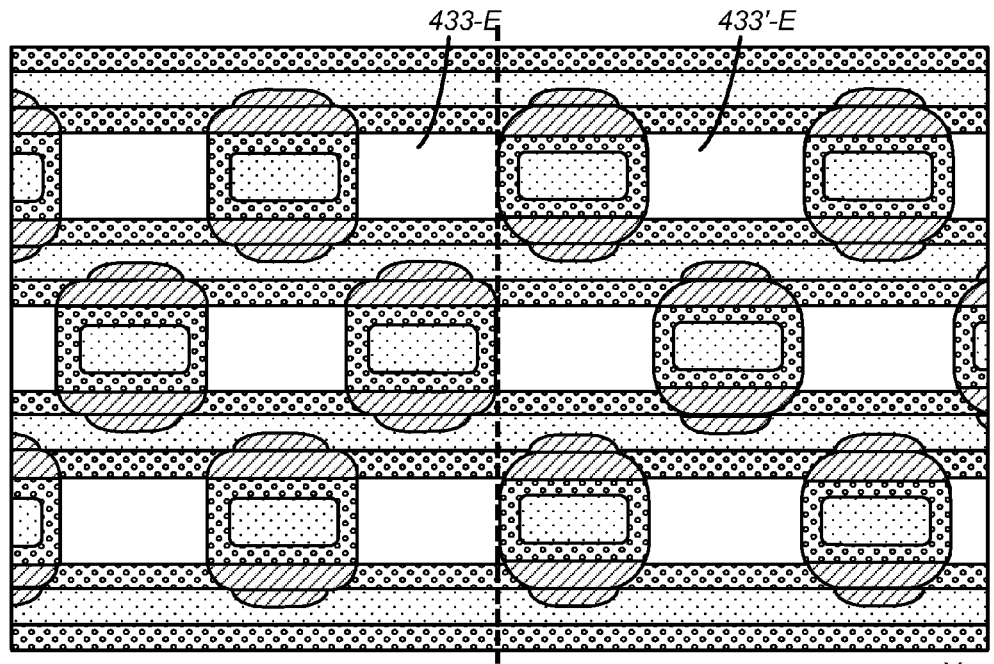
FIG. 89A  FIG. 89B
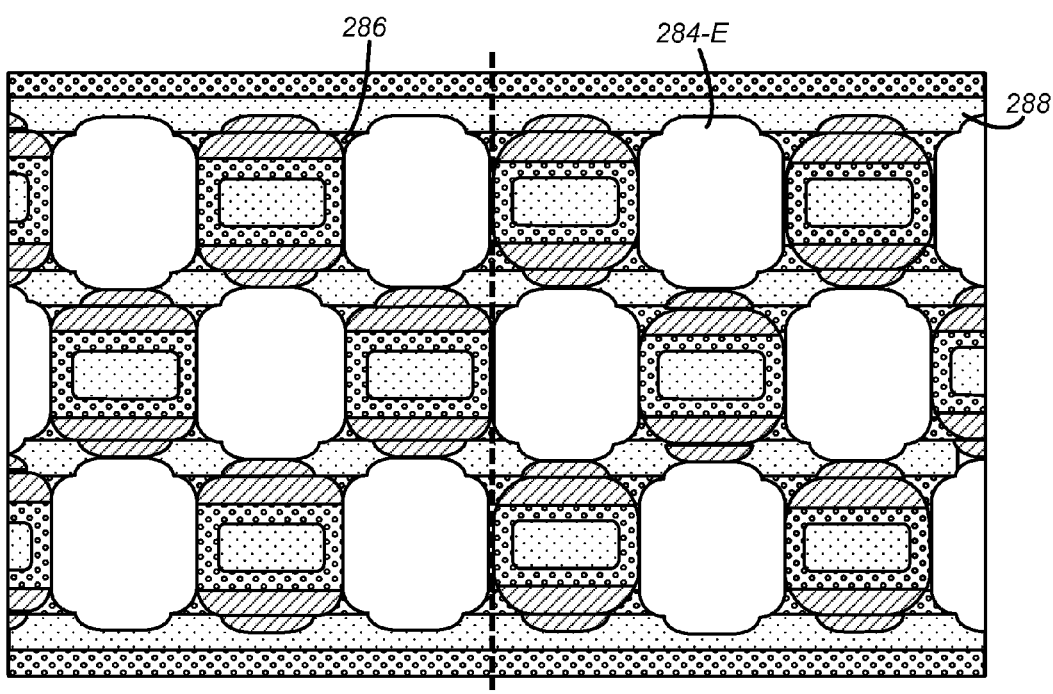
FIG. 90A  FIG. 90B

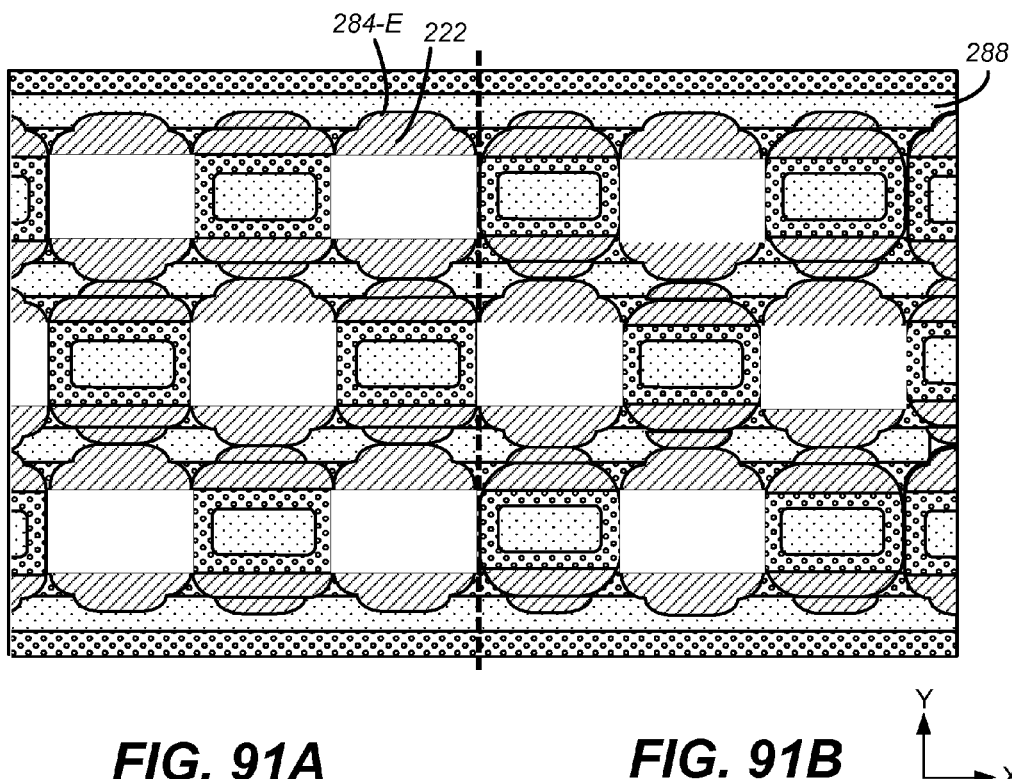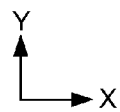
FIG. 91A  FIG. 91B

3D NAND MEMORY WITH SOCKETED FLOATING GATE CELLS AND PROCESS THEREFOR

CROSS REFERENCE TO RELATED APPLICATIONS

This application is related to the following U.S. patent applications by Raul Adrian Cernea that are filed on the same day as the present application: U.S. patent application entitled "Efficient Process for 3D NAND Memory with Improved Socketed Floating Gate Cells"; U.S. patent application entitled "Improved Process for 3D NAND Memory with Improved Socketed Floating Gate Cells"; and U.S. patent application entitled "Process for Word Line Connections in 3D Memory".

This application is also related to the following U.S. patent applications by Raul Adrian Cernea: U.S. patent application Ser. No. 14/494,869 filed on Sep. 24, 2014, entitled "3D NAND Memory with Socketed Floating Gate Cells"; U.S. patent application Ser. No. 14/494,873 filed on Sep. 24, 2014, entitled "Process for 3D NAND Memory with Socketed Floating Gate Cells"; U.S. patent application Ser. No. 14/494,877 filed on Sep. 24, 2014, entitled "3D Memory having NAND Strings Switched by Transistors with Elongated Polysilicon Gates".

All the applications cited above are incorporated herein in their entirety by this reference.

BACKGROUND

This relates to three dimensional memory systems such as semiconductor flash memory, and more particularly to processes for creating 3D flash memory having memory cells, each with a charge-storage floating gate embedded by a socket structure of a word line.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric. 3D NAND memory devices using dielectric layer for storing charge have been described in U.S. Pat. Nos. 7,558,141 and 8,405,142.

Further improvements in memory devices such as 3D NAND memory devices are desirable.

SUMMARY

A 3D NAND memory has vertical NAND strings across multiple memory planes above a substrate, with each memory cell of a NAND string residing in a different memory layer. Word lines in each memory plane each has a series of socket components aligned to embed respective floating gates of a group memory cells.

Significant reduction in memory cell size is achieved by the present 3D NAND memory when a floating gate of each memory cell is embedded by a socket component of a word line. The 3D NAND memory has an array of memory cells arranged in a three-dimensional pattern defined by rectangular coordinates having x-, y-, z-directions. The memory cells are organized into NAND strings in the z-direction to form a 2D array of NAND strings in an x-y plane. Each NAND string is a daisy chain of memory cells with a channel terminated by a source-side transistor at a first end of the string and a drain-side transistor at a second end of the string. The respective memory cells of each NAND string are in corresponding memory planes which are stacked in the z-direction. The floating gate of each memory cell is aligned in the y-direction with a first end against the word line and a second end against the channel. The word line along a group of memory cells has a socket component for each memory cell where a respective floating gate has its first end embedded by a respective socket component and the second end at an open end of the socket component.

In this way, the floating gates surrounded by the socketed word line have high coupling ratios, while maintaining small-cell dimension. Furthermore, the socketed word line provides superior shielding to avoid floating-gate to floating-gate crosstalk. This memory architecture could allow a 4 to 8 times reduction in cell dimension as well as reduction in floating-gate perturbations between neighboring cells.

3D NAND Memory with Socketed Word Lines

The memory with socketed word lines is fabricated by opening shafts adjacent to memory cell locations in a multi-layer slab. This allows lateral grottoes to be formed in adjacent memory layers exposed by the shafts to form memory cells with socketed word lines. In particular, back-to-back socketed word lines architecture is fabricated by first processing through a subarray of odd shafts followed by processing through a subarray of even shafts. An array of odd memory cells is first formed followed by an array of even memory cells. When forming the array of even memory cells, each even memory cell has its socket component formed to overlap with that of an adjacent odd memory cells along a row so that a continuous word line is formed.

Self-Aligned Process for Fabricating the 3D NAND Memory with Back-to-Back Socketed Word Lines A process uses four masks for fabricating the 3D NAND memory having word lines with socket components. A word line mask is used to partition the multi-layer slab into trenches spaced apart by ledges. Word lines are formed under the ledges elongated in the x-direction. A bit line mask is used to pattern the multi-layer slab along the y-direction. This allows creation of an array of openings at the top of the multi-layer slab, which is then used to create an array of vertical shafts. Using odd and even masks, the array of vertical shafts is further partitioned into a subarray of odd vertical shafts and a subarray of even vertical shafts respectively. The vertical shafts allow bit access to the memory layers in the multi-layer slab to fabricate individual memory cells with word lines having socket components along the x-direction and bit lines in the z-direction. The memory cells are fabricated in two installments. The array of vertical shafts is partitioned into subarrays of odd and even vertical shafts. Odd memory cells are fabricated through the subarrays of odd vertical shafts and even memory cells are fabricated through the subarrays of even vertical shafts. In particular, the even memory cells are fabricated to have their word line socket component overlap with those of the odd memory cells in order to form continuous word lines in the row direction.

A self-aligned process for fabricating the 3D NAND memory includes forming a multi-layer slab on top of a semi-conductor substrate with layers corresponding to structures of an array of vertically aligned NAND strings, the layers including memory layers initially constituted from a sacrificial material; forming an array of vertical shafts in rows and columns through openings across a top surface of the multi-layer slab, wherein the rows of vertical shafts are interleaved by ledges, each row of vertical shafts provides access for forming memory cells at the memory layers under an adjacent ledge, and wherein the array of vertical shafts is partitioned into first and second subarrays of either odd or even shafts; and then the process of creating the memory cells with socketed word lines is first applied through first subarray of vertical shafts, and secondly applied through a second subarray of vertical shafts.

The process through the first subarray of vertical shafts includes: selecting the vertical shafts of the first subarray while masking those of the second subarrays; forming grottoes by isotropically recessing the sacrificial material of the memory layers though the selected vertical shafts, each grotto having walls intruding about halfway into a respective adjacent ledge; depositing a layer of word line material in each grotto to form a socket component of a word line; depositing a layer of insulating material to line the socket component of a word line; filling the socket component with a floating gate material to form an embedded floating gate; and forming other structures of the NAND strings and a plurality of vertical bit lines through the selected vertical shafts.

The process through the second subarray of vertical shafts is similar to the process through the first subarray, except when isotropically recessing to form the grottoes, the wall of each grotto overlaps with adjacent ones in a row in the same memory layer formed through the vertical shafts of the first subarray. In this way a continuous word line with socket components in a row is formed.

In one embodiment, forming the array of vertical shafts in rows and columns include first opening rows of trenches with intervening ledges in the multi-layer slab. The trenches are then refilled with a sacrificial material and vertical shafts opened in the filled trenches. Buttresses at predefined locations in the multi-layer slab act as a bridge between adjacent ledges to provide structural support for preventing the sidewalls of the ledges from collapsing. The space occupied by each buttress will synergistically be employed later for a VIA connecting a word line at a memory layer to a word line x-decoder contact pad in the substrate below.

Various aspects, advantages, features and embodiments of the present subject matters are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 15A is a plan view of the x-y plane of the multi-layer slab after an initial etch through the opening of a word line mask.

FIG. 15B is a cross-sectional view of the z-y plane of the multi-layer slab along the section B-B shown in FIG. 15A.

FIG. 16A is a plan view of the x-y plane of the multi-layer slab after etching through the hard mask.

FIG. 16B is a cross-sectional view of the z-y plane of the multi-layer slab along the section B-B shown in FIG. 16A.

FIG. 17A is a plan view of the x-y plane of the multi-layer slab after deep etching through the intervening oxide and nitride layers to a bottom oxide layer 280-1.

FIG. 17B is a cross-sectional view of the z-y plane of the multi-layer slab along the section B-B shown in FIG. 17A.

FIG. 18A is a plan view of the x-y plane of the multi-layer slab after filling the trenches 400 with nitride.

FIG. 18B is a cross-sectional view of the z-y plane of the multi-layer slab along the section B-B shown in FIG. 18A.

FIG. 19A is a plan view of the x-y plane of the multi-layer slab after masking with a bit line mask.

FIG. 19B is a cross-sectional view of the z-y plane of the multi-layer slab along the section B-B shown in FIG. 19A.

FIG. 20A is a plan view of the x-y plane of the multi-layer slab after a deep nitride etch through the opening of the bit line mask.

FIG. 20B is a cross-sectional view of the z-y plane of the multi-layer slab shown in FIG. 20A.

FIG. 21A is a plan view of the x-y plane of the multi-layer slab after removal of the bit line mask.

FIG. 21B is a cross-sectional view of the z-y plane of the multi-layer slab along the section B-B shown in FIG. 21A.

FIG. 22A is a plan view of the x-y plane of the multi-layer slab after removal of the hard mask and the shafts filled with polysilicon.

FIG. 22B is a cross-sectional view of the z-y plane of the multi-layer slab along the section B-B shown in FIG. 22A.

FIG. 23A is a plan view of the x-y plane of the multi-layer slab after placement of an odd hole mask.

FIG. 23B is a cross-sectional view of the z-y plane of the multi-layer slab along the section B-B shown in FIG. 23A.

FIG. 24A is a plan view of the x-y plane of the multi-layer slab after performing a deep anisotropic polysilicon etch through the openings.

FIG. 24B is a cross-sectional view of the z-y plane of the multi-layer slab along the section B-B shown in FIG. 24A.

FIG. 25A is a plan view of the x-y plane of the multi-layer slab after performing an isotropic polysilicon etch to clean out the rest of the polysilicon remaining in the odd shafts.

FIG. 25B is a cross-sectional view of the z-y plane of the multi-layer slab along the section B-B shown in FIG. 25A.

FIG. 29A is a plan view of the x-y plane of the multi-layer slab after depositing a layer of word line material such as tungsten.

FIG. 29B is a cross-sectional view of the z-y plane of the multi-layer slab along the section B-B shown in FIG. 29A.

FIG. 29C is a perspective view of a detail of two of the recesses/sockets of the multi-layer slab shown in FIGS. 29A and 29B.

FIG. 31A is a plan view of the x-y plane of the multi-layer slab after an anisotropic etch to recess the polysilicon layer.

FIG. 31B is a cross-sectional view of the z-y plane of the multi-layer slab along the section B-B shown in FIG. 31A.

FIG. 31C is a perspective view of a detail of two of the recesses/sockets of the multi-layer slab shown in FIGS. 31A and 31B.

FIG. 32A is a plan view of the x-y plane of the multi-layer slab after etching to recess the exposed tungsten layer on the protruding oxide layers.

FIG. 32B is a cross-sectional view of the z-y plane of the multi-layer slab along the section B-B shown in FIG. 32A.

FIG. 32C is a perspective view of a detail of two of the recesses/sockets of the multi-layer slab shown in FIGS. 32A and 32B.

FIG. 33A is a plan view of the x-y plane of the multi-layer slab after an isotropic polysilicon etch to remove all remaining polysilicon in each odd shaft.

FIG. 33B is a cross-sectional view of the z-y plane of the multi-layer slab along the section B-B shown in FIG. 33A.

FIG. 33C is a perspective view of a detail of two of the recesses/sockets of the multi-layer slab shown in FIGS. 33A and 33B.

FIG. 34A is a plan view of the x-y plane of the multi-layer slab after an isotropic oxide etch to remove a bottom layer of oxide to expose the underlying polysilicon layer at the bottom of each odd shaft.

FIG. 34B is a cross-sectional view of the z-y plane of the multi-layer slab along the section B-B shown in FIG. 34A.

FIG. 34C is a perspective view of a detail of two of the recesses/sockets of the multi-layer slab shown in FIGS. 34A and 34B.

FIG. 35C is a perspective view of a detail of two of the recesses/sockets of the multi-layer slab shown in FIGS. 35A and 35B, after depositing the first of the IDP layers, namely a layer of oxide.

FIG. 36A is a plan view of the x-y plane of the multi-layer slab after etching excessive portion of the polysilicon layer to expose the layer of oxide of the IDP.

FIG. 36B is a cross-sectional view of the z-y plane of the multi-layer slab along the section B-B shown in FIG. 36A.

FIG. 36C is a perspective view of a detail of two of the recesses/sockets of the multi-layer slab shown in FIGS. 36A and 36B, after the layer of polysilicon has been recessed.

FIG. 37A is a plan view of the x-y plane of the multi-layer slab after an anisotropic etch of the IDP layer and the bottom oxide layer to expose the underlying polysilicon layer at the bottom of each odd shaft.

FIG. 37B is a cross-sectional view of the z-y plane of the multi-layer slab along the section B-B shown in FIG. 37A.

FIG. 38A is a plan view of the x-y plane of the multi-layer slab after depositing a layer of tunnel oxide material.

FIG. 38B is a cross-sectional view of the z-y plane of the multi-layer slab along the section B-B shown in FIG. 38A.

FIG. 42A is a plan view of the x-y plane of the multi-layer slab after placement of an even hole mask.

FIG. 42B is a cross-sectional view of the z-y plane of the multi-layer slab along the section B-B shown in FIG. 42A.

FIG. 44A is a perspective view of a portion of the 3D NAND memory, schematically showing access to different word lines at different memory layers.

FIG. 44B is a cross-sectional view of the z-y plane of the 3D NAND memory shown in FIG. 44A.

FIG. 47A is a plan view of the x-y plane of the multi-layer slab after placement of a VIA contact mask for forming a vertical word line VIA.

FIG. 47B is a cross-sectional view of the z-y plane of the multi-layer slab along the section B-B shown in FIG. 47A.

FIG. 48A is a plan view of the x-y plane of the multi-layer slab after a shaft has been excavated from each opening of the VIA contact mask.

FIG. 48B is a cross-sectional view of the z-y plane of the multi-layer slab along the section B-B shown in FIG. 48A.

FIG. 51A is a plan view of the x-y plane of the multi-layer slab after placement of a layer contact mask.

FIG. 51B is a cross-sectional view of the z-y plane of the multi-layer slab along the section B-B shown in FIG. 51A.

FIG. 52A is a plan view of the x-y plane of the multi-layer slab after an anisotropic etch through the openings all the way to reach the first oxide layer.

FIG. 52B is a cross-sectional view of the z-y plane of the multi-layer slab along the section B-B shown in FIG. 52A.

FIG. 53A is a plan view of the x-y plane of the multi-layer slab after depositing a layer terrace mask.

FIG. 53B is a cross-sectional view of the z-y plane of the multi-layer slab along the section B-B shown in FIG. 53A.

FIG. 54A is a plan view of the x-y plane of the multi-layer slab after a controlled isotropic slimming of the terrace mask by a predetermined amount.

FIG. 54B is a cross-sectional view of the z-y plane of the multi-layer slab along the section B-B shown in FIG. 54A.

FIG. 55A is a plan view of the x-y plane of the multi-layer slab after an anisotropic etch through the exposed openings to extend the associated auxiliary shafts downwards from the top of a nitride layer to that of another nitride layer one memory layer lower.

FIG. 55B is a cross-sectional view of the z-y plane of the multi-layer slab along the section B-B shown in FIG. 55A.

FIG. 56A is a plan view of the x-y plane of the multi-layer slab after an isotropic etch that remove the hard mask and trim the vertical word line VIA in each opening to the bottom of the auxiliary shaft.

FIG. 56B is a cross-sectional view of the z-y plane of the multi-layer slab along the section B-B shown in FIG. 56A.

FIG. 60B is a cross-sectional view of the z-y plane of the multi-layer slab along the section B-B shown in FIG. 60A.

FIG. 61A is a plan view of the x-y plane of the multi-layer slab after depositing a layer of oxide.

FIG. 61B is a cross-sectional view of the z-y plane of the multi-layer slab along the section B-B shown in FIG. 61A.

FIG. 62A is a plan view of the x-y plane of the multi-layer slab after masking and etching wells at even and odd contact points to the bit lines in the y-direction.

FIG. 62B is a cross-sectional view of the z-y plane of the multi-layer slab along the section B-B shown in FIG. 62A.

FIG. 63A is a plan view of the x-y plane of the multi-layer slab after depositing a layer of metal.

FIG. 63B is a cross-sectional view of the z-y plane of the multi-layer slab along the section B-B shown in FIG. 63A.

FIG. 64A is a plan view of the x-y plane of the multi-layer slab after etching with the aid of a mask to form even and odd metal lines corresponding to the even and odd global bit lines.

FIG. 64B is a cross-sectional view of the z-y plane of the multi-layer slab along the section B-B shown in FIG. 64A.

FIG. 65 illustrates a first 3-mask process using nitride as sacrificial material both in the memory layers and to fill the trenches to fabricate the 3D NAND memory.

FIG. 66 is a plan view of the x-y plane of the multi-layer slab after deep trenches have been etched and then refilled with nitride.

FIG. 67A is a plan view of the x-y plane showing the odd shafts 432-O near the top of the multi-layer slab.

FIG. 67B is a plan view of the x-y plane showing the odd shafts 432'-O near the bottom of the multi-layer slab.

FIG. 68A is a plan view of the x-y plane showing the grottoes near the top of the multi-layer slab after depositing a layer of the word line material 222.

FIG. 68B is a plan view of the x-y plane showing the grottoes near the bottom of the multi-layer slab after depositing a layer of the word line material 222 in the odd grottoes.

FIG. 69A is a plan view of the x-y plane near the top of the multi-layer slab after the formation of odd memory cells and the even shafts 432-E in between.

FIG. 69B is a plan view of the x-y plane shown in FIG. 69A but near the bottom of the multi-layer slab.

Figure 70:
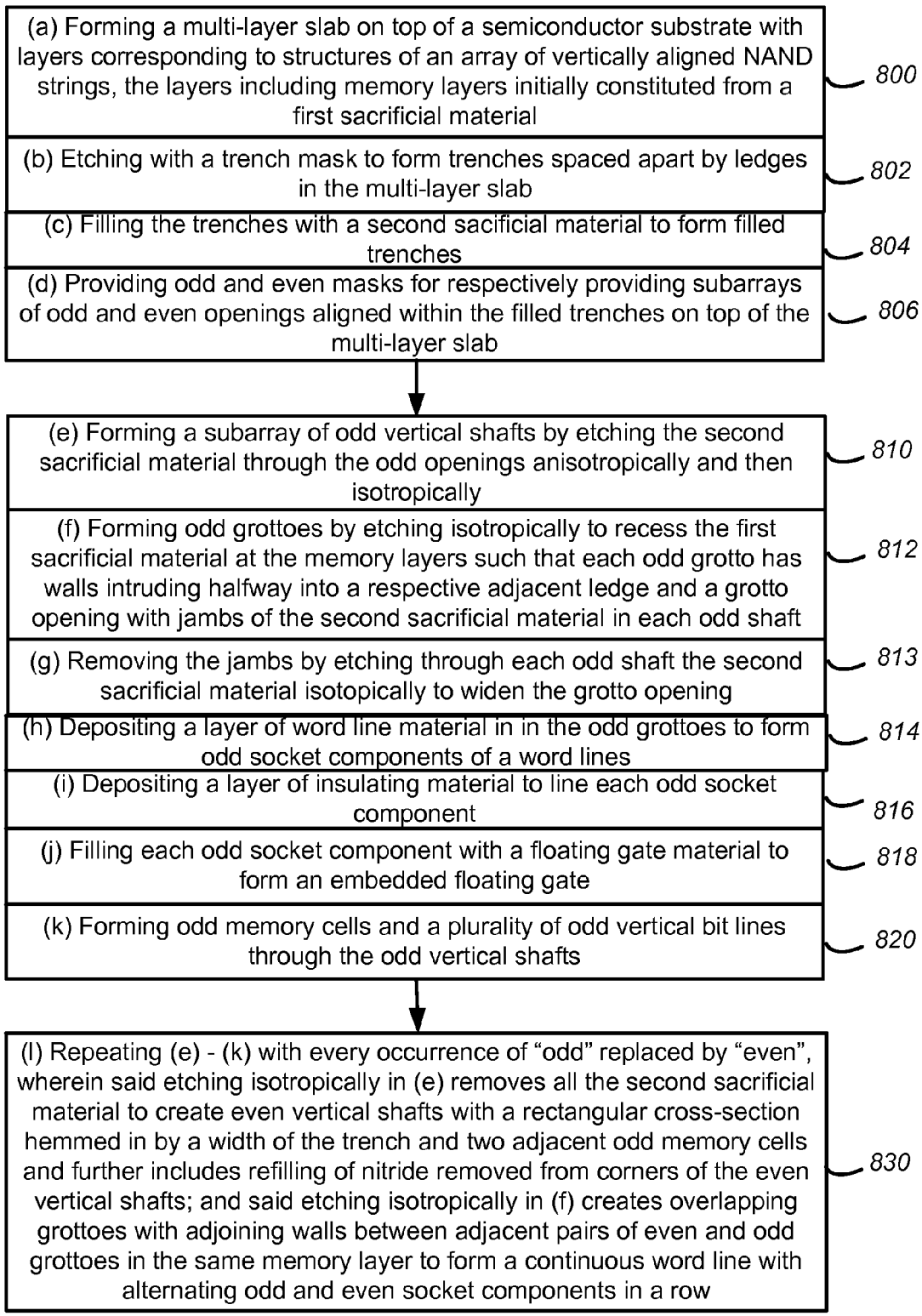

FIG. 70 illustrates a second 3-mask process using polysilicon as sacrificial memory layers to fabricate the 3D NAND memory.

FIG. 71 is a plan view of the x-y plane of the multi-layer slab after deep trenches have been anisotropically etched and then refilled with the second sacrificial material.

FIG. 72A is a plan view of the x-y plane showing the odd shafts 432-O near the top of the multi-layer slab.

FIG. 72B is a plan view of the x-y plane showing the odd shafts 432'-O near the bottom of the multi-layer slab.

FIG. 73A and FIG. 73B illustrate respectively the cross-sectional shape of the odd shafts 433-O near the top of the multi-layer slab and the odd shafts 433'-O near the bottom of the shafts after a further isotropic etching of the second sacrificial material (e.g., nitride) filling the shafts to expand the shafts.

FIG. 74A and FIG. 74B illustrate respectively the cross-sectional shape of the odd shafts near the top of the multi-layer slab and near the bottom of the shafts after a further isotropic etching of the first sacrificial material (e.g., polysilicon) at the memory layers to form the odd grottoes 284-O.

FIG. 75A and FIG. 75B illustrate respectively the cross-sectional shape of the odd shafts near the top of the multi-layer slab and near the bottom of the shafts after an isotropic etching of the jambs of the second sacrificial material in the trenches.

FIG. 76A and FIG. 76B illustrate respectively the cross-sectional shape of the odd shafts near the top of the multi-layer slab and near the bottom of the shafts after depositing a layer of word line material 222 in the odd grottoes 284-O to form socket components of the word lines.

FIG. 77A and FIG. 77B illustrate respectively the cross-sectional shape of the even shafts near the top of the multi-layer slab and near the bottom of the even shafts.

FIG. 78A and FIG. 78B illustrate respectively the cross-sectional shape of the even shafts near the top of the multi-layer slab and even shafts near the bottom of the shafts after an isotropic etching of the second sacrificial material in the trenches.

FIG. 79A and FIG. 79B illustrate respectively the cross-sectional shape of the even shafts near the top of the multi-layer slab and near the bottom of the even shafts.

FIG. 80A and FIG. 80B illustrate respectively the cross-sectional shape of the even shafts near the top of the multi-layer slab and near the bottom of the even shafts.

FIG. 81A and FIG. 81B illustrate respectively the cross-sectional shape of the even shafts near the top of the multi-layer slab and near the bottom of the even shafts.

Figure 82:
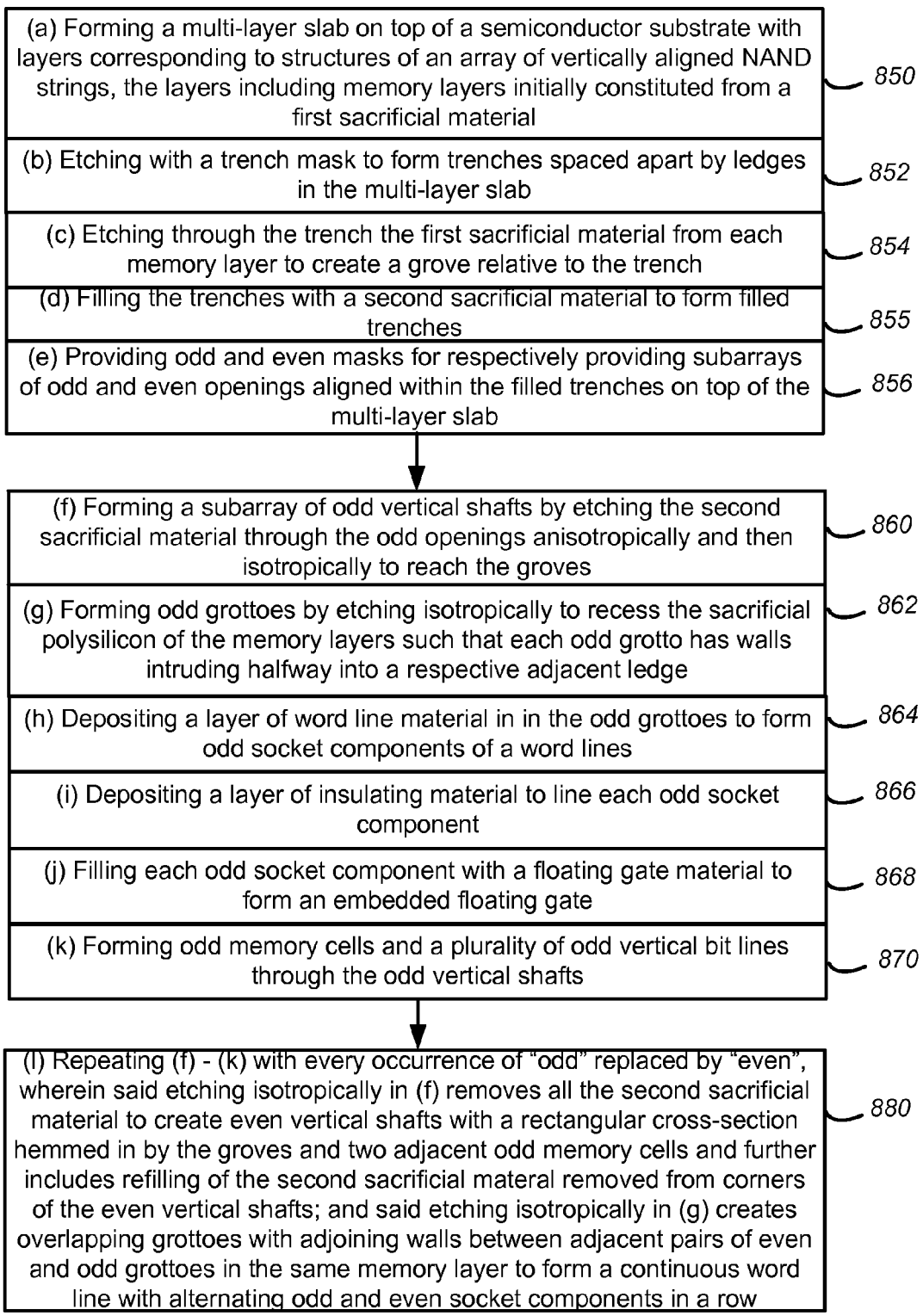

FIG. 82 illustrates a third 3-mask process using polysilicon as sacrificial memory layers to fabricate the 3D NAND memory.

Figure 83:
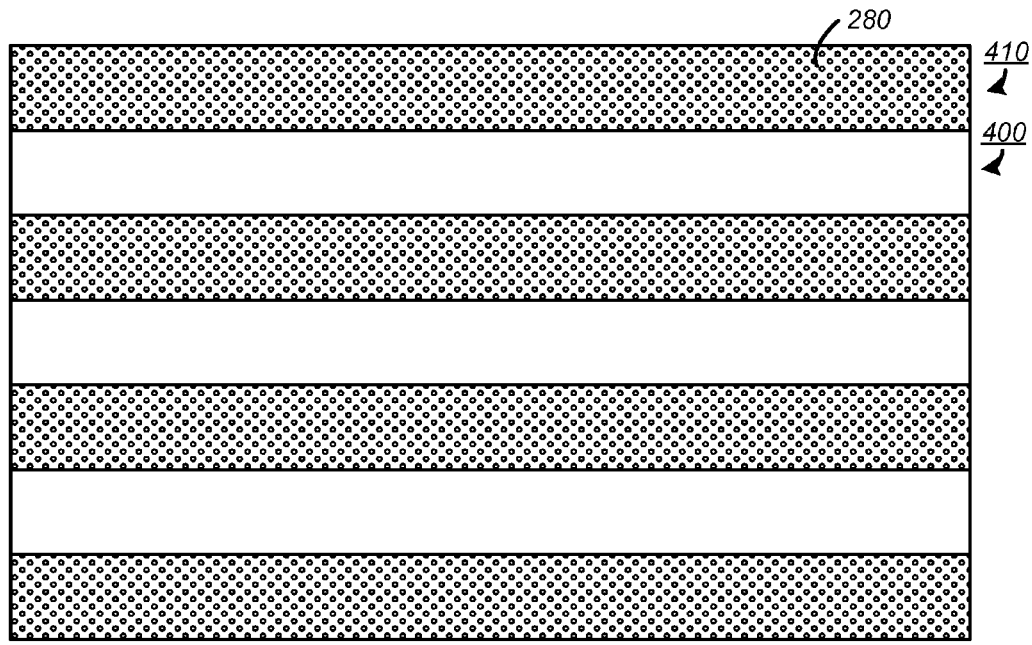

FIG. 83 is a plan view of the x-y plane of the multi-layer slab after deep trenches have been anisotropically etched.

Figure 84A:
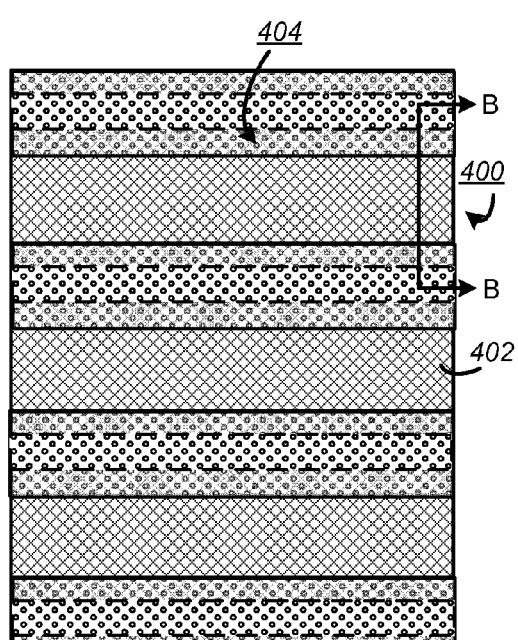

FIG. 84A is a plan view of the x-y plane of the multi-layer slab after an isotropic etch through the trenches 400 of the first sacrificial layer 288 to recess a grove 404 in the layer.

Figure 84B:
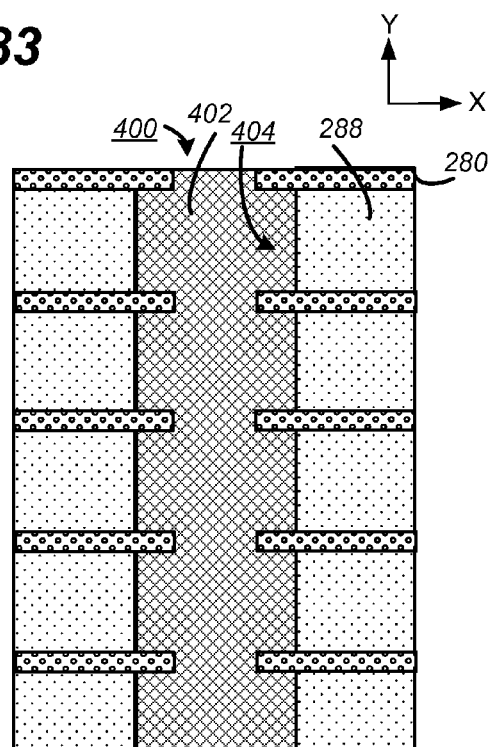

FIG. 84B is a cross-sectional view of the y-z plane of the multi-layer slab along the section B-B shown in FIG. 84A.

FIG. 85A and FIG. 85B illustrate respectively the cross-sectional shape of the odd shafts near the top of the multi-layer slab and near the bottom of the odd shafts.

FIG. 86A and FIG. 86B illustrate respectively the cross-sectional shape of the odd shafts near the top of the multi-layer slab and near the bottom of the shafts after an isotropic etch to create expanded odd shafts 433-O and 433'-O.

FIG. 87A and FIG. 87B illustrate respectively the cross-sectional shape of the odd shafts near the top of the multi-layer slab and near the bottom of the shafts after an isotropic etch to recess the first sacrificial material 288 at the memory layers to form the odd grottoes 284-0.

FIG. 88A and FIG. 88B illustrate respectively the cross-sectional shape of the odd expanded shafts 433-O near the top of the multi-layer slab and odd shafts 433'-O near the bottom of the shafts after depositing a layer of word line material 222 in the odd grottoes 284-O.

FIG. 89A and FIG. 89B illustrate respectively the cross-sectional shape of the even expanded shafts near the top of the multi-layer slab and near the bottom of the even expanded shafts.

FIG. 90A and FIG. 90B illustrate respectively the cross-sectional shape of the even expanded shafts 433-E and 433'-E near the top of the multi-layer slab and near the bottom of the even expanded shafts.

FIG. 91A and FIG. 91B illustrate respectively the cross-sectional shape of the even shafts near the top of the multi-layer slab and near the bottom of the even shafts after depositing a layer of word line material 222 in the even grottoes 284-E.

DETAILED DESCRIPTION

Memory System

Figure 1:
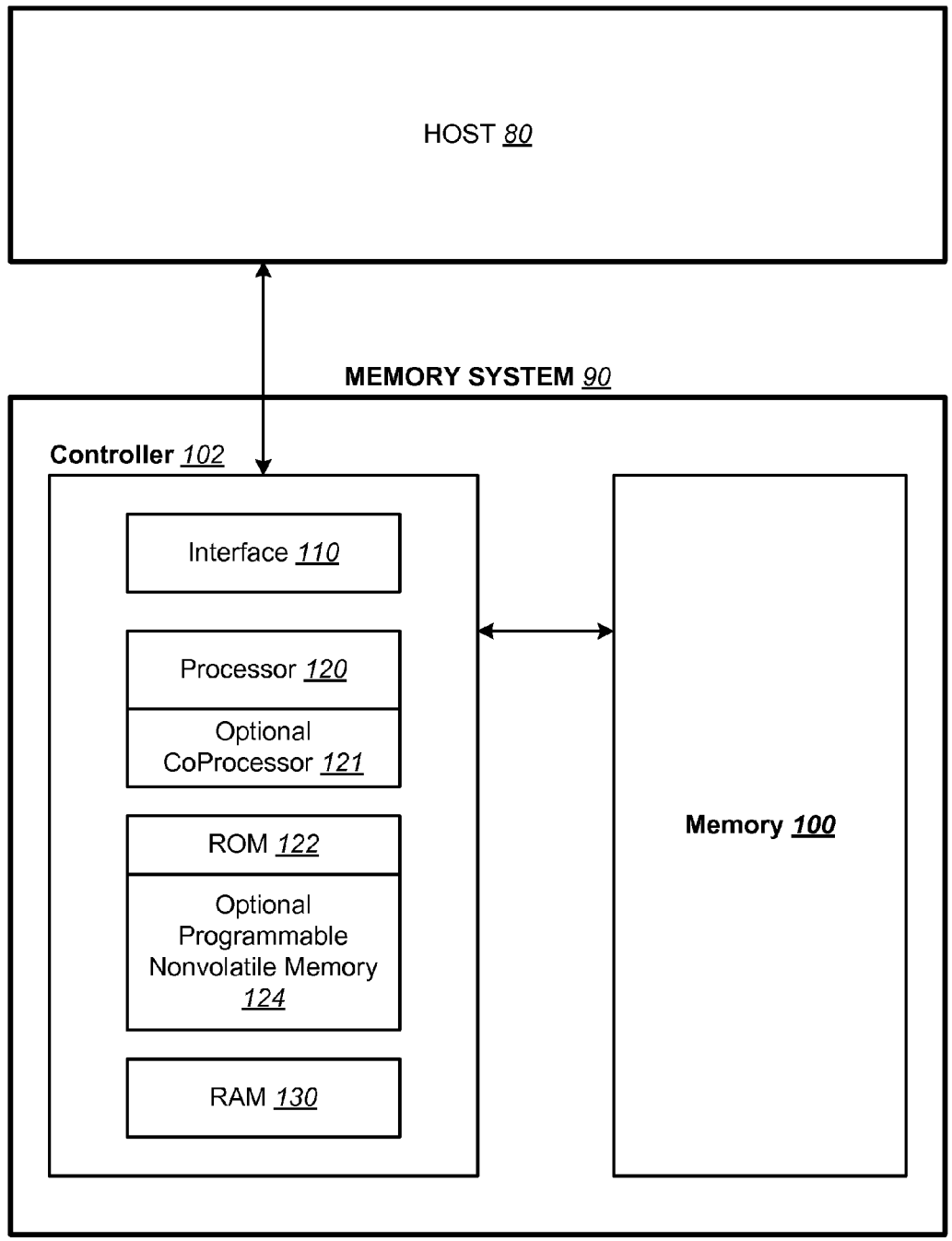
FIG. 1 illustrates schematically the main hardware components of a memory system suitable for implementing the present subject matter.

FIG. 1 illustrates schematically the main hardware components of a memory system suitable for implementing the present subject matter. The memory system 90 typically operates with a host 80 through a host interface. The memory system may be in the form of a removable memory such as a memory card, or may be in the form of an embedded memory system. The memory system 90 includes a memory 100 whose operations are controlled by a controller 102. The memory 100 comprises one or more array of non-volatile memory cells distributed over one or more integrated circuit chip. The controller 102 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Multiple memory elements may be configured so that they are connected in series or so that each element is individually accessible. By way of non-limiting example, flash memory devices in a NAND configuration (NAND memory) typically contain memory cells connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level (or memory level). Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

In a three-dimensional ("3D") memory structure, the memory is arranged so that memory elements occupy multiple planes or multiple memory device levels, thereby forming a structure in three dimensions (i.e., in the x, y and z directions, which are substantially orthogonal, and where the substrate is in a horizontal x-y plane and the z direction is vertical).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory elements in each column. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The three dimensional exemplary structures described cover all relevant memory structures within the spirit and scope of the subject matter as described herein.

Physical Memory Structure

Figure 2:
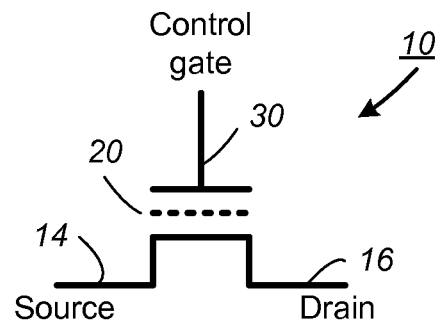
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924.

Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
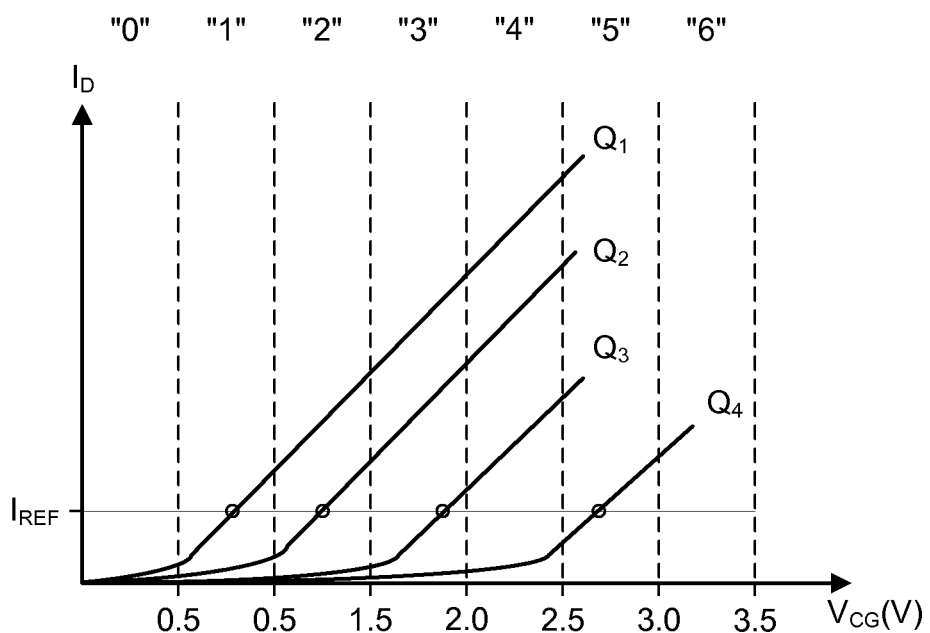
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5". In general, depending on the state partitioning of the threshold voltage window, a memory cell may be configured to store either one bit of data or more than one bit of data.

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
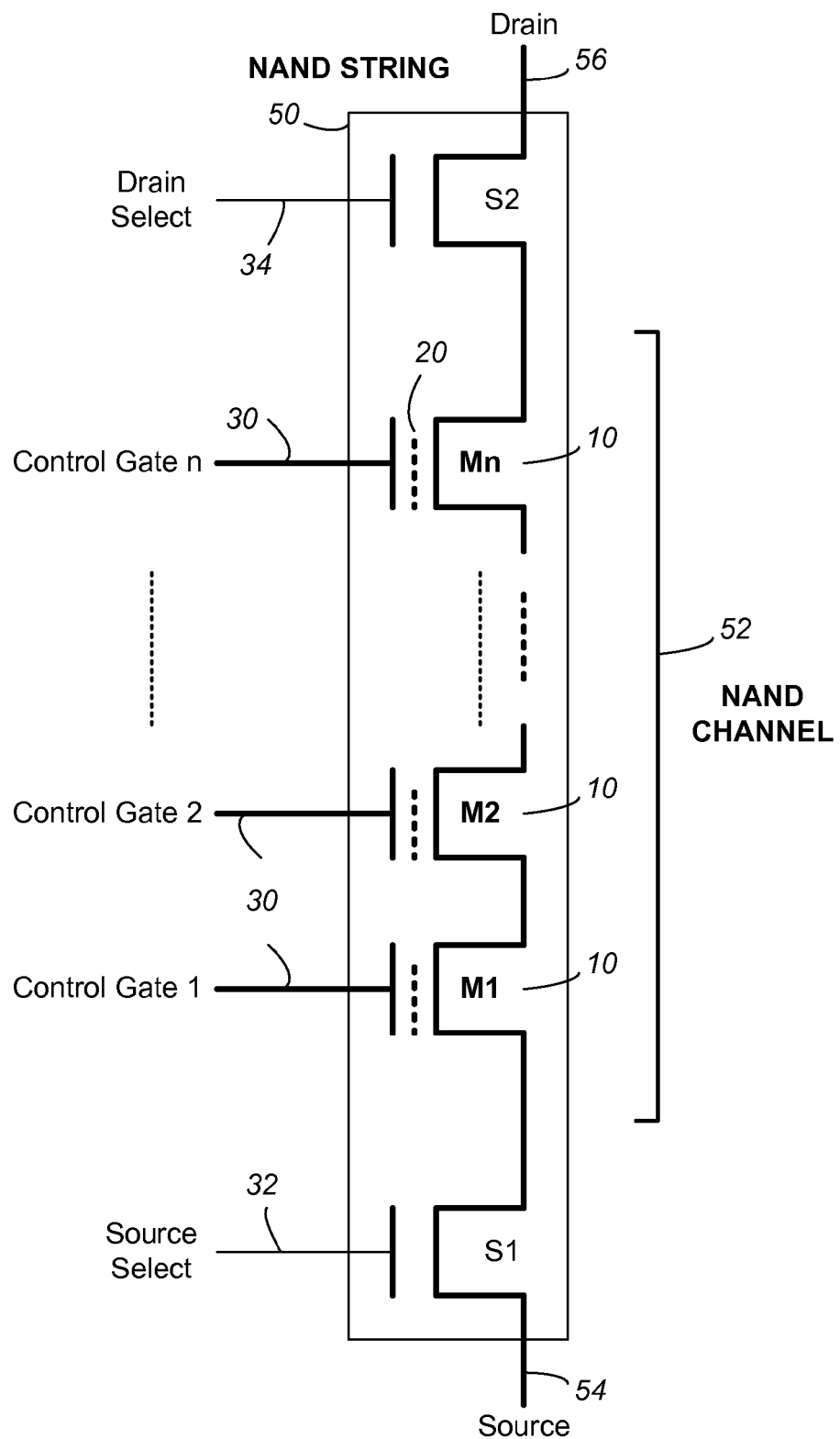
FIG. 4A illustrates schematically a daisy chain of memory cells organized into a NAND string.

FIG. 4A illustrates schematically a daisy chain of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2, respectively on the source side and the drain side of the string, controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state.

Each memory transistor has a control gate 30 that allows control over read and write operations. As will be seen in FIG. 4B, the control gates 30 of corresponding memory transistors of a row of NAND string are all connected to the same word line 40. Similarly, a control gate 32 of the select transistor S1, and a control gate 34 of the select transistor S2, provide control access to the NAND string via its source terminal 54 and drain terminal 56 respectively. Likewise, the control gates 32 of corresponding select transistors S1 of a row of NAND string are all connected to the same select line 42. The control gates 34 of corresponding select transistors S2 of a row of NAND string are all connected to the same select line 44.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path along a NAND channel 52 is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
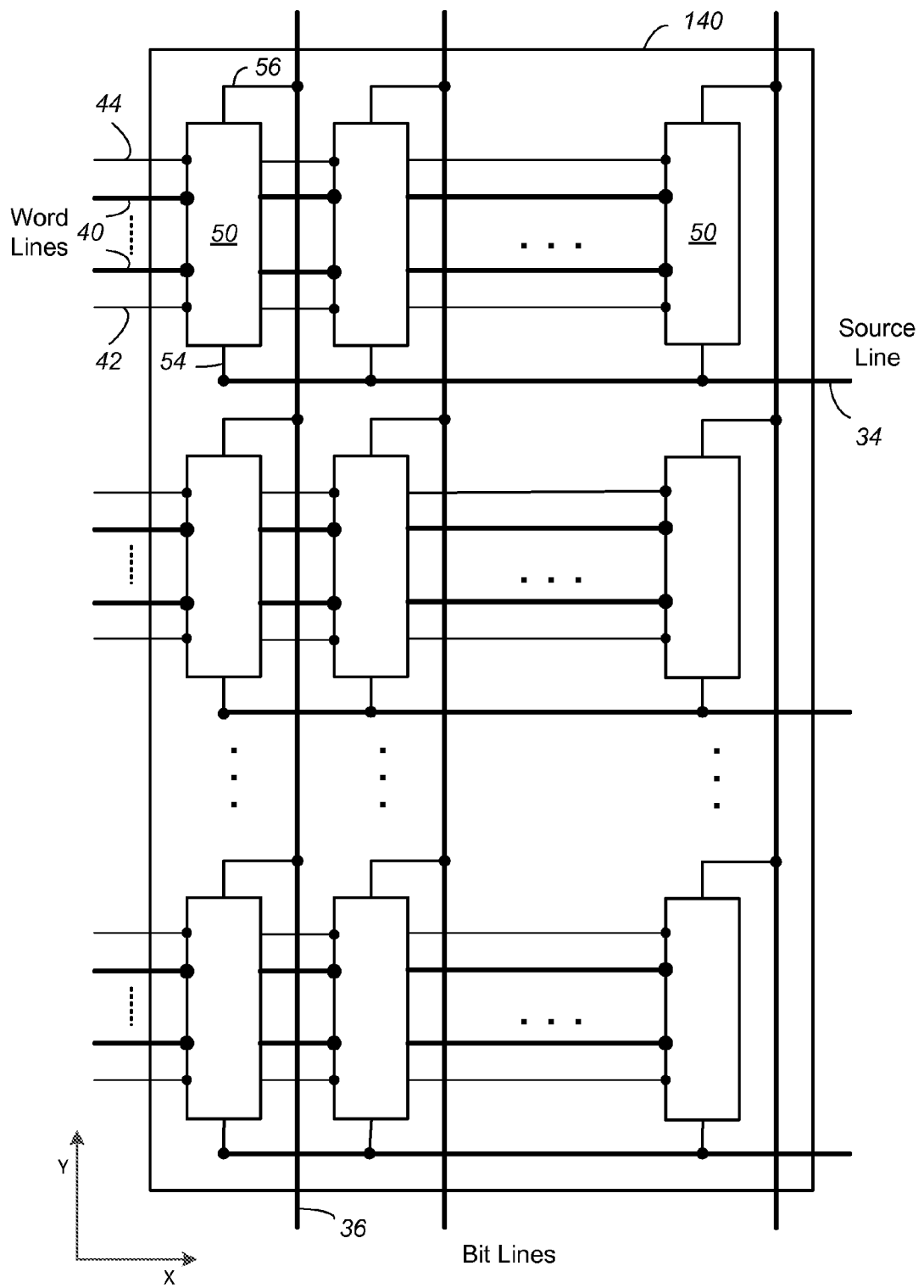
FIG. 4B illustrates a memory organized into an array of NAND strings.

FIG. 4B illustrates a memory organized into an array of NAND strings. For example, the array of memory cells are organized into an array 140 of NAND strings 50. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates 30 along a row of memory cells in a bank of NAND strings are connected to a word line such as word line 40. The control gates 32 along a row of select transistors S1 in a bank of NAND strings are connected to a select line such as select line 42. The control gates 34 along a row of select transistors S2 in a bank of NAND strings are connected to a select line such as select line 44. An entire row of memory cells in a bank of NAND strings can be addressed by appropriate voltages on the word lines and select lines of the bank of NAND strings.

Figure 5:
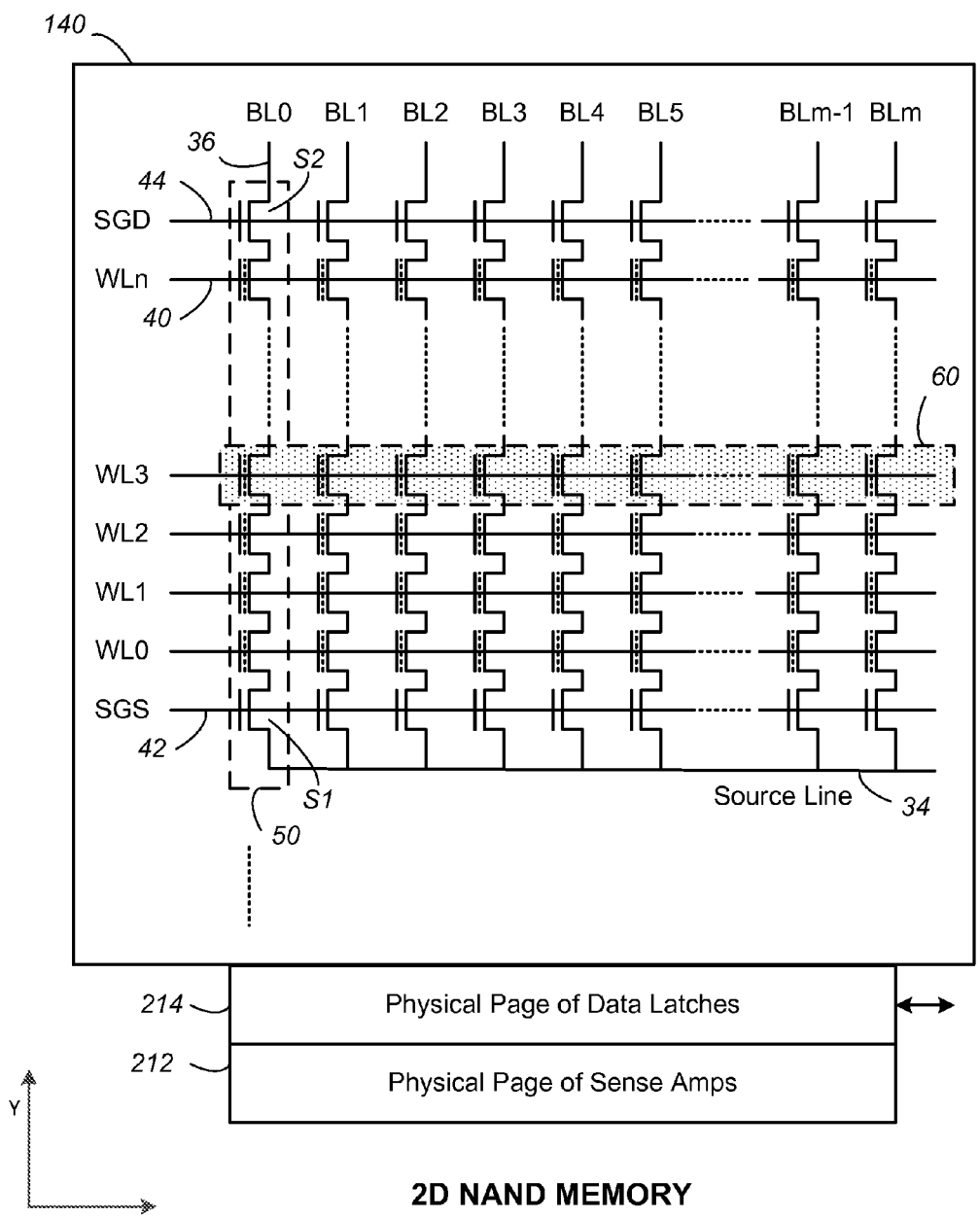
FIG. 5 illustrates a 2D NAND memory in the x-y plane.

FIG. 5 illustrates a 2D NAND memory in the x-y plane. The planar NAND memory is formed in a substrate. The memory is organized into pages, with each page of memory cells being sensed or programmed in parallel. FIG. 5 essentially shows a bank of NAND strings 50 in the memory array 140 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 150. The sensed results are latched in a corresponding set of latches 160. Each sense amplifier can be coupled to a NAND string via a bit line. The page is enabled by the control gates of the cells of the page connected in common to a word line 40 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Organization of the Memory into Erase Blocks

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
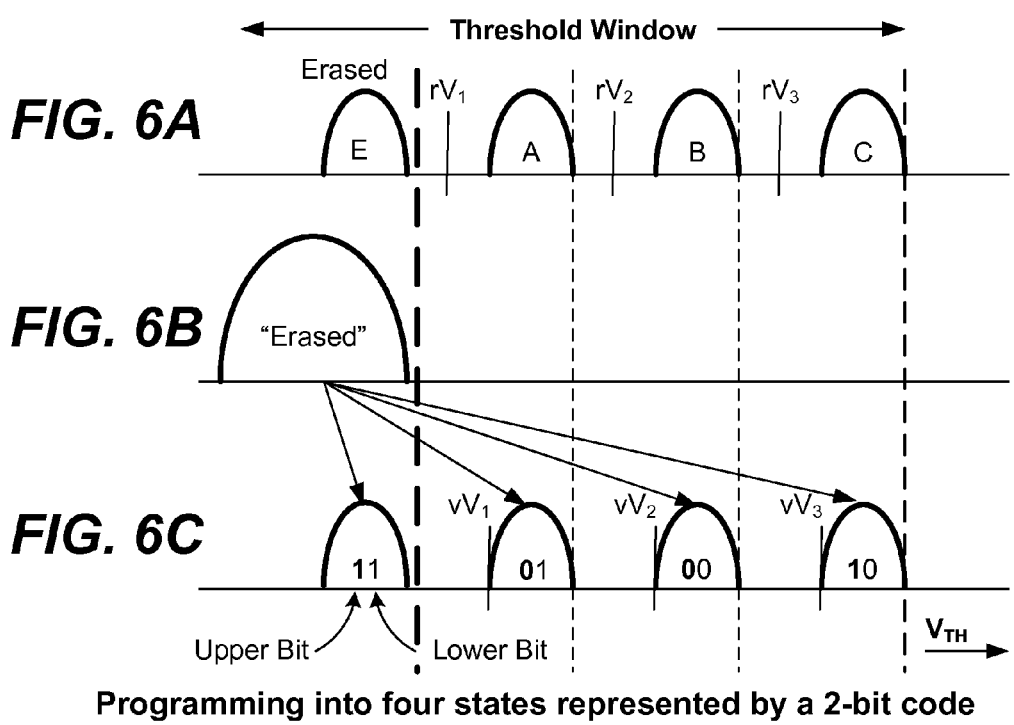
FIG. 6A illustrates the population of memory cells programmable into four distinct distributions of threshold voltages.
FIG. 6B illustrates the initial distribution of "erased" threshold voltages for an erased memory.
FIG. 6C illustrates an example of the memory after many of the memory cells have been programmed.

FIGS. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

Figure 7:
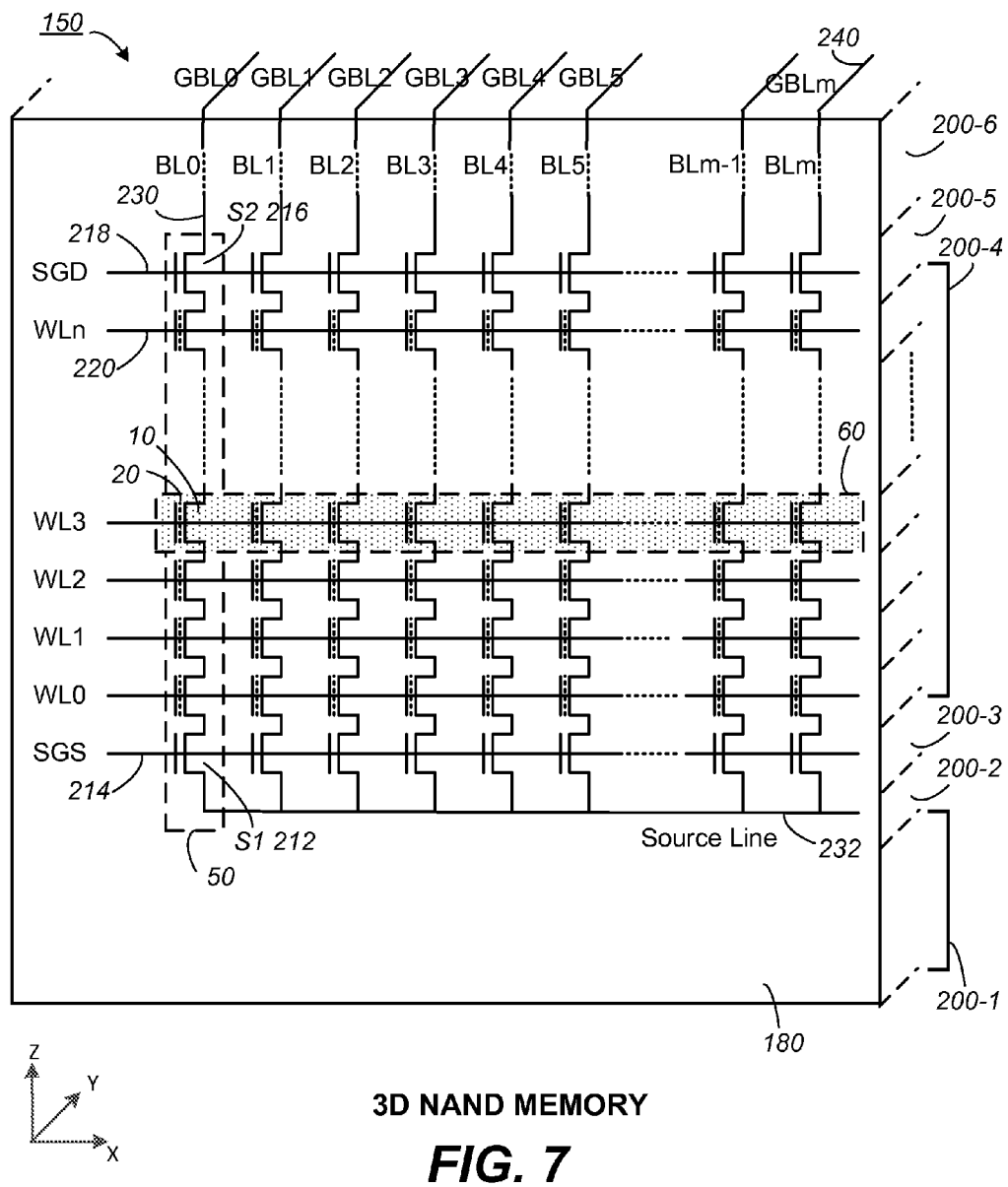
FIG. 7 is a three-dimensional (3D) NAND array, which further extends a conventional two-dimensional (2D) NAND array illustrated in FIG. 5.

FIG. 7 is a three-dimensional (3D) NAND array, which further extends a conventional two-dimensional (2D) NAND array illustrated in FIG. 5. In contrast to 2D NAND arrays, which are formed in a substrate of a planar surface of a semiconductor wafer, 3D arrays are formed on stacks of memory layers extend up from the substrate. Various 3D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Pat. No. 7,558,141, U.S. Pat. No. 8,405,142, U.S. Patent Publication Number 2012/0220088 and in U.S. Patent Publication Number 2013/0107628.

FIG. 7 is a schematic illustration of a 3D NAND memory. The 3D NAND memory 150 has a 2D array of vertical NAND strings 50 in the x-y plane on top of the substrate 180. Memory cells 10 are at crossings where a vertical bit line 230 (local bit line, e.g., BL0, BL1, etc.) 230 crosses a word line 220 (e.g. WL0, WL1, etc.). In the present embodiment, the vertical bit line 230 are doped polysilicon that forms the NAND channel 52 (see FIG. 4A) as well as part of the switches S1 and S2 of the NAND string. The page of vertical bit lines BL0-BLm 230, crossed by the same word line 220, are switchably connected to sense amplifiers (not shown) via corresponding global bit lines GBL0-GBLm 240. The global bit lines 240 are running along the y-direction and spaced apart in the x-direction. In one embodiment, the word lines 220 and the global bit lines 240 are metal lines.

As with planar NAND strings, select transistors S1 212, S2 216, are located at either end of the string to allow the NAND string to be selectively connected to, or isolated from external elements. For example, the select transistor S1 212, in response to a signal on a control line SGS 214, switches the source side of a NAND string to a common source line 232. The select transistor S2 216, in response to a signal on a control line SGD 218, switches the drain side of a NAND string to a global bit line 240.

Vertical NAND strings may be operated in a similar manner to planar NAND strings and both SLC and MLC operations are possible. While FIG. 7 shows explicitly one bank of vertical NAND strings, it will be understood that similar banks are spaced apart in the y-direction.

The 3D NAND memory 150 forms multiple layers on top of a substrate 180 (layer 200-1). As the NAND strings 50 are aligned vertically, each of the multiple layers corresponds to a structure of the vertical NAND string.

For example, a metal layer 220-2 including the source lines 232 is on top of the substrate 180. The metal line layer 220-2 is followed by a source-side switch layer 200-3, which corresponds to the source-side switch S1 212 and control line SGS 214.

The source-side switch layer 200-3 is followed by a series of memory layers 200-4 where the memory cells and word lines of the NAND string will reside. In general, each memory cell in a vertical NAND chain 50 will be in a different memory layer.

The series of memory layers 200-4 is followed by a drain-side switch layer 200-5, which corresponds to the drain-side switch S2 216 and control line SGD 218.

The drain-side switch layer 200-5 is followed by a second metal line layer 200-6, which corresponds to the global bit lines 240.

Figure 8:
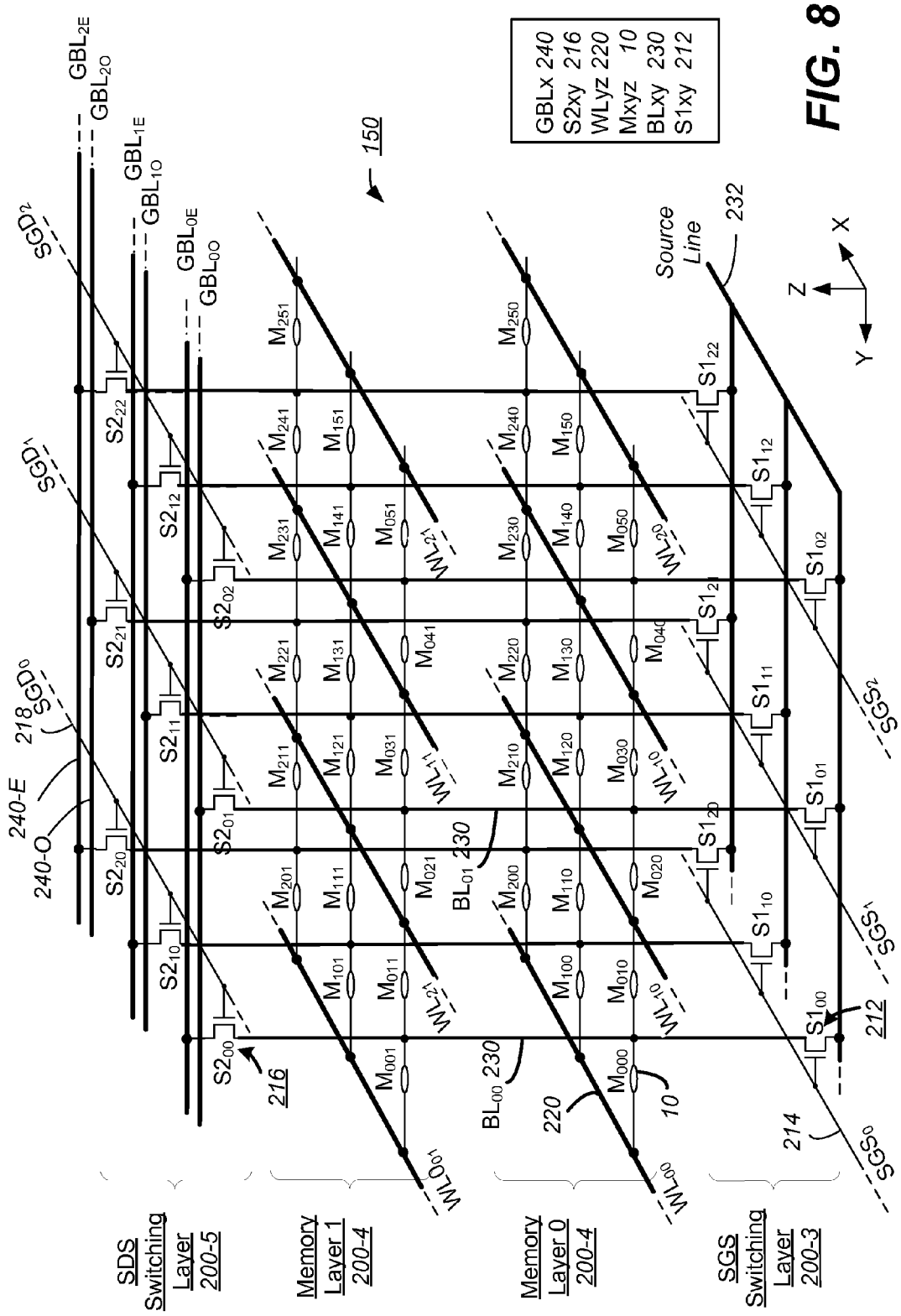
FIG. 8 is a schematic and perspective view of the 3D NAND similar to the memory shown in FIG. 7.

FIG. 8 is a schematic and perspective view of the 3D NAND similar to the memory shown in FIG. 7. For simplicity, only two memory layers, memory layer 0 and memory layer 1, are illustrated, although it is clear that in general there will be as many memory layers 200-4 as there are memory cells in each vertical NAND chain 50.

The series of memory layers 200-4 further comprises multiple memory layers corresponding to respective memory cells 10 in each NAND string. The respective memory cells (Mxyz) of each NAND string are in corresponding memory layers, which are stacked in the z-direction. Thus, each memory layer is a 2D array of memory cells Mxy from respective memory cells of the 2D array of vertical NAND strings in the x-y plane. For example, a first memory layer 0 is contributed from the first memory cell above the S1 switch of every NAND string. A second memory layer 1 is contributed from the second memory cell above the first memory cell in the NAND strings.

The series of memory layers of the three-dimensional memory cell structure is typically interleaved with layers of dielectric material (not shown) that electrically isolate the memory layers from each other. Additional layers may also be present, depending for example on the structure of the memory cells 10. The memory layers are stacked in the z-direction on the semiconductor substrate with the local bit lines 230 being connected with cells of each memory layer through which the local bit lines extend.

A 2D array of local bit-lines 230, (BLxy), elongated in the z-direction, extends across all the memory layers 200-4. The local bit lines are elongated vertically, in the z-direction, and form a regular two-dimensional array in the x (row) and y (column) directions.

In a double-sided word line architecture, each word line WLyz in a memory layer typically crosses two adjacent rows of bit-lines BLxy, one even row and one odd row respectively on each side of the word line. The word lines at either edge in the y-direction of each memory plane are exceptions, being adjacent to only one row of bit lines.

In each memory layer, word lines (WLyz) 220 are elongated in the x-direction and spaced apart in the y-direction between the local bit-lines (BLxy) 230. For example, the word line $WL_{10}$ is flanked on either side by the bit lines $BL_{00}$ and $BL_{01}$ respectively.

The individual memory cells 10 are connected between one local bit line BL 230 and one word line WL 220 adjacent the individual crossings. An individual memory cell 10 is therefore addressable by placing proper voltages on the local bit line BL and word line WL between which the memory cell is connected. In operation, the NAND chain is activated by the SGS and SDS control signals and the word line connect to the individual memory cell is selected with a select biased voltage while the rest of the word lines in the NAND chain are biased to some other voltages (see FIG. 7 also).

Each vertical NAND string is activated by being selectively switched to external connections by its source and drain select transistors 212 and 216 respectively. The source select transistor S1 212 selectively connects a NAND string 50 to a source line 232. The drain select transistor S2 216 selectively connects the NAND string 50 to a global bit line (GBLxy) 240 that is connected to sensing circuits (not shown). The source and drain select transistors are controlled by the control signals SGSy and SDSy respectively. These control signals are biased in the same group as the word lines of the active NAND chain. In operation, each word line crosses an even and an odd row of NAND chains on either side in the y-direction. So both the even and odd rows of NAND chains will be selected by the same word line.

Since both adjacent even and odd rows of NAND chains/bit lines 230 are selected at the same time, they must individually be connected to even and odd global bit lines GBL 240-E, 240-O respectively. Each pair of even and odd GBLs is elongated in the y-direction. Each column of vertical NAND chains/bit lines (spaced apart in the x-direction) is divided in even and odd bit lines 230. The even bit lines are connected via their drain select transistors S2 216 to the even GBL 240-E. The odd bit lines are connected via their drain select transistors S2 216 to the odd GBL 240-O.

In one embodiment such as disclosed in U.S. Pat. No. 8,958,228, the NAND chain select transistors S1 212 and S2 216 are formed as vertical switches such as vertically aligned (z-axis) TFTs (Thin-Film Transistors).

Figure 9:
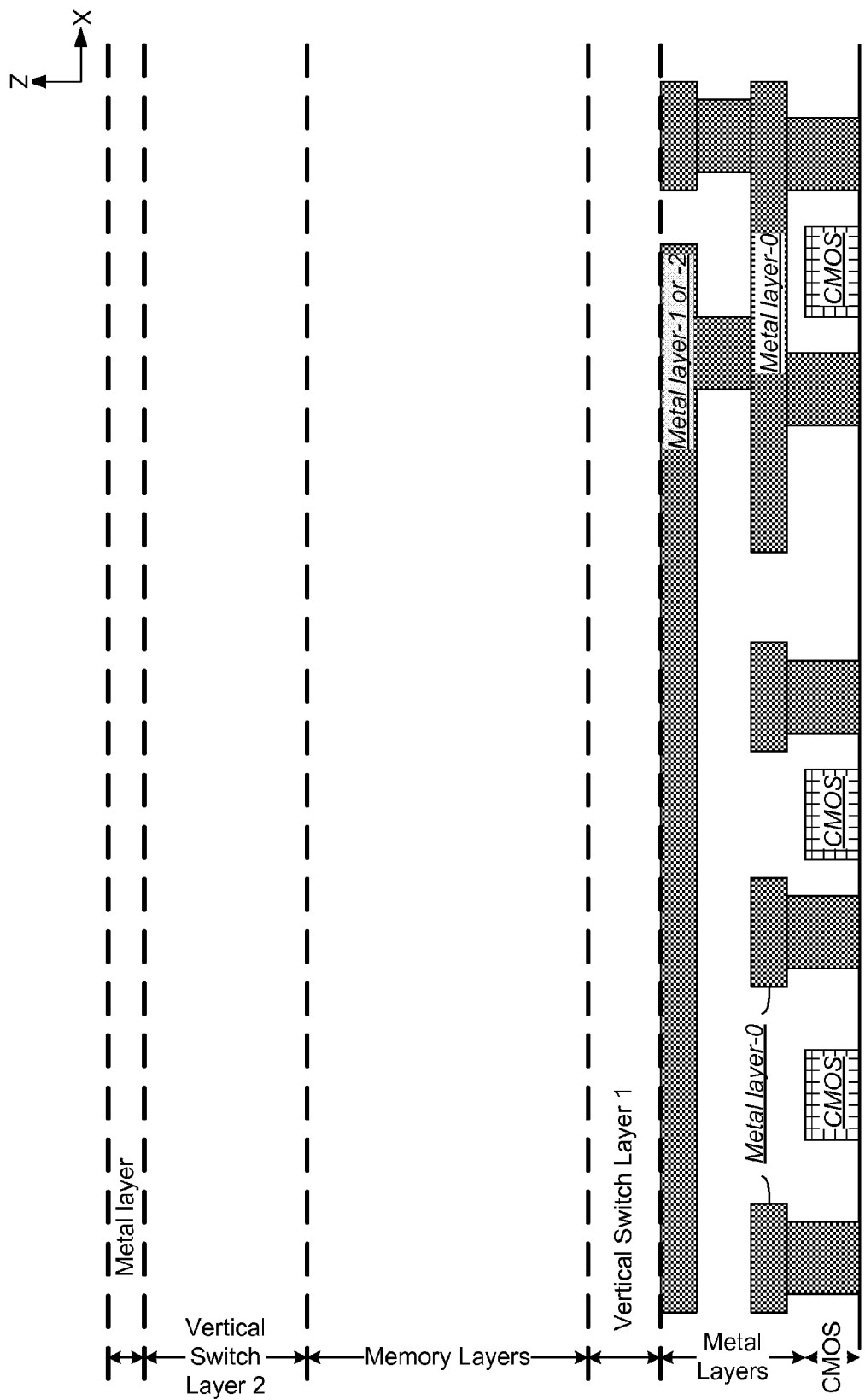
FIG. 9 illustrates the multi-layer structure of an exemplary 3D memory device in a cross-sectional view from the y-direction along the global bit lines and perpendicular to the word lines.

FIG. 9 illustrates the multi-layer structure of an exemplary 3D memory device in a cross-sectional view from the y-direction along the global bit lines and perpendicular to the word lines. Essentially, the 3D memory device comprises five gross layers: a CMOS and metal layer; a vertical switch layer 1; a plurality of memory layers; a vertical switch layer 2 and a top metal layer. The 3D memory elements are fabricated in a memory layer on top of the CMOS and metal layer. The CMOS and metal layer are formed on a substrate and other gross layers are formed on top of it. On top of the CMOS devices there may be several metal layers, such as metal layer-0, metal layer-1 and metal layer-2. The vertical select layer 1 and layer 2 contain vertical select switches in the form of thin-film transistors (TFTs). Another metal layer is on top of the vertical select layer 1.

Floating Gate Charge Storage Element Coupled to a Word Line with a Socket Structure Existing 3D NAND memories such as BiCS 3D NAND, employ a charge trapping layer between the local bit line and the word line to store charge to modify the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable pipe-shaped local bit line/channel material (with suitable dielectric layers for isolation).

One difference between a three dimensional memory array and a two dimensional memory array is that certain physical dimensions of memory cells may vary with the location of the memory cells in the vertical direction. While memory cells in a planar array may be made by process steps that generally have uniform effect across the plane of the substrate, some steps in formation of three dimensional memory arrays are not uniform from layer to layer and may also have significant non-uniformity laterally across a substrate. For example, memory holes may be formed by etching down through multiple layers using an appropriate anisotropic etch. However, such holes may not be perfectly uniform from top to bottom because of the high aspect ratio that is typical of such memory holes. In general, such memory holes are wider towards the top than the bottom. Or, they may be widest somewhere near the top with some narrowing towards the top. This problem is more serious with the scaling of the memory to higher density. As the number of memory cells in a NAND string increases, so is the number of layers and the higher is the aspect ratio.

The present 3D NAND memory affords significant reduction in memory cell size allowing a 4 to 8 times reduction in cell dimension compared to existing 3D NAND memories. Instead of using a charge trapper layer with an annular geometry of small curvature to increase capacitive coupling with a word line, the present memory cell employs a floating gate 20 to trap charges. In particular, the size of the memory cells is reduced without having to use a conventional floating gate to ensure sufficient capacitive coupling with the word line. This is accomplished by each floating gate being embedded by a socket component of a word line, which increases capacitive coupling. In addition, this geometry has the benefit that floating-gate to floating-gate disturb (Yupin effect) between neighboring memory cells is diminished.

U.S. patent application Ser. No. 14/494,869, filed Sep. 24, 2014 by the inventor of the present application discloses a 3D NAND memory with socketed floating gate cells.

Figure 10:
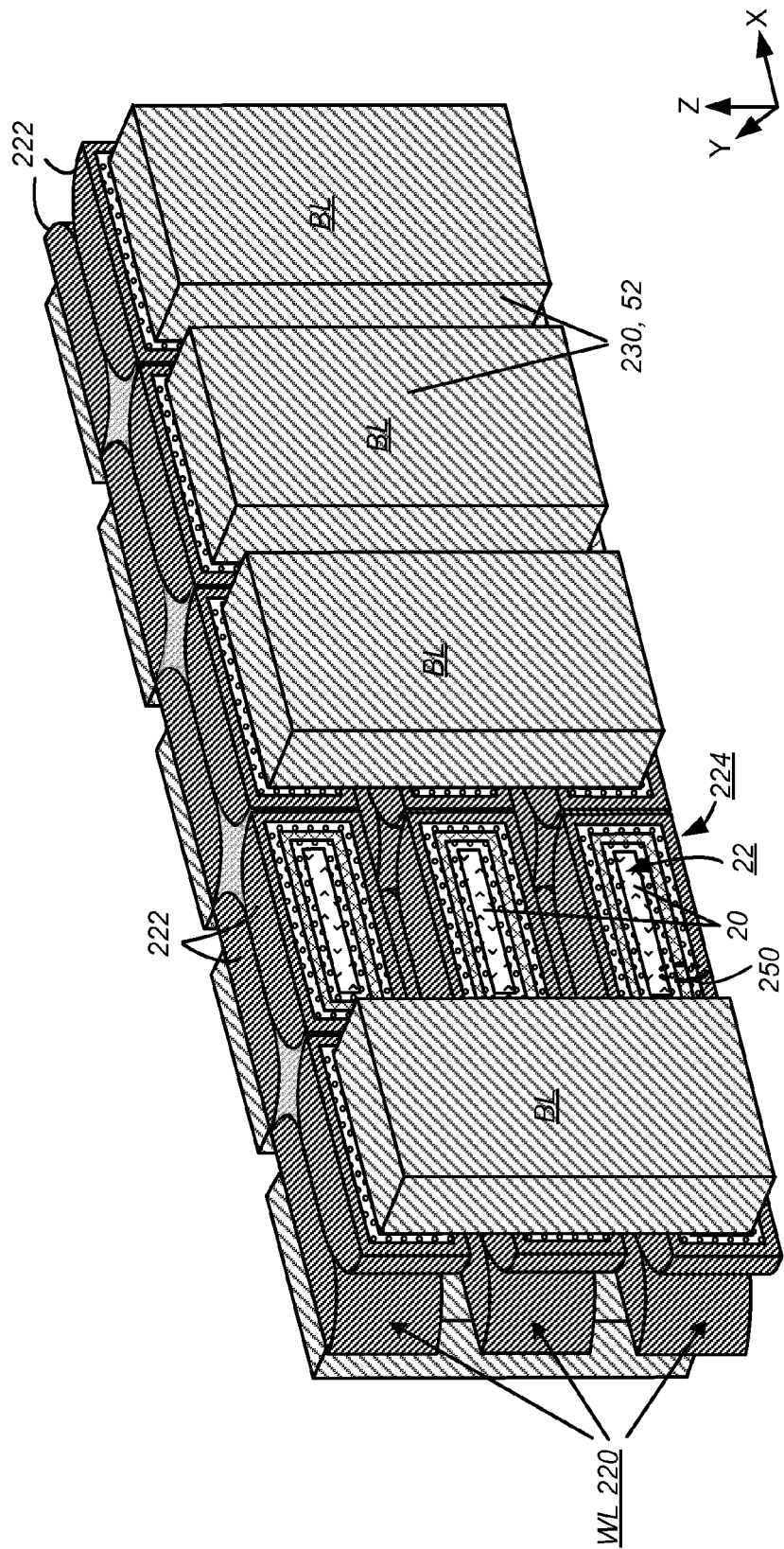
FIG. 10 illustrates in a 3D perspective view the details of the 3D NAND memory layer with each word line having a series of socket components surrounding individual floating gates of a group of memory cells.

FIG. 10 illustrates in a 3D perspective view the details of the 3D NAND memory layer with each word line having a series of socket components surrounding individual floating gates of a group of memory cells. The floating gate 20 of each memory cell is aligned in the y-direction with a first end embedded in a socket component 222 of the word line 220 and a second end 22 near the channel 52 of the NAND string 50. The channel 52 forms part of the bit line 230. For example, the bit line 230 is constituted from polysilicon and portions of it are doped to form channels 52. The word line 220 along a group (e.g., a page 60) of memory cells (see FIG. 7) is constituted by a series of socket components 222, one for each memory cell of the group. Each socket component 222 is aligned in the y-direction with a closed end and an opening 224. In the example shown, the socket components 222 are contiguous to each other along the word line (x-direction). The floating gate 20 of each memory cell has its first end embedded by a respective socket component 222 and a second end 22 exposed at the opening 224 of the respective socket component 222.

The floating gate 20 of each memory cell is isolated from the respective socket component 222 by a dielectric material 250 that lines the interior wall of the socket component. The channel 52 or bit line 230 is isolated from the second end 22 of the floating gate 20 and also the socket component 222 by a tunnel oxide 260 (not shown in FIG. 10 but shown in FIG. 11).

In the example shown in FIG. 10 (see also FIG. 8), each row of memory cells and bit lines is along the x-direction and a word line is running along each row of memory cells. In particular, in each memory layer, the rows of memory cells and bit lines along the x-direction are spaced apart in the y-direction. A pair of word lines is flanking each row of memory cells and bit lines. Thus, except for the edge of the memory, each word line is in a double-sided configuration, capable of controlling on either side the pair of adjacent rows of memory cells. As described earlier, each socket component 222 has a closed end and an opening 224. Thus, in this double-sided configuration, each word line is formed by a contiguous strip of pairs of back-to-back socket components. The opening 224 of each socket component is in the y-direction facing away from the word line.

Figure 11:
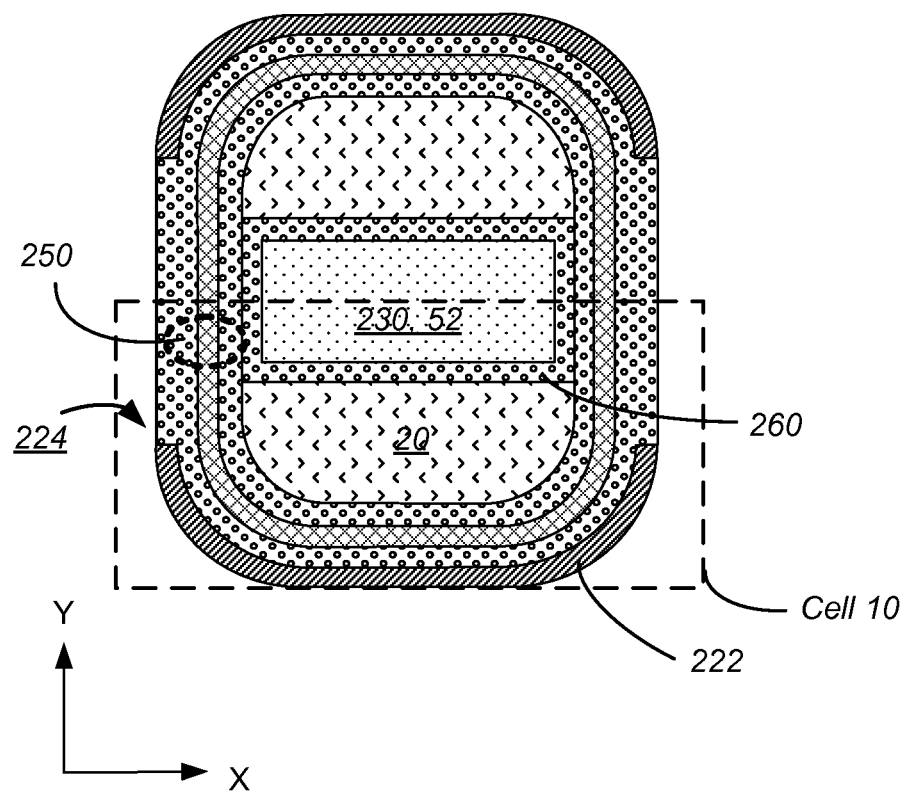
FIG. 11 is a cross section in the x-y plane of two memory cells sharing a local bit line.

FIG. 11 is a cross section in the x-y plane of two memory cells sharing a local bit line. The common local bit line 230, 52 is elongated in the z-direction. In particular, memory cell 10, one of the two memory cells, is delineated by a rectangular box with broken lines. It will be seen that the floating gate 20 is disposed between a socket component 222 of a word line and a bit line 230 with a channel 52. The floating gate 20 is embedded into the socket component 222 of the word line and is sticking out at the opening 224 of the socket component. The floating gate 20 is isolated from the socket component 222 by the dielectric material 250, which typically comprises layers of oxide, nitride and oxide. The floating gate 20 is isolated from the bit line 230, 52 by the tunnel oxide 260.

Figure 12:
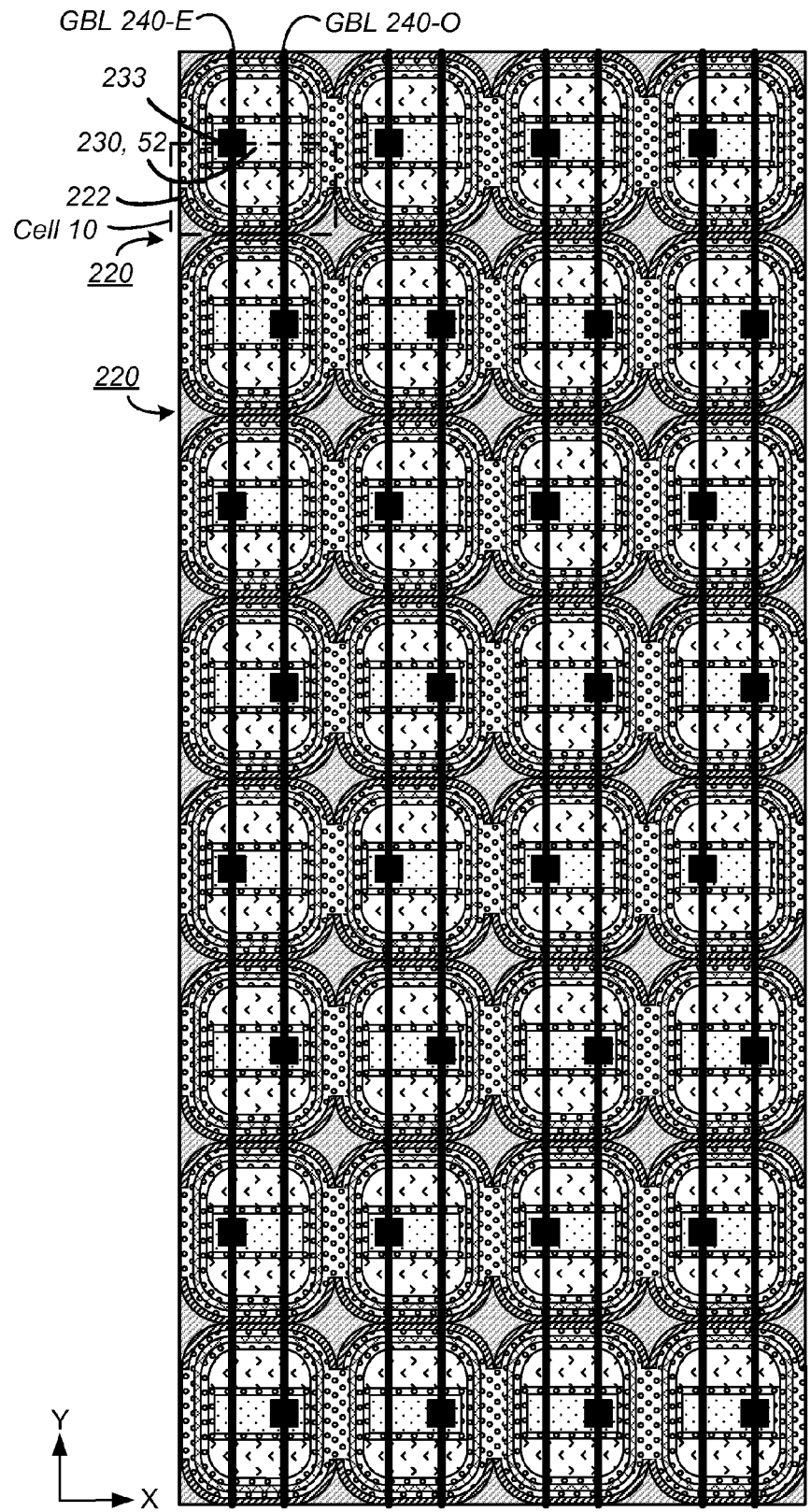
FIG. 12 is a cross section of a portion of the 3D NAND memory in the x-y plane.

FIG. 12 is a cross section of a portion of the 3D NAND memory in the x-y plane. The array of memory cells 10 (FIG. 8) are served by rows of vertical bit lines (local bit lines or bit line pillars) 230, 52 along the x-direction and columns of vertical bit lines along the y-direction. A set of global bit line (GBLs) 240 runs along the y-directions makes connections with a top end of the bit line pillars respectively. The connections are implemented in a switching layer, where a switch 216 (corresponding to the drain-side switch of a NAND string, see FIG. 7 and FIG. 8) couples between a bit line pillar 230, 52 via a contact 233 to either GBL 240-E or GBL 240-O.

4-Mask, Self-Aligned Process for Fabricating the 3D NAND Memory Having Word Lines with Socket Components The 3D NAND memory shown in FIGS. 8-12 essentially has the vertical (z-direction) NAND strings forming a 2D array in the x-y plane. Each NAND string includes a daisy chain of memory cells and a bit line (bit line pillar) aligned in the z-direction and each memory cell 10 accessible by word lines 220 in the x-direction. Each word line has a socket component 222 for each memory cell. The socket component 222 embeds a floating gate 20 of the memory cell 10. The channel 50 of the memory cell is part of a bit line 230.

The word lines in the x-direction in each cell memory plane are grouped back-to-back in pairs, with the socket component openings 224 of one of the pair facing that of the other of the pair.

Figure 13:
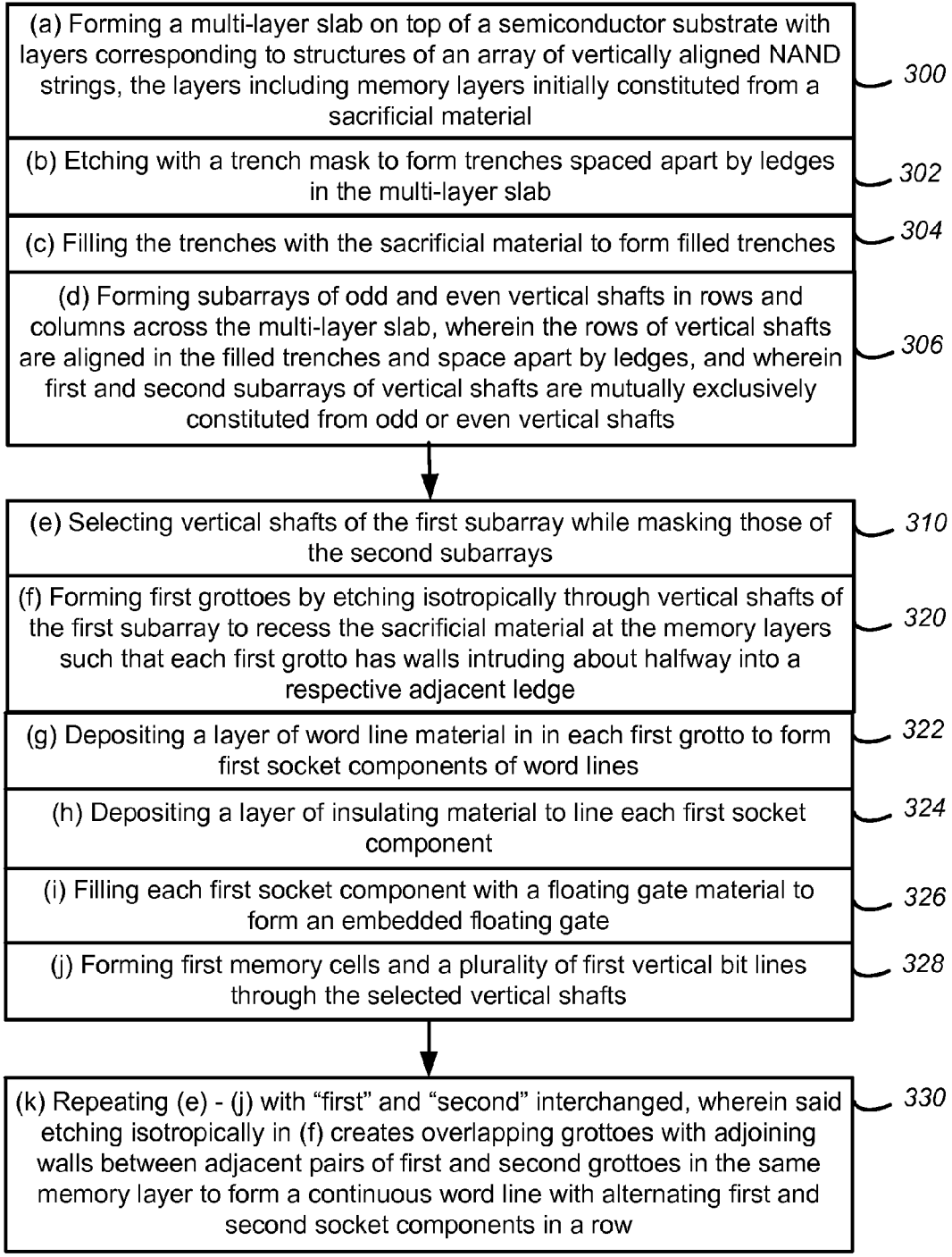
FIG. 13 illustrates a general scheme of fabricating such a 3D NAND memory.

FIG. 13 illustrates a general scheme of fabricating such a 3D NAND memory using four masks.

STEP 300: (a) forming a multi-layer slab on top of a semiconductor substrate with layers corresponding to structures of an array of vertically aligned NAND strings, the layers including memory layers initially constituted from a sacrificial material.

STEP 302: (b) etching with a trench mask to form trenches spaced apart by ledges in the multi-layer slab.

STEP 304: (c) filling the trenches with the sacrificial material to form filled trenches.

STEP 306: (d) forming subarrays of odd and even vertical shafts in rows and columns across the multi-layer slab, wherein the rows of vertical shafts are aligned in the filled trenches and space apart by ledges, and wherein first and second subarrays of vertical shafts are mutually exclusively constituted from either odd or even vertical shafts.

STEP 310: (e) selecting first vertical shafts of the first subarray while masking those of the second subarrays.

STEP 320: (f) forming first grottoes by etching isotropically through first vertical shafts to recess the sacrificial material at the memory layers such that each first grotto has walls intruding about halfway into a respective adjacent ledge.

STEP 322: (g) depositing a layer of word line material in each first grotto to form first socket components of word lines.

STEP 324: (h) depositing a layer of insulating material to line each first socket component.

STEP 326: (i) filling each first socket component with a floating gate material to form an embedded floating gate.

STEP 328: (j) forming first memory cells and a plurality of first vertical bit lines through the selected vertical shafts.

STEP 330: (k) repeating (e)-(j) with "first" and "second" interchanged, wherein said etching isotropically in (f) creates overlapping grottoes with adjoining walls between adjacent pairs of first and second grottoes in the same memory layer to form a continuous word line with alternating first and second socket components in a row.

FIGS. 14 to 52 illustrate in more detail the process steps of fabricating the 3D NAND memory outlined in FIG. 13. A process using four masks for fabricating the 3D NAND memory having word lines with socket components is described. A word line mask is used to partition the multi-layer slab into trenches spaced apart by ledges. Word lines are formed under the ledges elongated in the x-direction. A bit line mask is used to pattern the multi-layer slab along the y-direction. This allows creation of an array of openings at the top of the multi-layer slab, which is then used to create an array of vertical shafts. Using odd and even masks, the array of vertical shafts is further partitioned into a subarray of odd vertical shafts and a subarray of even vertical shafts respectively. The vertical shafts allow bit access to the memory layers in the multi-layer slab to fabricate individual memory cells with word lines having socket components along the x-direction and bit lines in the z-direction.

Forming of a Multi-Layer Slab

As outlined in FIG. 13, STEP 310, a multi-layer structure is formed on top of the semiconductor substrate as illustrated in FIGS. 7-9. Initially, the multi-layer slab is formed by depositing on top of a substrate and other layers, such as a first metal layer 524 (e.g., corresponding to the metal layer-0 in FIG. 9), a metal layer 232' (e.g., corresponding to the metal layer-1 in FIG. 9), a polysilicon layer 232", and alternate layers of oxide 280 and nitride 282. The nitride layers 282 will serve as a place-holder and sacrificial layer for forming the memory layers 200 (see FIGS. 7 and 8). It will be understood that if the vertical NAND string has a chain of n memory cells, there will be corresponding n number of memory layers.

Forming an Array of Vertical Shafts

As outlined in FIG. 13, STEP 320, an array of vertical shafts is formed in the multi-layer. The multi-layer slab is partitioned in the x-y plane by a series of masks into rows (x-direction) and columns (y-direction) for demarcating the 3D arrays of memory cells. The word lines in each memory layer will run along the row (x-) direction and the memory cells and bit lines in each row are spaced apart in the column (y-) direction. An array of vertical shafts will be formed in these partitions to provide access to the different layers of the multi-layer slab.

Figure 14:
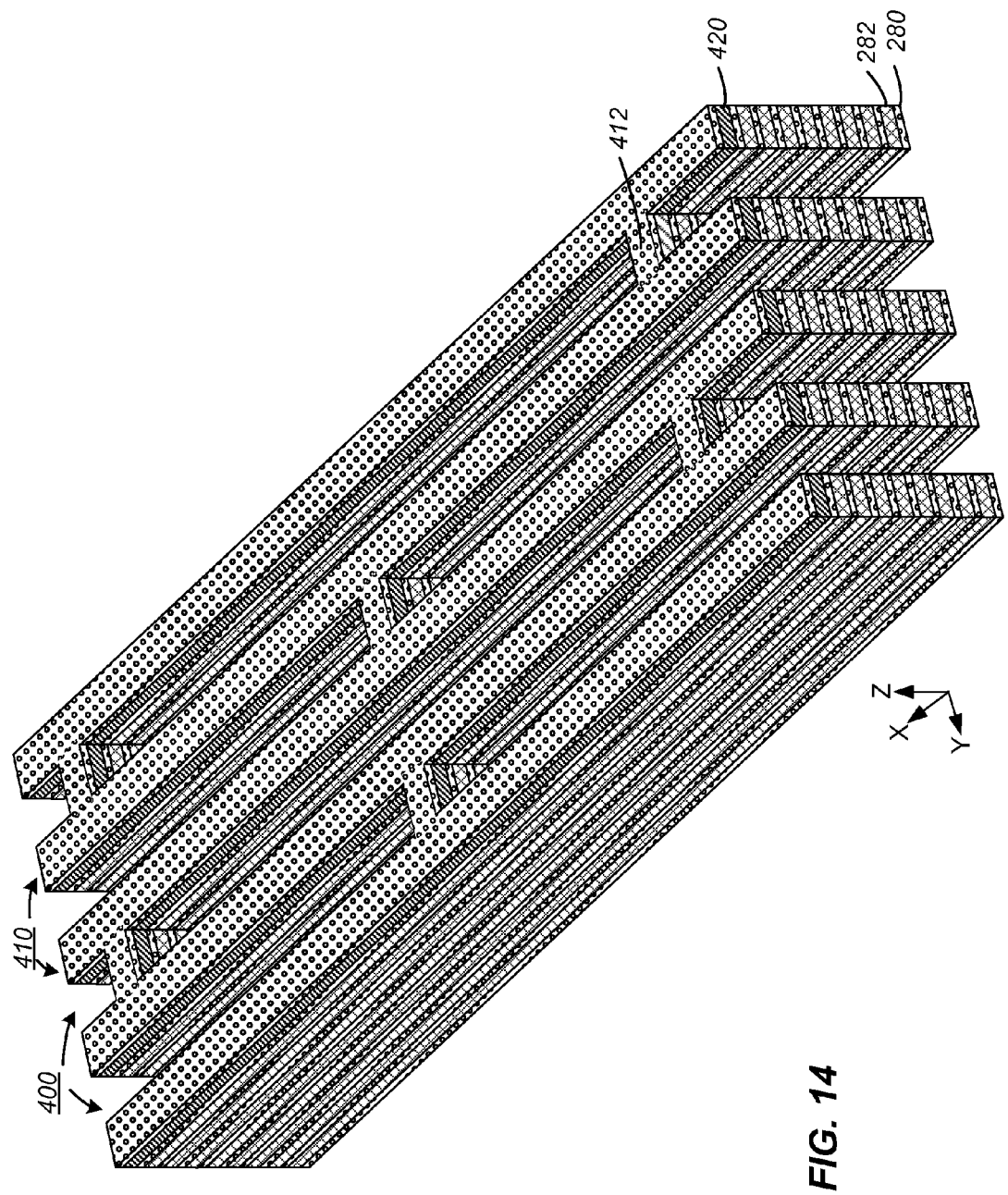
FIG. 14 is a 3D perspective view of a stage of fabrication of the multi-layer slab after trenches have been opened along the x-direction following the processes that will be shown in FIGS. 15A, 15B, 16A, 16B, 17A, 17B.

Partitioning the Rows for the Word Lines by Forming Trenches and Ledges and Buttresses on the Multi-Layer Slab FIG. 14 is a 3D perspective view of a stage of fabrication of the multi-layer slab after trenches have been opened along the x-direction following the processes that will be shown in FIGS. 15A, 15B, 16A, 16B, 17A, 17B. The trenches 400 are spaced apart in the y-direction with intervening ledges 410. The slab comprises multiple layers. Essentially, the multiple layers correspond to a structure of with an array of the memory cells of the vertical NAND strings shown in FIG. 7. Each memory cell on a vertical NAND string resides in a memory layer. The multiple memory layers are isolated from each other by an oxide layer 280.

As will be described later, a back-to-back pair of socketed word lines will be formed at each memory layer below each ledge 410 along the x-direction. Selected portions of the trenches 400 will be filled back to leave the array of vertical shafts.

Buttresses 412 at predefined locations in the multi-layer slab act as a bridge between adjacent ledges 410 to provide structural support for preventing the sidewalls of the ledges 410 from collapsing. As will be described later, the space occupied by each buttress 412 will synergistically be employed for a VIA connecting a word line at a memory layer to a word line x-decoder contact pad in the substrate below.

A hard mask 420 is on top of the successive layers of oxide and nitride layers. Another oxide layer is on top of the hard mask 420.

FIG. 15A is a plan view of the x-y plane of the multi-layer slab after an initial etch through the opening of a word line mask. During an anisotropic etch, the word line mask 414 masks the ledges 410 and allows trenches to be formed.

FIG. 15B is a cross-sectional view of the z-y plane of the multi-layer slab along the section B-B shown in FIG. 15A. Anisotropic etch through the opening of a word line mask 414 forms ledges 410 and trenches 400 along the x-direction in the multi-layer slab. The anisotropic etch is stopped by the layer of hard mask 420. The trenches are interrupted a predefined intervals along the x-direction by buttresses 412 that form bridges across adjacent ledges. FIG. 15B also shows the multi-layer slab having interleaving nitride layers 282 and oxide layers 280 and 280-n. It also has base layers including an x-decoder contact pad 524, a source line metal such as the layer 232' and a source line polysilicon layer such as the layer 232".

FIG. 16A is a plan view of the x-y plane of the multi-layer slab after etching through the hard mask.

FIG. 16B is a cross-sectional view of the z-y plane of the multi-layer slab along the section B-B shown in FIG. 16A. An anisotropic etch of the hard mask 420 through the opening of the word line mask 414 cuts through the hard mask layer 420 to reach a top oxide layer 280-n.

FIG. 17A is a plan view of the x-y plane of the multi-layer slab after deep etching through the intervening oxide and nitride layers to a bottom oxide layer 280-1.

FIG. 17B is a cross-sectional view of the z-y plane of the multi-layer slab along the section B-B shown in FIG. 17A. An anisotropic deep etches through the opening of the word line mask 414 cuts the trenches 400 from the top oxide layer 280-n all the way to reach a bottom oxide layer 280-1.

Partitioning the Column to Define the Bit Lines in Each Row and Forming an Array of Shafts FIG. 18A is a plan view of the x-y plane of the multi-layer slab after filling the trenches 400 with nitride.

FIG. 18B is a cross-sectional view of the z-y plane of the multi-layer slab along the section B-B shown in FIG. 18A. The word line mask 414 is first removed before filling the trenches with nitride 282-f.

FIG. 19A is a plan view of the x-y plane of the multi-layer slab after masking with a bit line mask.

FIG. 19B is a cross-sectional view of the z-y plane of the multi-layer slab along the section B-B shown in FIG. 19A. The bit line mask 430 has stripes alone the y-direction. The portions of the trenches 400 exposed by the bit line mask 430 are where the memory cells and the vertical bit lines will be formed.

FIG. 20A is a plan view of the x-y plane of the multi-layer slab after a deep nitride etch through the opening of the bit line mask.

FIG. 20B is a cross-sectional view of the z-y plane of the multi-layer slab shown in FIG. 20A. An anisotropic nitride etch through the bit line mask 430 bores down on the exposed nitride in the trenches 400. A 2D array of rectangular shafts 432 is created in the x-y plane. Each shaft 432 extends through the top layer of oxide 280-n to the bottom layer of oxide 280-1 in the multi-layer slab.

FIG. 21A is a plan view of the x-y plane of the multi-layer slab after removal of the bit line mask.

FIG. 21B is a cross-sectional view of the z-y plane of the multi-layer slab along the section B-B shown in FIG. 21A. After the boring of the 2D array of shafts 432 (see FIG. 20A), the bit line mask 430 is removed. It will be seen that the 2D array of shafts 432 is a rectangular array in the x-y plane except for missing shafts at the location of the buttresses 412

Figure 21C:
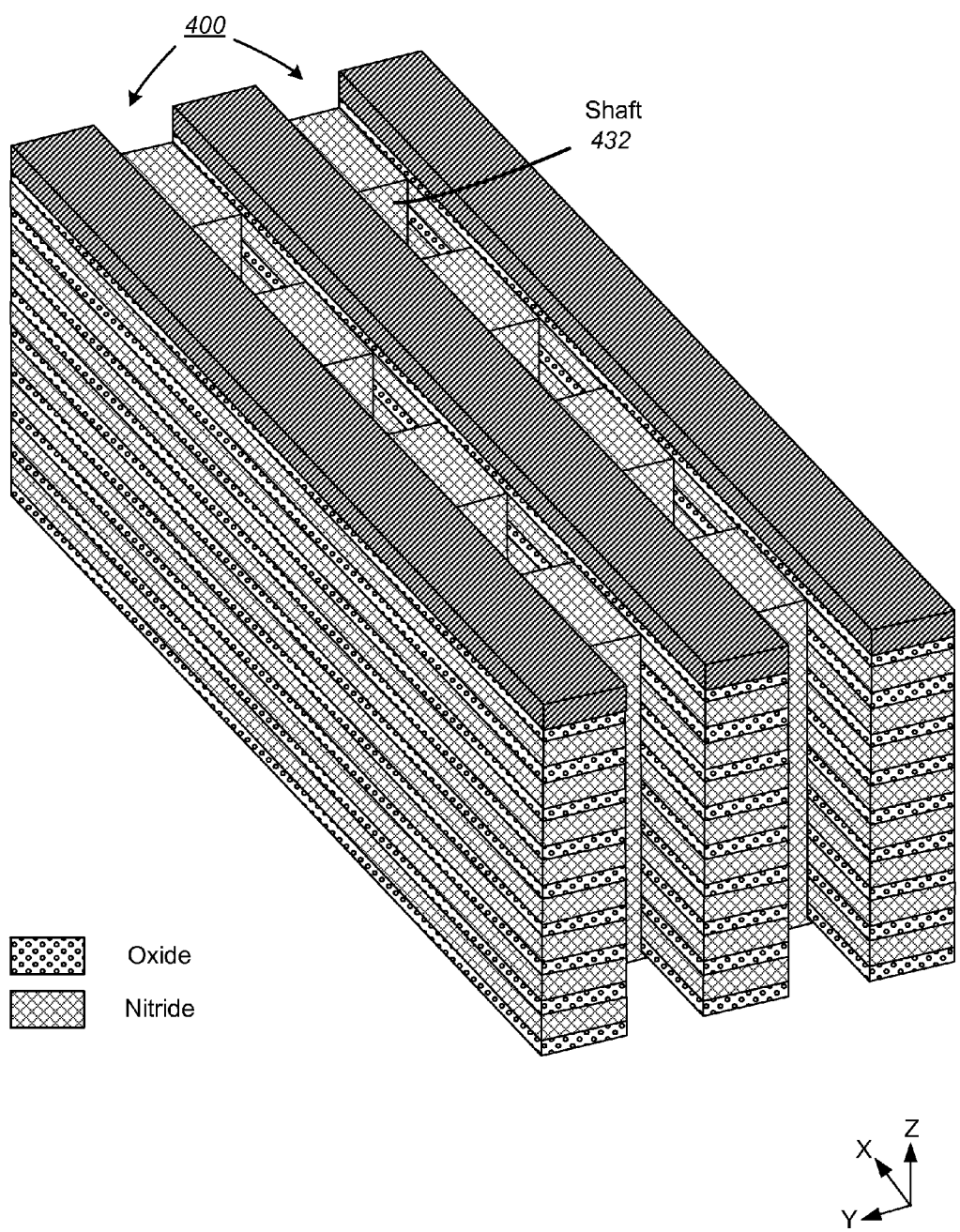
FIG. 21C is a perspective view of a portion of the multi-layer slab shown in FIGS. 21A and 21B.

FIG. 21C is a perspective view of a portion of the multi-layer slab shown in FIGS. 21A and 21B.

Separate Odd and Even Shaft Operations

The multi-layer slab has been partitioned by the word line mask 412 (see FIG. 15A) and the bit line mask (see FIG. 19A) to form a 2D array of shafts 432. Each shaft 432 provides access for formation of a memory cell in each of the memory layers of the multi-layer slab. The formation of each memory cell includes first forming a portion of a word line with a socket structure, followed by a floating gate and bit line.

The socket structure of the portion of word line is predicated on the formation of a grotto, whose concave shape provides the socket structure. The grotto is formed by isotropically recessing each nitride layer through each shaft 432. The etching recesses each nitride layer relative to the original shaft 432 so that there is an expansion of the diameter of the shaft at each nitride layer. Essentially, each nitride layer can be regarded as comprising a 2D array of nitride tile, each nitride tile corresponding to a rectangular cell portion. Each nitride tile has at its center a shaft, so the nitride tile has a rectangular hole at its center. The isotropic etching expands the rectangular hole in all directions into a larger one. The etching is allowed to proceed until the perimeter of the larger rectangular hole punches through to an adjacent nitride tiles along the x- and y-directions. In this way, a continuous word line can be formed across the memory cells along the x-direction. At the same time, two adjacent word lines will coalesce together back-to-back.

However, if the etching of the nitride tiles are performed on all shafts at the same time, the punch through to an adjacent nitride tile along the x-direction would no longer retain any isolation between adjacent memory cells when forming the floating gates and bit lines. Also the wholesale removal of most of the nitride layer could lead to the multi-layer slab imploding and collapsing onto itself. To avoid these problems, the odd and even shafts 432 are operated on at different times. For example, the odd shafts are operated to form the memory cells while the even shafts are covered up. Then the processes are repeated with the even shafts operated to form the rest of the memory cells while the odd shafts are covered up.

Odd-Shaft Operations

As outlined in FIG. 13, STEP 330, one of the subarrays of shafts, such as the subarray of odd shafts is selected while the even shafts are covered out. One way of implementing the independent selection of odd and even shafts is to first fill all shafts with polysilicon and then with the aid of masks, selectively restores either the odd or even shafts.

As explained above, the 2D array of shafts 432 comprises of a 2D array of odd shafts and a 2D array of even shafts. The odd shafts and the even shafts are to be operated on at different times. This is accomplished by masking the even shafts while the odd shafts are being operated on and vice versa. To form the even mask on top of the multi-layer slab, all the shafts are first filled with a sacrificial material to provide a uniform surface for depositing the even mask. The even mask has openings that expose the odd shafts previously filled with the sacrificial material. The sacrificial material is then removed from the odd shafts to allow access through the odd shafts to all designated memory layers in the multi-layer slab.

FIG. 22A is a plan view of the x-y plane of the multi-layer slab after removal of the hard mask and the shafts filled with polysilicon.

FIG. 22B is a cross-sectional view of the z-y plane of the multi-layer slab along the section B-B shown in FIG. 22A. The hard mask 420 is removed. The 2D array of shafts 432 is filled with polysilicon to form a 2D array of polysilicon pillars 434. This is followed by chemical and mechanical planarization. This will leave a smooth surface on the multi-layer slab.

Figure 22C:
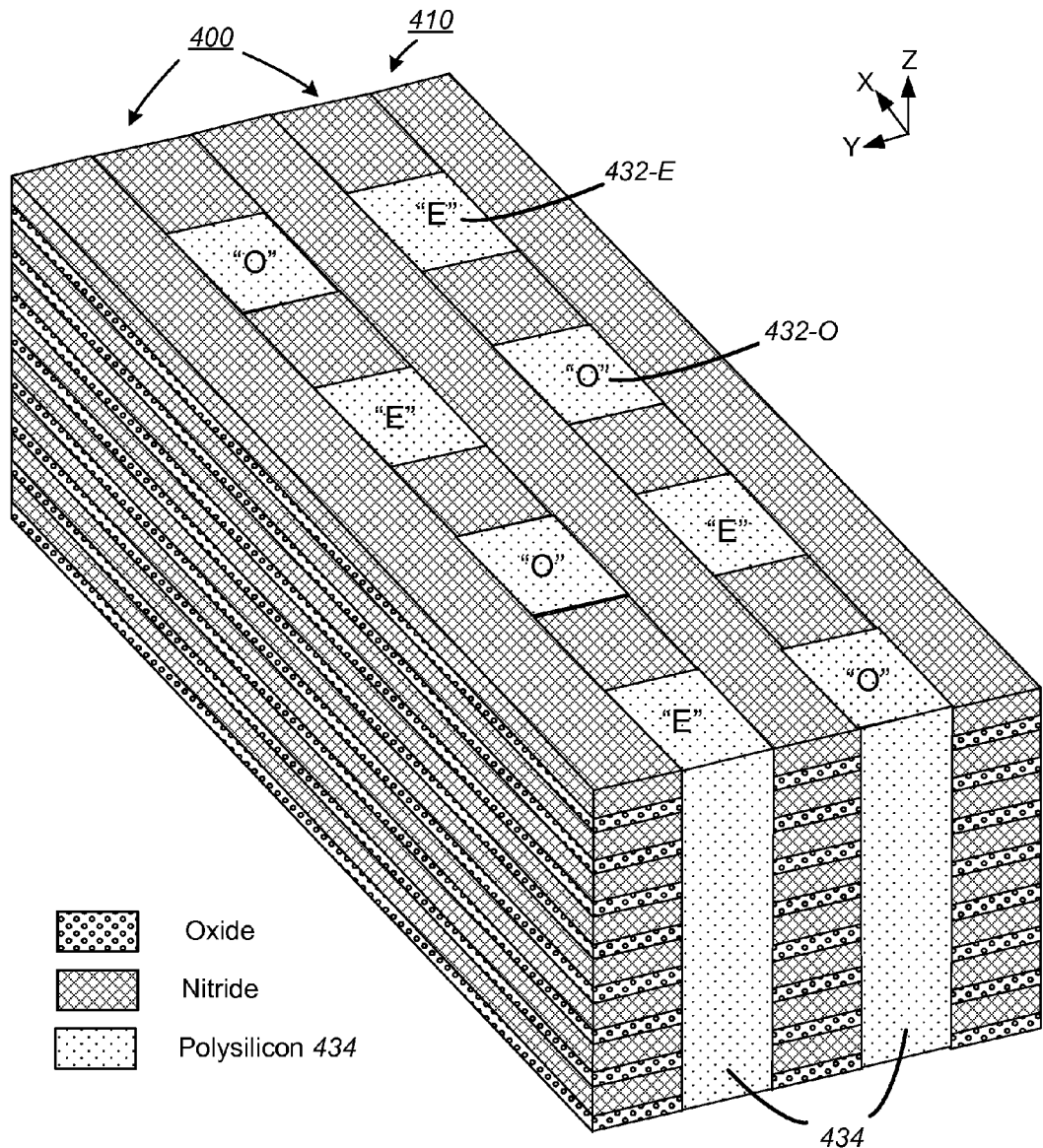
FIG. 22C is a perspective view of the multi-layer slab shown in FIGS. 22A and 22B.

FIG. 22C is a perspective view of the multi-layer slab shown in FIGS. 22A and 22B. The 2D array of shafts is located in the trenches 400 interleaved by the ledges 410 running along the x-direction. The 2D array of shafts is divided into a 2D array of odd shafts 432-O and a 2D array of even shafts 432-E. The odd and even shafts are temporarily filled to form a 2D array of polysilicon pillars 434.

Forming Memory Cells Through the Odd Shafts

As explained above, operations on the odd shafts and on the even shafts will be performed at different times. For example, the memory cells are first formed through the odd shafts 432-O. Then the same operations are repeated through the even shafts 432-E.

For the operations through the odd shafts 432-0, the odd shafts are first emptied of the temporarily filled polysilicon 434.

FIG. 23A is a plan view of the x-y plane of the multi-layer slab after placement of an odd hole mask. The odd hole mask 440-O has openings 442-O that are centered above the odd shafts 432-O. The openings have a dimension smaller than the width of the odd shafts 432-O to allow for tolerance of any slight misalignment of the openings relative to the odd shafts.

FIG. 23B is a cross-sectional view of the z-y plane of the multi-layer slab along the section B-B shown in FIG. 23A.

FIG. 24A is a plan view of the x-y plane of the multi-layer slab after performing a deep anisotropic polysilicon etch through the openings to bore through to the base of the polysilicon pillar filling the odd shafts 432-O.

FIG. 24B is a cross-sectional view of the z-y plane of the multi-layer slab along the section B-B shown in FIG. 24A.

FIG. 25A is a plan view of the x-y plane of the multi-layer slab after performing an isotropic polysilicon etch to clean out the rest of the polysilicon remaining in the odd shafts 432-O.

FIG. 25B is a cross-sectional view of the z-y plane of the multi-layer slab along the section B-B shown in FIG. 25A.

Figure 26:
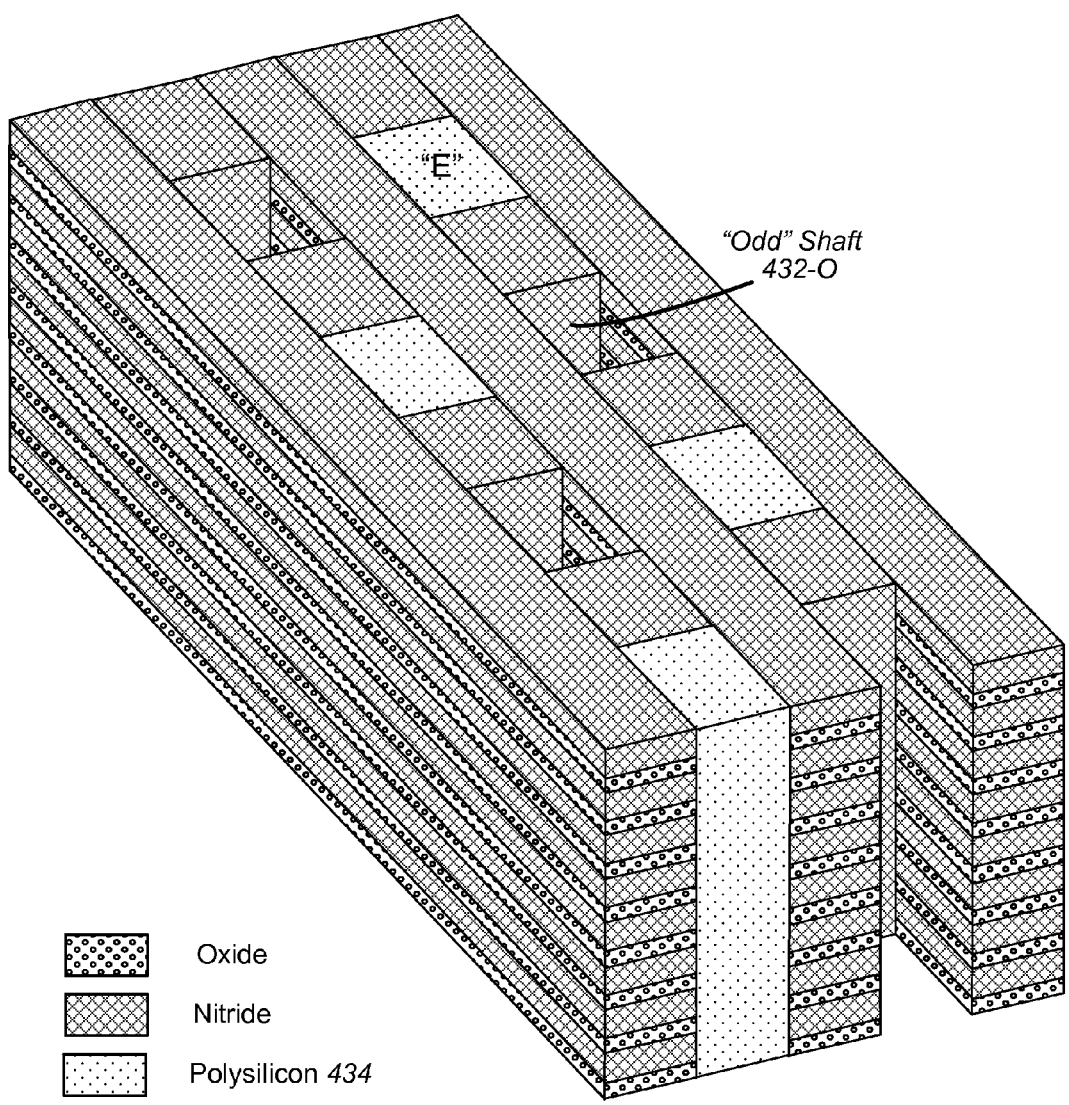
FIG. 26 is a perspective view of the multi-layer slab shown in FIGS. 25A and 25B.

FIG. 26 is a perspective view of the multi-layer slab shown in FIGS. 25A and 25B. Now the odd shafts have been restored to their empty former state as shown in FIG. 21C. The odd hole mask, which has not been removed at this stage, is not shown.

Forming Socketed Word Line and Memory Cells

As outlined in FIG. 13, STEP 340, through the odd shafts, grottoes are etched in each nitride layer to form word line socket components.

Figure 27A:
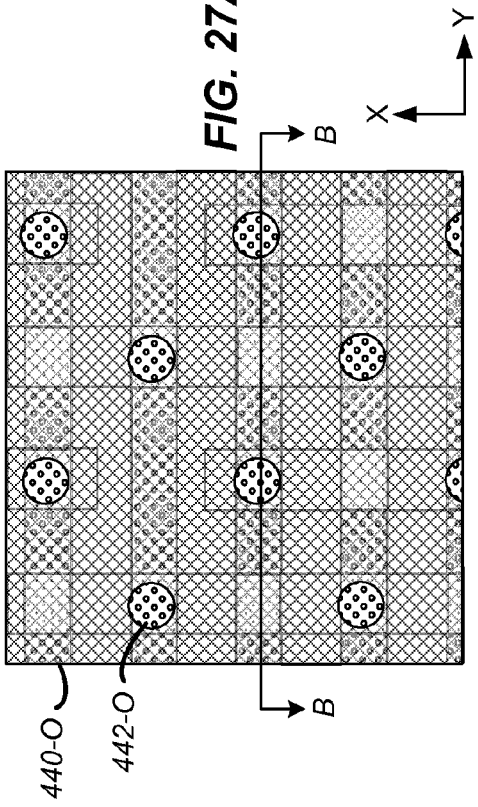
FIG. 27A is a plan view of the x-y plane of the multi-layer slab after performing a nitride isotropic etch to recess the nitride layers from each odd shaft.

FIG. 27A is a plan view of the x-y plane of the multi-layer slab after performing a nitride isotropic etch to recess the nitride layers to form grottoes 284 from each odd shaft 432-O. The isotropic etching of the nitride layers 282 is through the openings 442 of the odd hole mask 440.

Figure 27B:
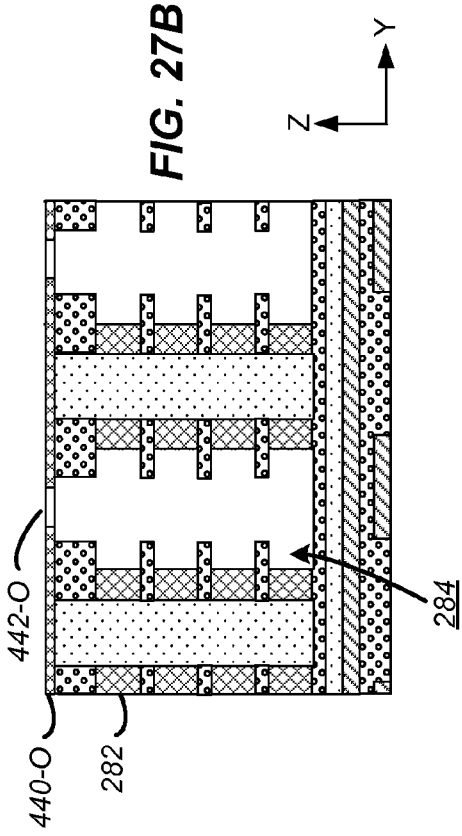
FIG. 27B is a cross-sectional view of the z-y plane of the multi-layer slab along the section B-B shown in FIG. 27A.

FIG. 27B is a cross-sectional view of the z-y plane of the multi-layer slab along the section B-B shown in FIG. 27A. The etching at each nitride layer 282 is calibrated to produce a predetermined recess in the grottoes 284 that defines a depth of each socket component to be formed along a word line. This leaves recessed nitride layers 282 interleaved by protruding oxide layers 280 in each odd shaft 432-O.

Figure 28A:
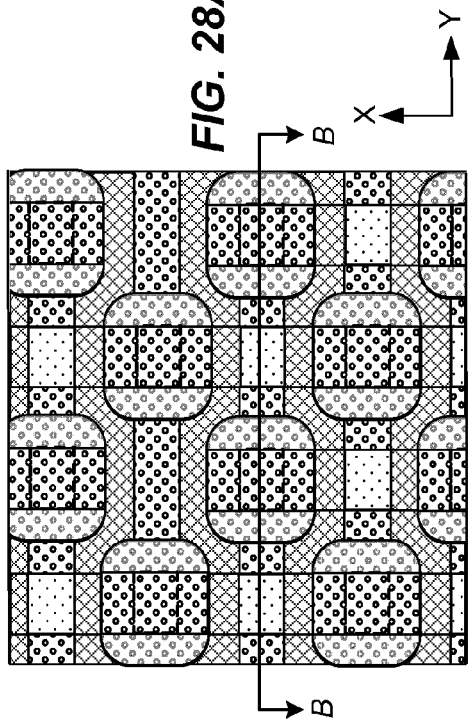
FIG. 28A is a plan view of the x-y plane of the multi-layer slab after removing the odd hole mask.

FIG. 28A is a plan view of the x-y plane of the multi-layer slab after removing the odd hole mask 440-O. It will be seen that the etching has expanded the rectangular hole, which is the cross-section of the odd shaft 432-0, in each nitride layer to a larger rectangular hole with rounded corners at the edge of each nitride tile 433-O in the x- and y-directions.

Figure 28B:
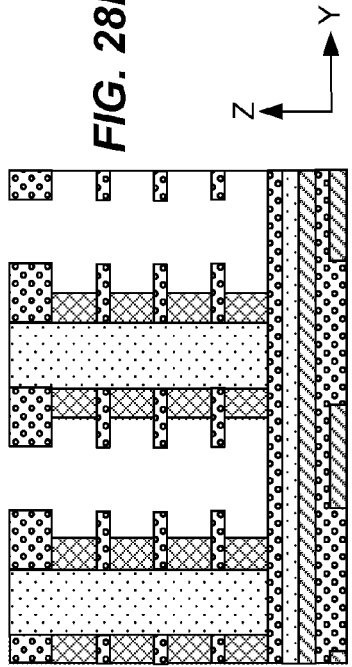
FIG. 28B is a cross-sectional view of the z-y plane of the multi-layer slab along the section B-B shown in FIG. 28A.

FIG. 28B is a cross-sectional view of the z-y plane of the multi-layer slab along the section B-B shown in FIG. 28A.

As outlined in FIG. 13, STEP 342, through the odd shafts, socket components of the word lines are formed in the inside walls of the grottoes.

FIG. 29A is a plan view of the x-y plane of the multi-layer slab after depositing a layer of word line material such as tungsten 222 over the recessed nitride layers 282 and the protruding oxide layers 280.

FIG. 29B is a cross-sectional view of the z-y plane of the multi-layer slab along the section B-B shown in FIG. 29A.

FIG. 29C is a perspective view of a detail of two of the recesses/sockets of the multi-layer slab shown in FIGS. 29A and 29B.

The layer of word line material should only be in the inside walls of the grottoes. Any on the outside must be removed to avoid shorting the word lines between memory layers.

Figure 30C:
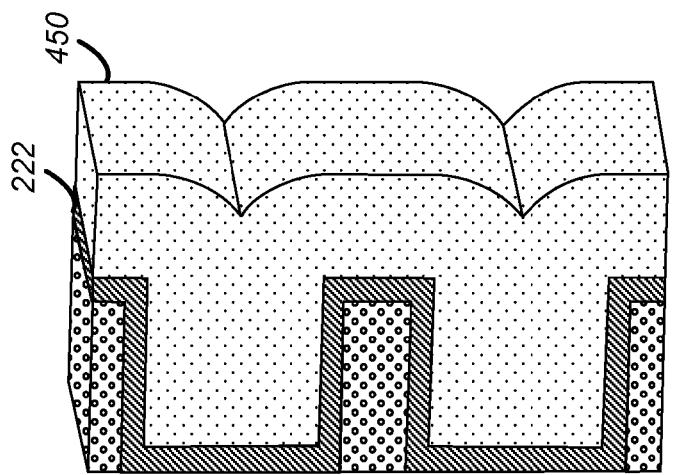
FIG. 30C is a perspective view of a detail of two of the recesses/sockets of the multi-layer slab shown in FIGS. 30A and 30B.
Figure 30A:
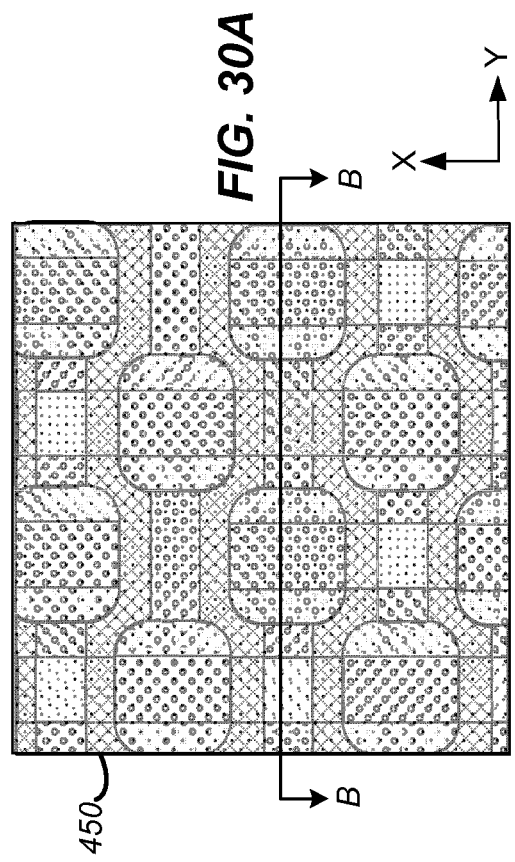
FIG. 30A is a plan view of the x-y plane of the multi-layer slab after depositing a layer of polysilicon over the tungsten layer.

FIG. 30A is a plan view of the x-y plane of the multi-layer slab after depositing a layer of polysilicon over the tungsten layer 222.

Figure 30B:
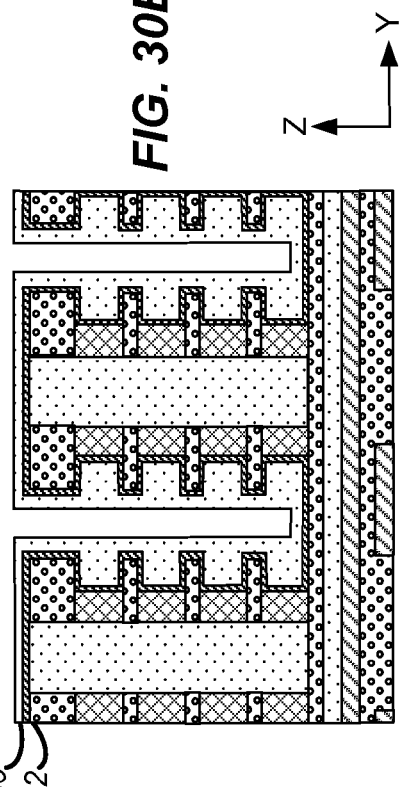
FIG. 30B is a cross-sectional view of the z-y plane of the multi-layer slab along the section B-B shown in FIG. 30A.

FIG. 30B is a cross-sectional view of the z-y plane of the multi-layer slab along the section B-B shown in FIG. 30A. The polysilicon fills the recess at each nitride layers 282.

FIG. 30C is a perspective view of a detail of two of the recesses/sockets of the multi-layer slab shown in FIGS. 30A and 30B.

FIG. 31A is a plan view of the x-y plane of the multi-layer slab after an anisotropic etch to recess the polysilicon layer to expose the underlying tungsten layer on the protruding oxide layers 280.

FIG. 31B is a cross-sectional view of the z-y plane of the multi-layer slab along the section B-B shown in FIG. 31A. The polysilicon fills the recess at each nitride layer 282.

FIG. 31C is a perspective view of a detail of two of the recesses/sockets of the multi-layer slab shown in FIGS. 31A and 31B.

FIG. 32A is a plan view of the x-y plane of the multi-layer slab after etching to recess the exposed tungsten layer 222 on the protruding oxide layers 280.

FIG. 32B is a cross-sectional view of the z-y plane of the multi-layer slab along the section B-B shown in FIG. 32A. It can be seen that the tungsten recess is such as to disconnect the tungsten layers 222 (word lines) between the difference nitride layers 282.

FIG. 32C is a perspective view of a detail of two of the recesses/sockets of the multi-layer slab shown in FIGS. 32A and 32B.

FIG. 33A is a plan view of the x-y plane of the multi-layer slab after an isotropic polysilicon etch to remove all remaining polysilicon 450 (see FIG. 32B) in each odd shaft 432-O.

FIG. 33B is a cross-sectional view of the z-y plane of the multi-layer slab along the section B-B shown in FIG. 33A. At each nitride layer 282, a socket component with a tungsten shell 222 is formed.

FIG. 33C is a perspective view of a detail of two of the recesses/sockets of the multi-layer slab shown in FIGS. 33A and 33B.

FIG. 34A is a plan view of the x-y plane of the multi-layer slab after an isotropic oxide etch to remove a bottom layer of oxide to expose the underlying polysilicon layer 280-1 at the bottom of each odd shaft 432-O. This is followed by planarization of the top oxide layer 280-n.

FIG. 34B is a cross-sectional view of the z-y plane of the multi-layer slab along the section B-B shown in FIG. 34A.

FIG. 34C is a perspective view of a detail of two of the recesses/sockets of the multi-layer slab shown in FIGS. 34A and 34B.

As outlined in FIG. 13, STEP 344, through the odd shafts, one or more insulating layer is used to form a gate dielectric.

Figure 35F:
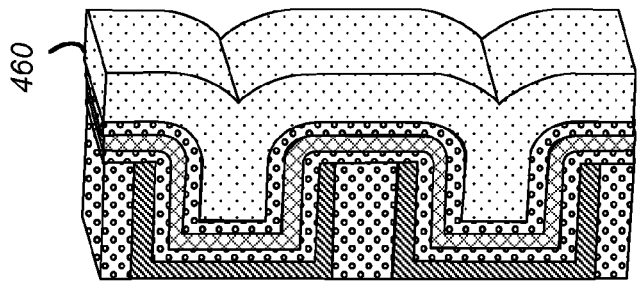
FIG. 35F is a perspective view of a detail of two of the recesses/sockets of the multi-layer slab shown in FIGS. 35A and 35B, after the layer of polysilicon has been deposited on top of the IDP to fill the remaining space in the grottoes.
Figure 35E:
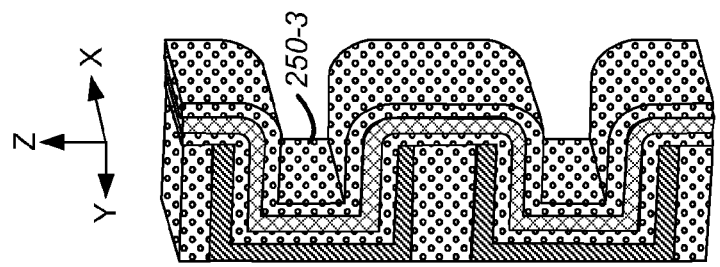
FIG. 35E is a perspective view of a detail of two of the recesses/sockets of the multi-layer slab shown in FIGS. 35A and 35B, after the next layer of the IDP, namely a layer of oxide.
Figure 35D:
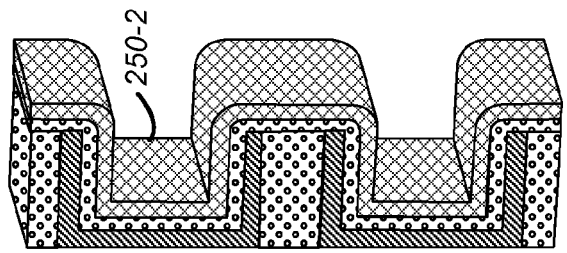
FIG. 35D is a perspective view of a detail of two of the recesses/sockets of the multi-layer slab shown in FIGS. 35A and 35B, after the next layer of the IDP, namely a layer of nitride.
Figure 35A:
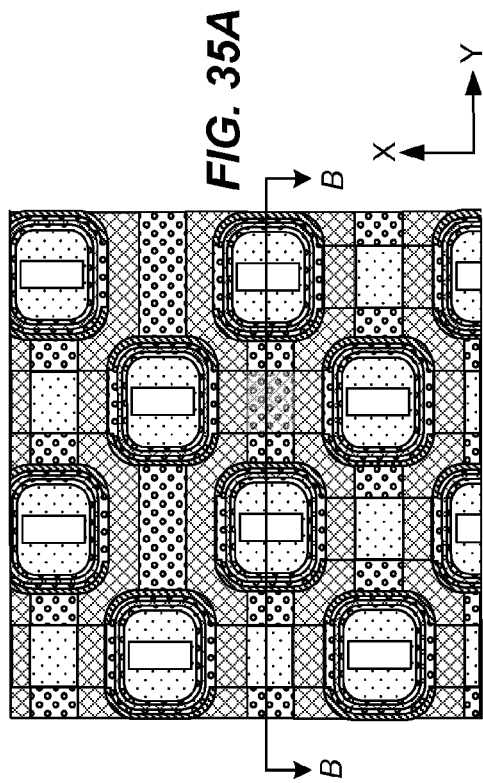
FIG. 35A is a plan view of the x-y plane of the multi-layer slab after depositing successive layers constituting the inter-poly dielectric (IDP) layers in the inner surface of the socket component.

FIG. 35A is a plan view of the x-y plane of the multi-layer slab after depositing successive layers constituting the inter-poly dielectric (IDP) layers 250 in the inner surface of the socket component. The IDP layers 250 are constituted from a layer of oxide 250-1, a layer of nitride 250-2 and another layer of oxide 250-3.

Figure 35B:
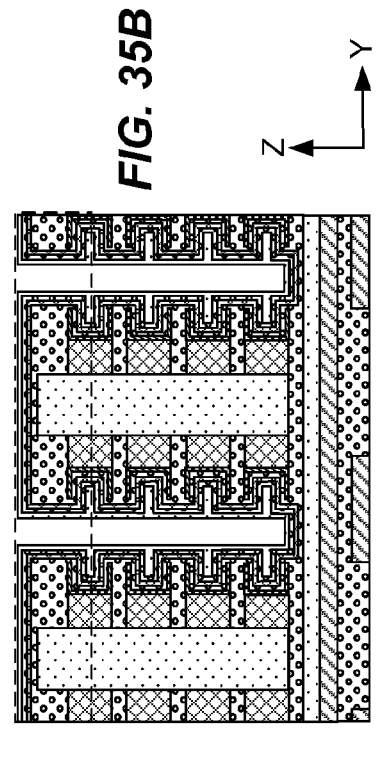
FIG. 35B is a cross-sectional view of the z-y plane of the multi-layer slab along the section B-B shown in FIG. 35A.

FIG. 35B is a cross-sectional view of the z-y plane of the multi-layer slab along the section B-B shown in FIG. 35A.

FIG. 35C is a perspective view of a detail of two of the recesses/sockets of the multi-layer slab shown in FIGS. 35A and 35B, after depositing the first of the IDP layers, namely a layer of oxide 250-1.

FIG. 35D is a perspective view of a detail of two of the recesses/sockets of the multi-layer slab shown in FIGS. 35A and 35B, after the next layer of the IDP, namely a layer of nitride 250-2.

FIG. 35E is a perspective view of a detail of two of the recesses/sockets of the multi-layer slab shown in FIGS. 35A and 35B, after the next layer of the IDP, namely a layer of oxide 250-3.

As outlined in FIG. 13, STEP 346, through the odd shafts, a polysilicon fill in the grottoes is used to form a floating gate for each memory cell.

FIG. 35F is a perspective view of a detail of two of the recesses/sockets of the multi-layer slab shown in FIGS. 35A and 35B, after the layer of polysilicon 460 has been deposited on top of the IDP to fill the remaining space in the grottoes. The polysilicon 460 fill will form the floating gate for each member cell.

FIG. 36A is a plan view of the x-y plane of the multi-layer slab after etching excessive portion of the polysilicon layer 460 to expose the layer of oxide 250-3 of the IDP so that the polysilicon 460 is individually recessed into each socket component to form a floating gate.

FIG. 36B is a cross-sectional view of the z-y plane of the multi-layer slab along the section B-B shown in FIG. 36A.

FIG. 36C is a perspective view of a detail of two of the recesses/sockets of the multi-layer slab shown in FIGS. 36A and 36B, after the layer of polysilicon 460 has been recessed.

As outlined in FIG. 13, STEP 348, through the odd shafts, other structures of the NAND string and a plurality of vertical bit lines are formed.

FIG. 37A is a plan view of the x-y plane of the multi-layer slab after an anisotropic etch of the IDP layer 250 (250-1, 250-2, 250-3) and the bottom oxide layer 280-1 to expose the underlying polysilicon layer 232' at the bottom of each odd shaft 432-O. The polysilicon layer 232" will eventually be used to form portions of source lines 232 for the NAND chains 50 (see FIG. 7).

FIG. 37B is a cross-sectional view of the z-y plane of the multi-layer slab along the section B-B shown in FIG. 37A.

FIG. 38A is a plan view of the x-y plane of the multi-layer slab after depositing a layer of tunnel oxide material 260.

FIG. 38B is a cross-sectional view of the z-y plane of the multi-layer slab along the section B-B shown in FIG. 38A.

Figure 38C:
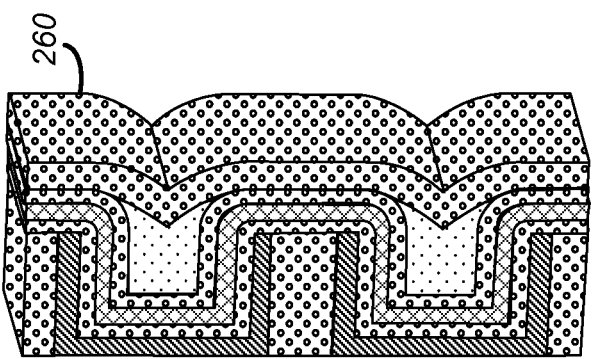
FIG. 38C is a perspective view of a detail of two of the recesses/sockets of the multi-layer slab shown in FIGS. 38A and 38B, after depositing the layer of tunnel oxide material.

FIG. 38C is a perspective view of a detail of two of the recesses/sockets of the multi-layer slab shown in FIGS. 38A and 38B, after depositing the layer of tunnel oxide material 260.

Forming Vertical Bit Lines

Figure 39A:
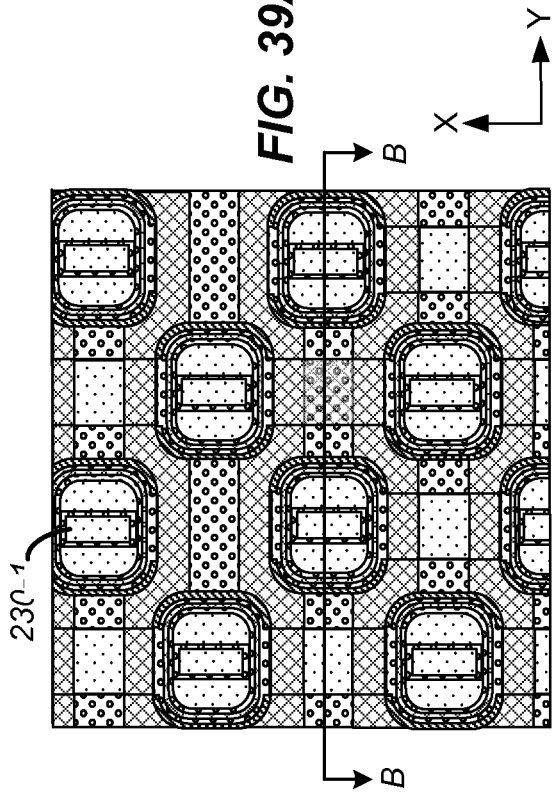
FIG. 39A is a plan view of the x-y plane of the multi-layer slab after depositing a liner layer of P-polysilicon.

FIG. 39A is a plan view of the x-y plane of the multi-layer slab after depositing a liner layer of P-polysilicon 230-1. The liner layer of P-polysilicon will serve as a protective layer for the anisotropic etch in the next step.

Figure 39B:
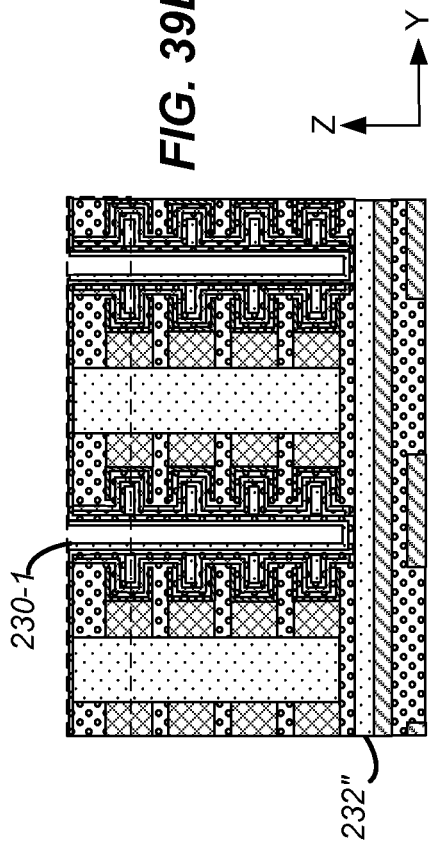
FIG. 39B is a cross-sectional view of the z-y plane of the multi-layer slab along the section B-B shown in FIG. 39A.

FIG. 39B is a cross-sectional view of the z-y plane of the multi-layer slab along the section B-B shown in FIG. 39A.

Figure 40A:
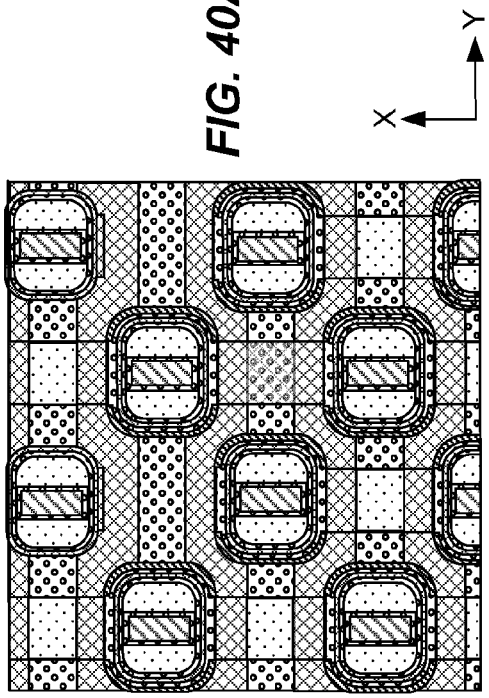
FIG. 40A is a plan view of the x-y plane of the multi-layer slab after an anisotropic etch through the opening to expose the underlying metal layer.

FIG. 40A is a plan view of the x-y plane of the multi-layer slab after an anisotropic etch through the opening of the P-polysilicon layer 230-1, the tunnel oxide layer 260 at the bottom of each odd shaft 432-0, and also etch through the bottom oxide layer 280-1 and the polysilicon layer 232" to expose the underlying metal layer 232'. The polysilicon layer 232" and the metal layer 232' will eventually be used to form source lines 232 for the NAND chains 50 (see FIG. 7).

Figure 40B:
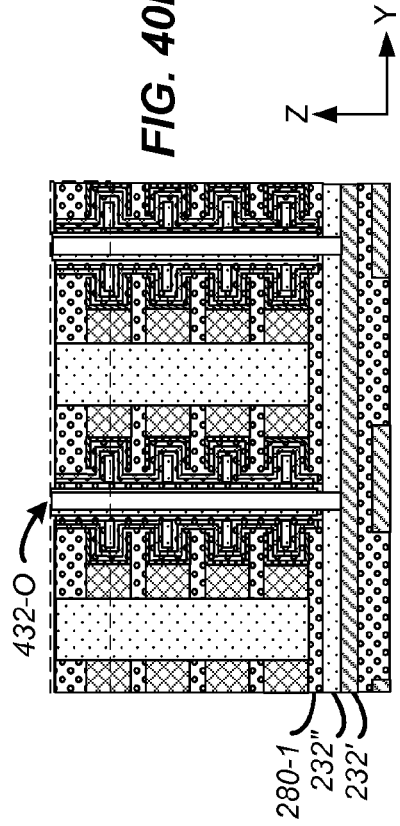
FIG. 40B is a cross-sectional view of the z-y plane of the multi-layer slab along the section B-B shown in FIG. 40A.

FIG. 40B is a cross-sectional view of the z-y plane of the multi-layer slab along the section B-B shown in FIG. 40A.

Figure 41A:
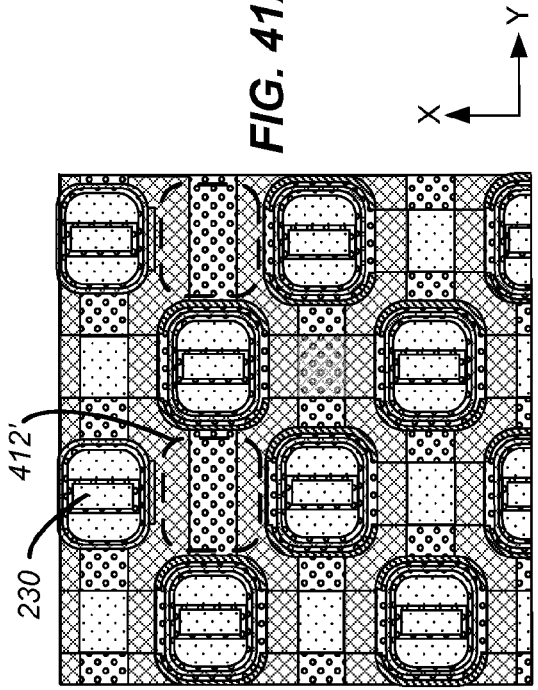
FIG. 41A is a plan view of the x-y plane of the multi-layer slab after depositing a layer of P- polysilicon to fill the remaining space in each odd shaft.

FIG. 41A is a plan view of the x-y plane of the multi-layer slab after depositing a layer of P-polysilicon 230 to fill the remaining space in each odd shaft 432-O. The deposition also leaves a top layer of P-polysilicon 230'.

Figure 41B:
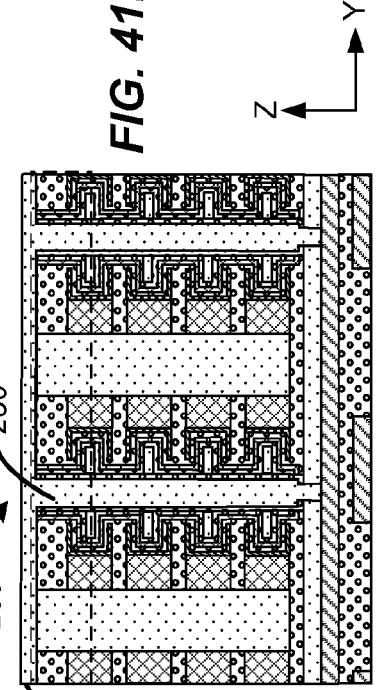
FIG. 41B is a cross-sectional view of the z-y plane of the multi-layer slab along the section B-B shown in FIG. 41A.

FIG. 41B is a cross-sectional view of the z-y plane of the multi-layer slab along the section B-B shown in FIG. 41A.

Even-Shaft Operations

As outlined in FIG. 13, STEP 350, the operations for forming the socketed word lines and memory cells are repeated through the even shafts.

FIG. 42A is a plan view of the x-y plane of the multi-layer slab after placement of an even hole mask. The even hole mask 440-E has openings 442-E that are centered above the even shafts 432-E. The openings have a dimension smaller than the width of the even shafts 432-E to allow for tolerance of any slight misalignment of the openings relative to the even shafts.

FIG. 42B is a cross-sectional view of the z-y plane of the multi-layer slab along the section B-B shown in FIG. 42A.

The masking operations illustrated in FIG. 42A and FIG. 42B are similar to those associated with FIG. 23A and FIG. 23.B, except the even shafts 432-E are being exposed instead of the odd shafts. Thereafter, forming the even memory cells through the even shafts will be similar to the processes described with respect to the odd memory cells in FIG. 24A to FIG. 41B. However, when etching the nitride layers to form the even grottoes, the wall of each even grotto will intrude until it is overlapping with those odd grottoes formed through the earlier odd vertical shafts to form part of a continuous word line with socket components in a row.

Example Dimensions

Figures 43A, 43B:
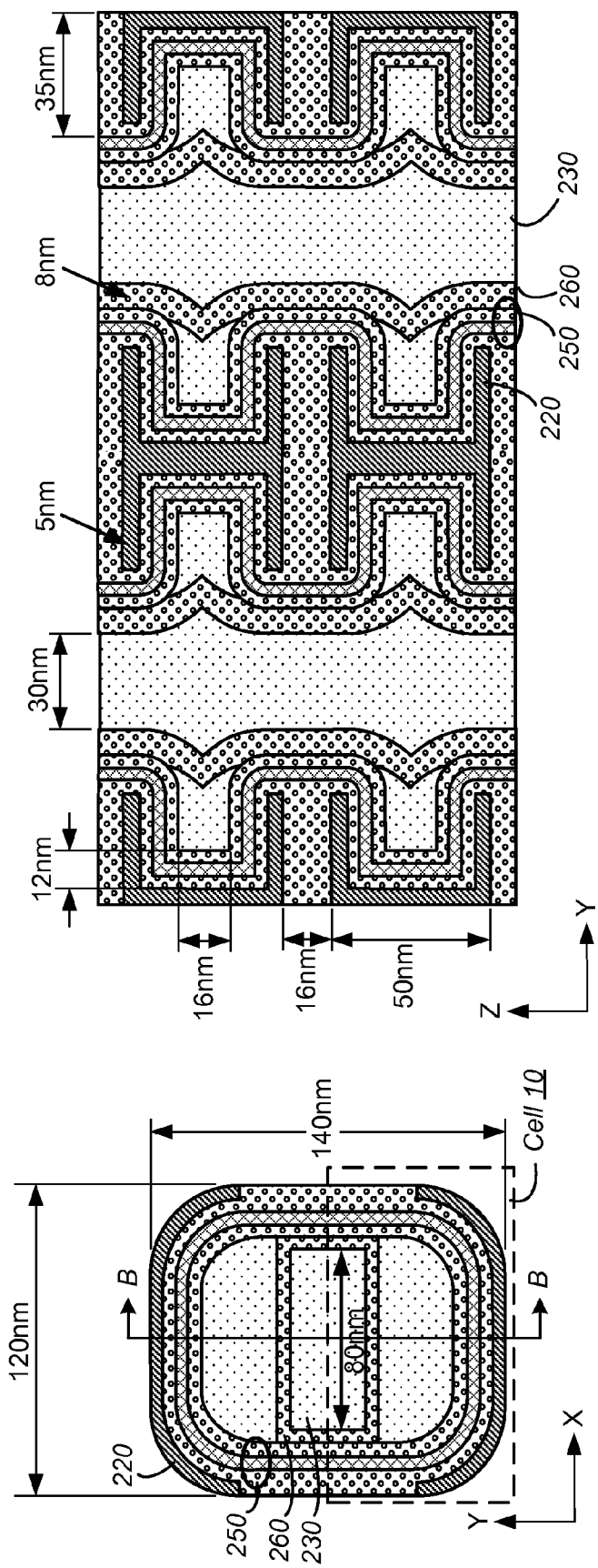
FIG. 43A illustrates example dimensions of the floating gate memory cell with a socketed word line.
FIG. 43B is a cross-sectional view of the z-y plane showing a portion of the 3D NANA memory and example dimensions.

FIG. 43A illustrates example dimensions of the floating gate memory cell with a socketed word line. FIG. 43A is the same drawing as FIG. 11, which is a plan view in the x-y plane of two memory cells sharing a local bit line, but with additional illustration of example dimensions. Each cell 10 has an area of 120×70 nm². The interpoly dielectric (IPD) layer 250 has a thickness of 12 nm. The tunnel oxide 260 has a thickness of 8 nm and a surface area of 80×16=1280 nm². The local bit line pillar 230 has a sectional area of 80×30 nm. The word line or tungsten layer 220 has a thickness of 5 nm. The separation between word lines on adjacent memory layers is 16 nm.

FIG. 43B is a cross-sectional view of the z-y plane showing a portion of the 3D NANA memory and example dimensions. While two adjacent back-to-back word lines 220 are shown to be overlapping, they need not be for all memory cells along a row. The two adjacent word lines can be strapped together at their ends.

Word Line to Driver Connection

FIG. 44A is a perspective view of a portion of the 3D NAND memory, schematically showing access to different word lines at different memory layers. As described earlier in connection with FIG. 14, buttresses 412 at predefined locations in the multi-layer slab act as bridges between adjacent ledges 410 to provide structural support for preventing the sidewalls of the ledges 410 from collapsing. While each buttress will take up a buttress space 412' in place of a vertical bit line 230, the buttress space 412' occupied by each buttress 412 will later be synergistically employed for forming a word line VIA 520 for connection to a word line 220 in a memory layer. The word line VIA 520 rises from a contact pad in the substrate (not shown) to a word line 220 at a given memory layer. The word line VIA 520 makes contact with the word line 220 with a lateral contact 522.

FIG. 44B is a cross-sectional view of the z-y plane of the 3D NAND memory shown in FIG. 44A. The bit lines 230 shown in FIG. 44A are not shown in FIG. 44B for simplicity. It can be seen that at each buttress space 412', a word line VIA 520 is connected at one end to a word line 220 at one of the memory layers and the other end to a corresponding contact pad 524 on the substrate below. The contact pad 522 is connected to a word line driver in an X-decoder 530 on the substrate below. In general, the plurality of word lines in each memory layer is spaced apart in the column (y-) direction. Thus, there will be a corresponding column of contact pads for each memory layer.

Figure 45:
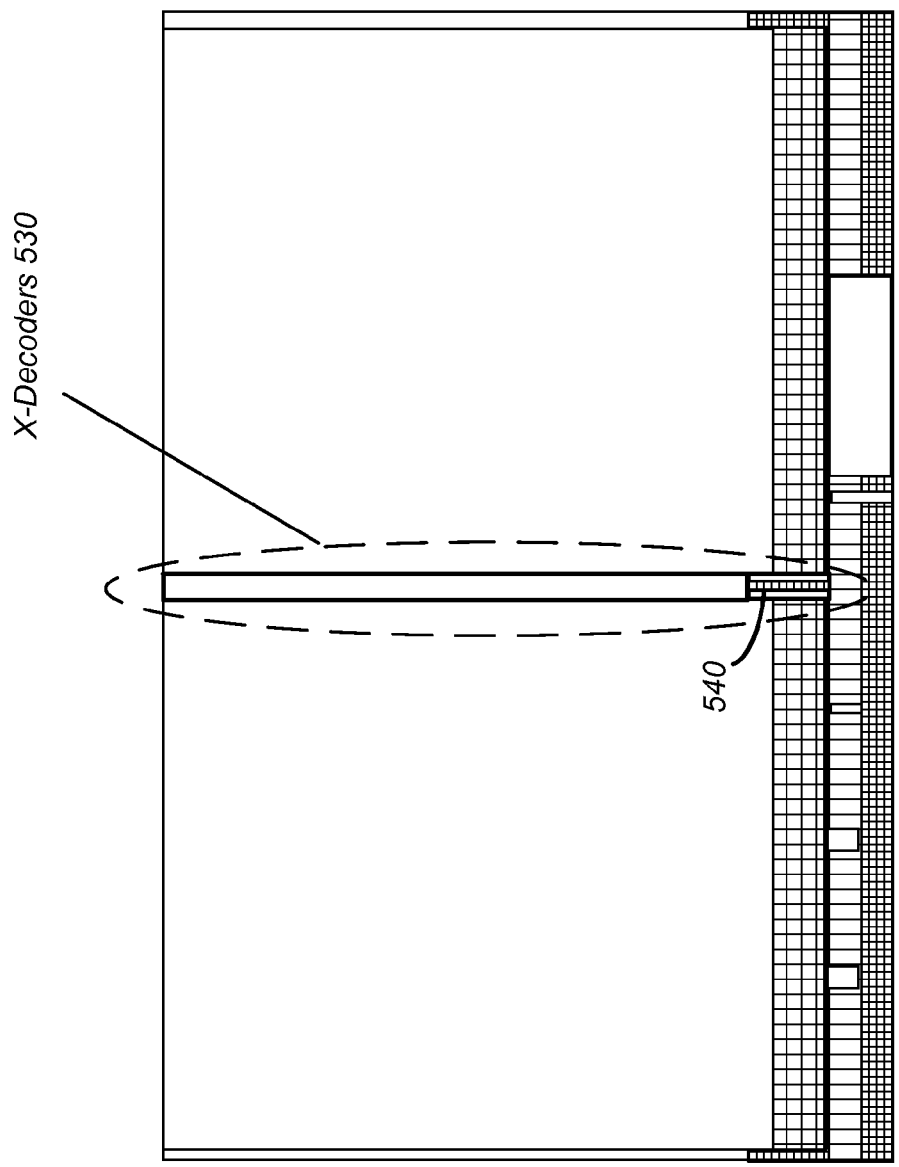
FIG. 45 is a plan view of the x-y plane of a 3D NAND memory die, showing a layout of the X-decoders for the word lines.

FIG. 45 is a plan view of the x-y plane of a 3D NAND memory die, showing a layout of the X-decoders for the word lines. For each memory layer, the column word lines running along the x-direction and spaced apart in the y-direction will be decoded by an x-decoder 530. Each x-decoder 530 comprises a column of word line drivers 540 formed on the substrate along the y-direction. In a 3D memory with n memory layers, there will be n X-decoders 530 or n columns of word line drivers 540.

Process for Forming Word Line Connections to Contact Pads on the Substrate

Figure 46:
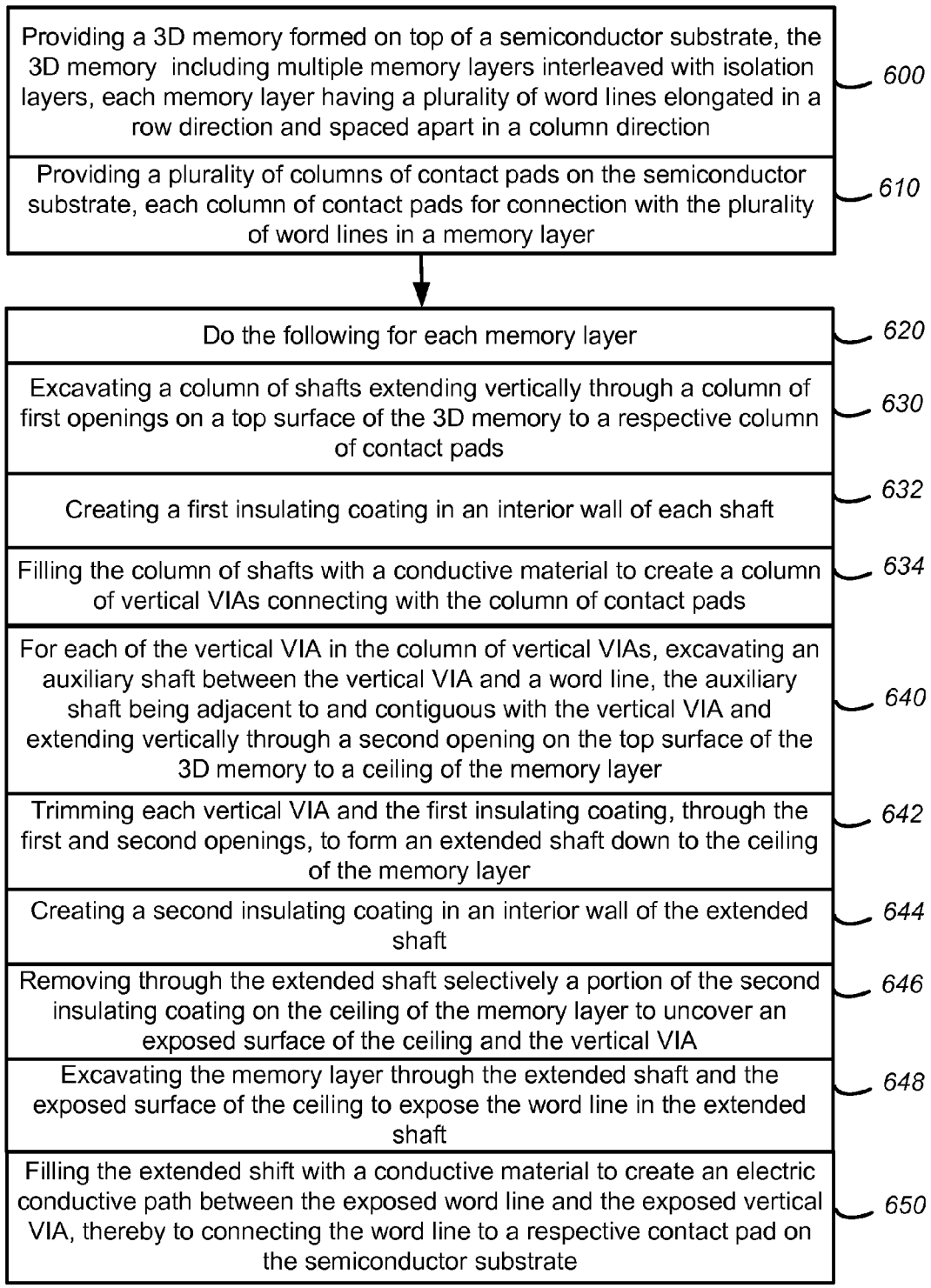
FIG. 46 illustrates a process of forming a connection between a word line at a memory layer to a contact pad in the substrate below through a word line VIA.

FIG. 46 illustrates a process of forming a connection between a word line at a memory layer to a contact pad in the substrate below through a word line VIA.

The buttress space 412' illustrated in FIG. 44A is part of an array of buttress spaces across the x-y plane. These spaces are where a corresponding array of vertical word line VIAs is to be formed. Each word line VIA 520 is connected to a respective word line driver contact pads 524 on the substrate at the bottom of the multi-layer slab. The word line driver contact pads are also connected by metal lines (not shown) to respective word line drivers 540 in the substrate.

Essentially, each memory layer has a column of word lines to be connected to a column of contact pads on the substrate below. A column of shafts from the top of the 3D memory allows vertical world line VIAs to be formed adjacent the plurality of word lines and connected to the column of contact pads. An auxiliary shaft is opened between each vertical word line VIA and its adjacent word line. The auxiliary shaft is extended down from the top of the 3D memory to the memory layer while exposing a portion of the vertical word line VIA. The auxiliary shaft is lined with oxide except at the bottom to insulate any intermediate memory layers during subsequent etching. A portion of a word line is exposed after removing the designated nitride layer. A conductive filling in the auxiliary shaft then provides electrical connection between the exposed portion of word line and the exposed portion of the vertical word line VIA.

STEP 600: providing a 3D memory formed on top of a semiconductor substrate, the 3D memory including multiple memory layers interleaved with isolation layers, each memory layer having a plurality of word lines elongated in a row direction and spaced apart in a column direction.

STEP 610: providing a plurality of columns of contact pads on the semiconductor substrate, each column of contact pads for connection with the plurality of word lines in a memory layer; and STEP 620: do the following for each memory layer:

STEP 630: excavating a column of shafts extending vertically through a column of first openings on a top surface of the 3D memory to a respective column of contact pads.

STEP 632: creating a first insulating coating in an interior wall of each shaft.

STEP 634: filling the column of shafts with a conductive material to create a column of vertical word line VIAs connecting with the column of contact pads.

STEP 640: for each of the vertical word line VIA in the column of vertical word line VIAs, excavating an auxiliary shaft between the vertical word line VIA and a word line, the auxiliary shaft being adjacent to and contiguous with the vertical word line VIA and extending vertically through a second opening on the top surface of the 3D memory to a ceiling of the memory layer.

STEP 642: trimming each vertical VIA and the first insulating coating, through the first and second openings, to form an extended shaft down to the ceiling of the memory layer.

STEP 644: creating a second insulating coating in an interior wall of the extended shaft.

STEP 646: removing through the extended shaft selectively a portion of the second insulating coating on the ceiling of the memory layer to uncover an exposed surface of the ceiling and the vertical word line VIA.

STEP 648: excavating the memory layer through the extended shaft and the exposed surface of the ceiling to expose the word line in the extended shaft.

STEP 650: filling the extended shift with a conductive material to create an electric conductive path between the exposed word line and the exposed vertical word line VIA, thereby to connecting the word line to a respective contact pad on the semiconductor substrate.

Process for Forming Vertical Word Line VIAs

As outlined in FIG. 46, STEP 630, a column of shafts is created for each memory layer.

FIG. 47A is a plan view of the x-y plane of the multi-layer slab after placement of a VIA contact mask for forming a vertical word line VIA. The buttress space 412' is the space previously occupied by the buttress 412 (see FIG. 14). The VIA contact mask 550 has an opening 552 at each buttress space 412' for creating a shaft.

FIG. 47B is a cross-sectional view of the z-y plane of the multi-layer slab along the section B-B shown in FIG. 47A.

FIG. 48A is a plan view of the x-y plane of the multi-layer slab after a shaft has been excavated from each opening of the VIA contact mask. A deep layer anisotropic etch through the openings 552 creates a shaft 560 that transverses all the memory layers to reach a word line driver contact pad 524 near the substrate.

FIG. 48B is a cross-sectional view of the z-y plane of the multi-layer slab along the section B-B shown in FIG. 48A.

As outlined in FIG. 46, STEP 632, a first insulating coating is deposited to line the interior of each shaft. This is followed by STEP 634, in which the vertical word line VIAs are formed in the shafts.

Figure 49A:
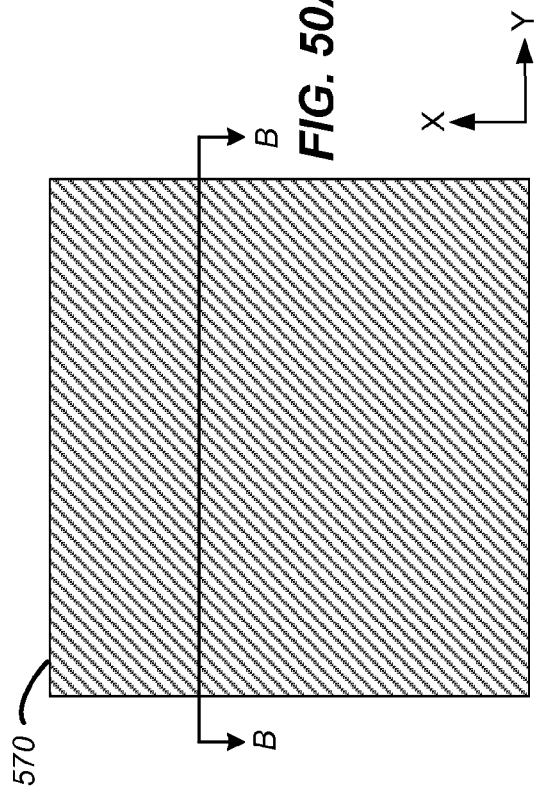
FIG. 49A is a plan view of the x-y plane of the multi-layer slab after lining the shaft with a layer of oxide before filling with word line VIA material, and then finishing with planarization.

FIG. 49A is a plan view of the x-y plane of the multi-layer slab after lining the shaft with a layer of oxide before filling with word line VIA material, and then finishing with planarization. An insulating layer of oxide 280-z is deposited, which lines the shaft 560. The remaining space in the shaft 560 is then filled with the word line VIA material 520. The layers of word line VIA material 520 and oxide 280-z on top of the multi-layer slab are then removed and planarized, leaving at the top the top layer of P-polysilicon 230'.

Figure 49B:
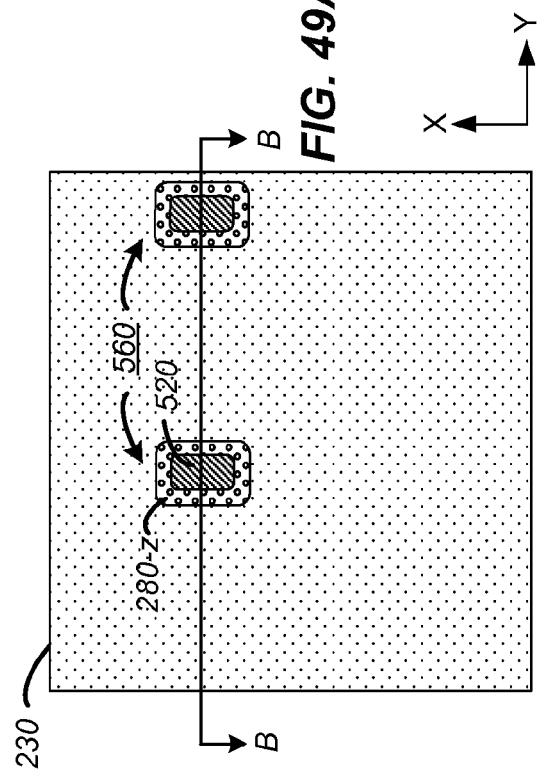
FIG. 49B is a cross-sectional view of the z-y plane of the multi-layer slab along the section B-B shown in FIG. 49A.

FIG. 49B is a cross-sectional view of the z-y plane of the multi-layer slab along the section B-B shown in FIG. 49A.

Thus, a vertical word line 560 is formed in each shaft 560 that has been excavated from within each buttress space 412' through the opening 552. The shaft 560 is isolated with oxide lining and then filled with a conductive material to form the word line VIA 520 that is connected to a contact pad 524 on the substrate.

Connecting a Given Word Line at a Given Memory Layer to a Vertical Word Line VIA As outlined in FIG. 46, STEP 640, a column of auxiliary shafts is created adjacent the column of vertical word line VIAs for each memory layer.

In general, for n memory layers, there will be n columns of vertical word line VIAs connecting respectively to n columns of contact pads. Specifically, an nth column of vertical word line VIAs will be for connection to an nth memory layer, an (n−1)th column of vertical word line VIAs will be for connection to an (n−1)th memory layer, . . . , and a $1^{st}$ column of vertical word line VIAs will be for connection to a $1^{st}$ memory layer. This entails a terraced structure for the connections.

Forming an Array of Terraced Auxiliary Shafts

The connection process at each memory layer is expediently implemented by a terrace operation in which a resist layer is recessed horizontally along the x-direction, progressively exposing columns of buttress spaces containing the vertical word line VIAs 520. It can be visualized as a curtain being withdrawn progressively along the x-direction, first exposing the nth column of buttress spaces to allow etching by one memory layer deep of an auxiliary shaft adjacent to each of the nth column of vertical word line VIAs. This is followed by the curtain being withdrawn to expose also the (n−1)th column of buttress spaces. The etching by another one memory layer deep that follows will etch the auxiliary shafts for the nth column to a second memory layer while the auxiliary shafts for the (n−1)th column will be etched to a first memory layer. This terraced process continues until all the columns of buttress spaces corresponding to all memory layers are performed. After n etchings, the auxiliary shafts for the nth column will reach to the nth memory layer, the auxiliary shafts for the (n−1)th column will reach to the (n−1)th memory layer, . . . , and the auxiliary shafts for the $1^{st}$ column will reach to the $1^{st}$ memory layer.

Figure 50A:
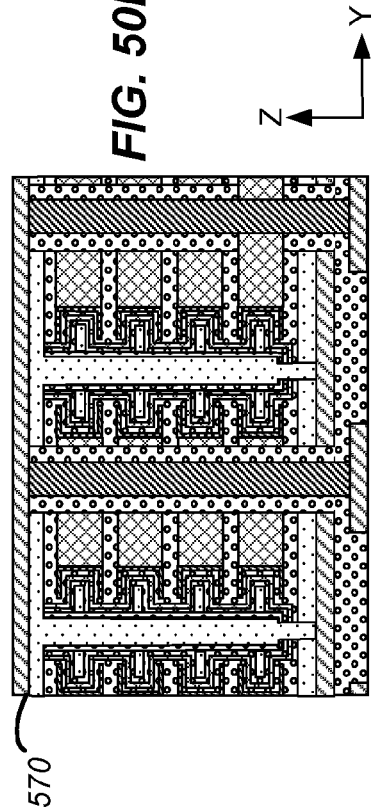
FIG. 50A is a plan view of the x-y plane of the multi-layer slab after depositing a hard mask layer.

FIG. 50A is a plan view of the x-y plane of the multi-layer slab after depositing a hard mask layer 570.

Figure 50B:
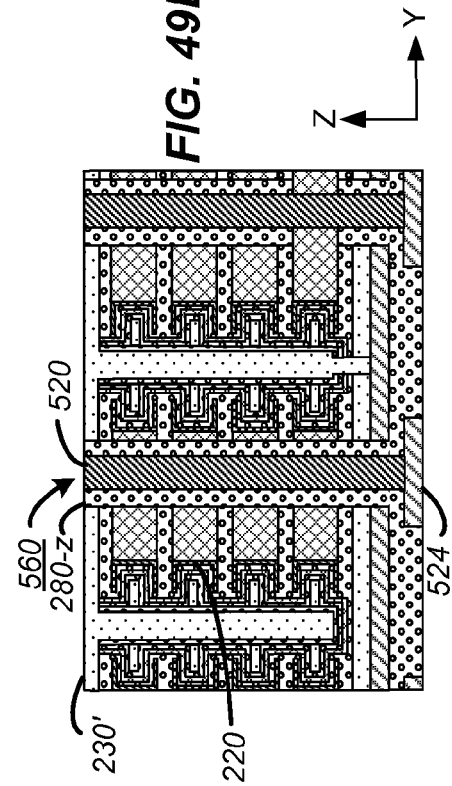
FIG. 50B is a cross-sectional view of the z-y plane of the multi-layer slab along the section B-B shown in FIG. 50A.

FIG. 50B is a cross-sectional view of the z-y plane of the multi-layer slab along the section B-B shown in FIG. 50A.

FIG. 51A is a plan view of the x-y plane of the multi-layer slab after placement of a layer contact mask. The layer contact mask 580 has openings 582 also within the buttress space 412'. Each opening 582 will expose a portion of the vertical word line VIA 520 and a portion of a layer of the interleaving nitride layers 282.

FIG. 51B is a cross-sectional view of the z-y plane of the multi-layer slab along the section B-B shown in FIG. 51A.

As outlined in FIG. 46, STEP 642, the column of vertical word line VIAs and the individual insulating coating are trimmed from the top of the memory to the memory layer associated with that column.

FIG. 52A is a plan view of the x-y plane of the multi-layer slab after an anisotropic etch through the openings 582 all the way to reach the first oxide layer 280-n. This is followed by an isotropic oxide etch of the layer of oxide 280-n and a portion of the insulating layer of oxide 280-z to expose the nitride layer 282 and a portion of the vertical word line VIA 520. This creates the beginning of the auxiliary shaft 562 adjacent to the vertical word line VIA 520.

FIG. 52B is a cross-sectional view of the z-y plane of the multi-layer slab along the section B-B shown in FIG. 52A.

The anisotropic etch cuts through the hard mask 570 and the top polysilicon layer 230' to reach the top oxide layer 280-n. This is followed by an isotropic oxide etch of the layer of oxide 280-n and a portion of the insulating layer of oxide 280-z to expose the nitride layer 282 and a portion of the vertical word line VIA 520. Since each of the interleaving nitride layer 282 leads to a back side of a word line 220, the layer contact mask 580 basically enables formation of the auxiliary shaft 562 to a designated nitride layer 282 so as to have access to a designated word line 220.

FIG. 53A is a plan view of the x-y plane of the multi-layer slab after depositing a layer terrace mask. A layer of terrace mask 590, typically a photoresist of a predetermined thickness, is deposited. A trench 570' along the y-direction is cut in the terrace mask 590 at a predetermined distance from a first column of vertical word line VIAs 520 (in the y-direction). The trench 570' will expose at its bottom the layer of hard mask 570 along the y-direction and an edge 592 of the terrace mask 590. The edge 592 is located at a predetermined distance along the x-direction from openings 582 (see FIG. 51A) associated with a column of vertical word line VIAs 520 for accessing the word lines in given memory layer.

FIG. 53B is a cross-sectional view of the z-y plane of the multi-layer slab along the section B-B shown in FIG. 53A.

FIG. 51A is a plan view of the x-y plane of the multi-layer slab after a controlled isotropic slimming of the terrace mask 590 by a predetermined amount. The controlled isotropic slimming will recess the edge 592 in the x-direction by the predetermined amount so that the openings 582 associated with a given column of vertical word line VIAs 520 are exposed. This slimming also removes the portion of the terrace mask material previously inside the exposed openings 582.

FIG. MB is a cross-sectional view of the z-y plane of the multi-layer slab along the section B-B shown in FIG. 51A. The isotropic slimming recesses the terrace mask 590 both in the x-direction and the z-direction. The slimming in the x-direction results in the exposure of the openings 582 associated with the given column of vertical word line VIAs 520. The slimming in the z-direction results in a thinning of the terrace mask 590 and the removal of the terrace mask material previously filling the auxiliary shaft 562.

FIG. 55A is a plan view of the x-y plane of the multi-layer slab after an anisotropic etch through the exposed openings 582 to extend the associated auxiliary shafts 562 downwards from the top of a nitride layer 282 to that of another nitride layer one memory layer lower. FIG. 55A illustrate an example for etching to the memory layer just below the top memory layer.

FIG. 55B is a cross-sectional view of the z-y plane of the multi-layer slab along the section B-B shown in FIG. 55A. The anisotropic etch of the auxiliary shaft 562 by one memory layer lower is accomplished first by an anisotropic nitride etch that cuts through the nitride layer 282 and extends the auxiliary shaft 562 to the underlying layer of oxide 280. Then an isotropic oxide etch removes the underlying layer oxide 280 to expose the nitride layer one memory layer lower. The oxide etch also removes the oxide lining 280-z that was exposed in the auxiliary shaft 562.

In general, if there are n memory layers, there will be n columns of openings 582, where each opening 582 intersects with a cross-section of a vertical word line VIA 520. The n columns of openings 582 are spaced apart in the x-direction. These openings 582 are uncovered from the terrace mask 590 a column at a time. As illustrated in FIG. 53A and FIG. 53B, in order to expose a given column of openings 582, a trench 570' having a reference edge 592 is cut in the terrace mask 590. This allows slimming of the terrace mask in the x-direction by a predetermined amount to expose the given column of openings 582. In this way, the first slimming will expose a first column of openings, a second slimming will further expose a second column of openings, etc. Progressing in this manner, finally all n columns of openings will be exposed.

The anisotropic etch of the auxiliary shaft 562 by one memory layer lower illustrated in FIG. 55A and FIG. 55B is repeated after each slimming except for the last. In this way, after n slimming, there will be n columns of openings exposed where the last exposed column will have an auxiliary shaft 562 suitable for accessing the nitride layer at the top memory layer (See FIG. 54A and FIG. 54B). The second to last exposed column will have an auxiliary shaft 562 suitable for accessing the nitride layer at the next memory layer down. Similarly, the first exposed column will have an auxiliary shaft 562 suitable for accessing the nitride layer at the bottom of the multi-layer slab.

Making Word Line Connections to Respective Vertical Word Line VIAs Through the Auxiliary Shafts After all the auxiliary shafts 562 for all the memory layers are in place, the word lines 220 at each memory layer will be connected to their respective vertical word line VIAs 520. The connection between a word line 220 and a respective vertical word line VIA 520 is accomplished in the auxiliary shaft 562 connecting the two. First the word line VIA 520 is trimmed to the base of the auxiliary shaft 562. Then an oxide lining to isolate any intermediate memory layers is created in the auxiliary shaft except at the bottom of the auxiliary shaft, where a portion of the vertical word line VIA 560 and the nitride layer are exposed. The nitride layer is removed to expose a portion of a word line. The auxiliary shaft is then filled with conductive material to connect the exposed word line to the vertical word line VIA. The following figures illustrate the processes for an auxiliary shaft that extends to the memory layer just below the top memory layer.

FIG. 56A is a plan view of the x-y plane of the multi-layer slab after an isotropic etch that remove the hard mask 570' and trim the vertical word line VIA 520 in each opening 582 to the bottom of the auxiliary shaft 562.

FIG. 56B is a cross-sectional view of the z-y plane of the multi-layer slab along the section B-B shown in FIG. 56A.

As outlined in FIG. 46, STEP 644, the extended shaft is lined with a second insulating coating.

Figure 57A:
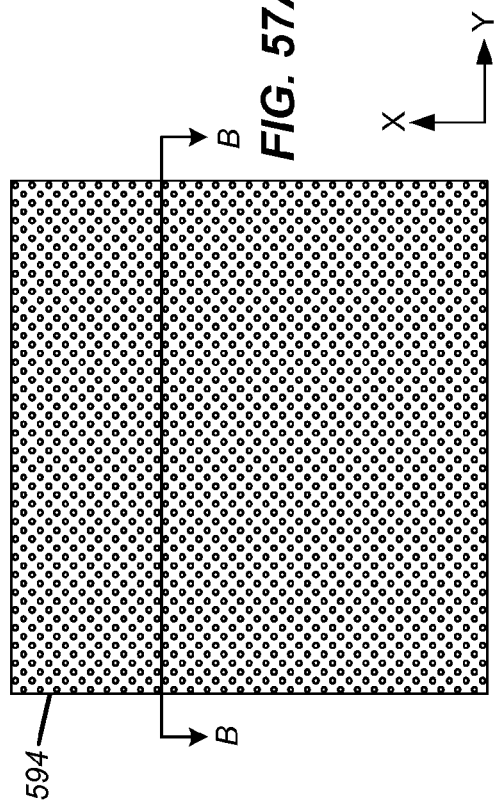
FIG. 57A is a plan view of the x-y plane of the multi-layer slab after depositing a layer of oxide.

FIG. 57A is a plan view of the x-y plane of the multi-layer slab after depositing a layer of oxide. The oxide 594 provides an isolation liner for the auxiliary shaft 562.

Figure 57B:
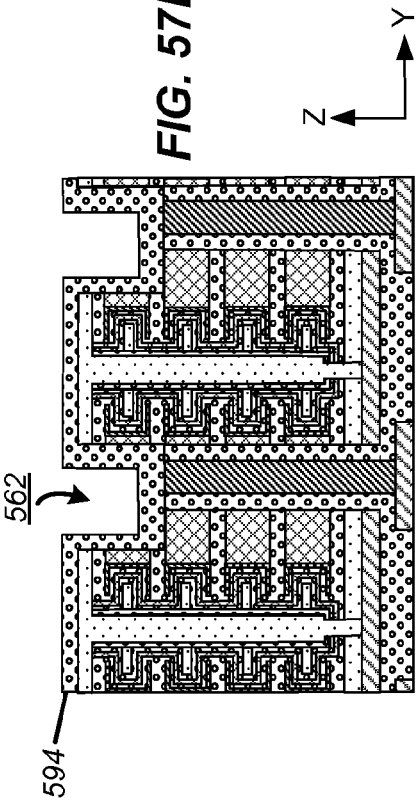
FIG. 57B is a cross-sectional view of the z-y plane of the multi-layer slab along the section B-B shown in FIG. 57A.

FIG. 57B is a cross-sectional view of the z-y plane of the multi-layer slab along the section B-B shown in FIG. 57A.

As outlined in FIG. 46, STEP 646, the second insulating coating on the ceiling of the memory layer is removed.

Figure 58A:
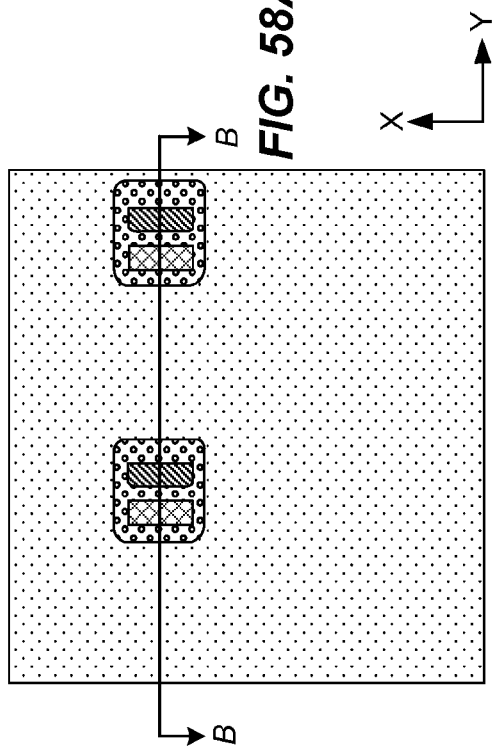
FIG. 58A is a plan view of the x-y plane of the multi-layer slab after an anisotropic etch that remove the layer of oxide in the x-y plane.

FIG. 58A is a plan view of the x-y plane of the multi-layer slab after an anisotropic etch that remove the layer of oxide 594 in the x-y plane. This will remove the oxide at the bottom of the auxiliary shaft 562 to expose a portion of the vertical word line VIA 560 and the nitride layer 282.

Figure 58B:
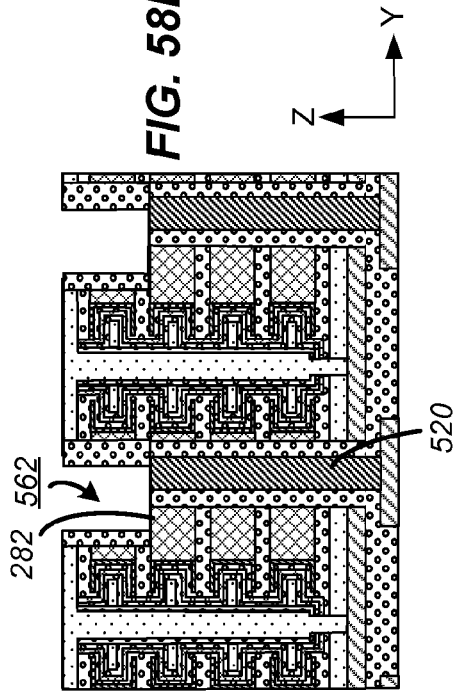
FIG. 58B is a cross-sectional view of the z-y plane of the multi-layer slab along the section B-B shown in FIG. 58A.

FIG. 58B is a cross-sectional view of the z-y plane of the multi-layer slab along the section B-B shown in FIG. 58A.

As outlined in FIG. 46, STEP 648 and STEP 650, the memory layer is excavated to expose the word line in the extended shaft. This is followed by filling the extended shaft with a conductive material.

Figure 59A:
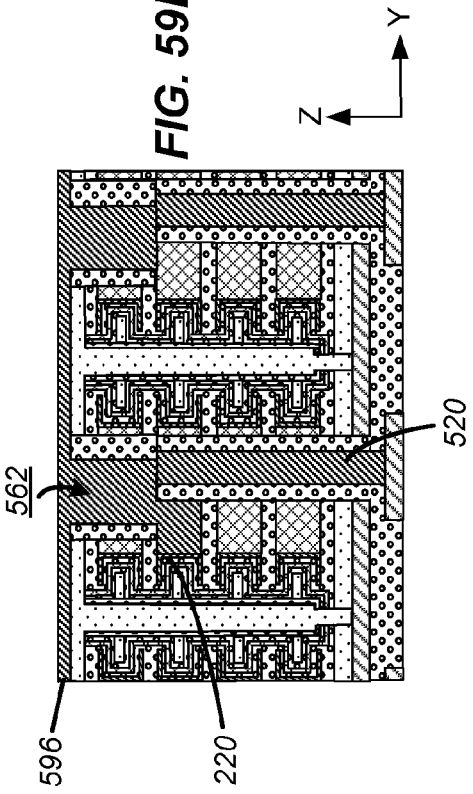
FIG. 59A is a plan view of the x-y plane of the multi-layer slab after removing the nitride in the memory layer to expose the word line.

FIG. 59A is a plan view of the x-y plane of the multi-layer slab after removing the nitride in the memory layer to expose the word line 220. This is followed by filling with a conductive material. The conductive material 596 fills the auxiliary shaft 562 and connects the word line 220 to the vertical word line VIA 520.

Figure 59B:
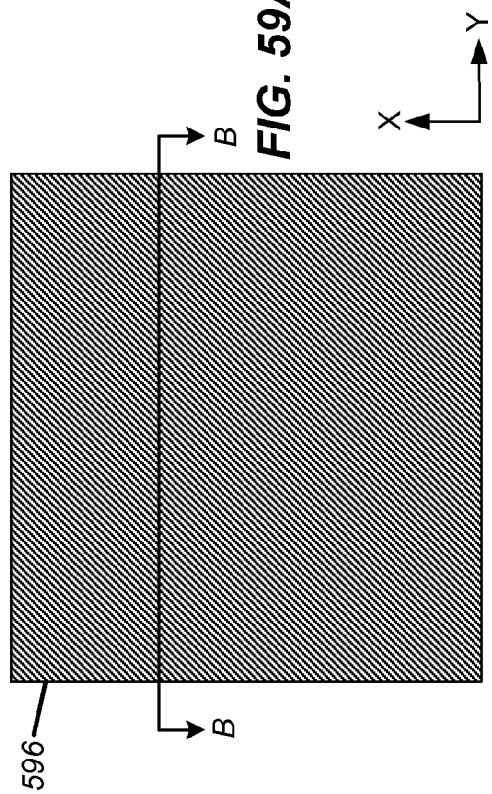
FIG. 59B is a cross-sectional view of the z-y plane of the multi-layer slab along the section B-B shown in FIG. 59A.

FIG. 59B is a cross-sectional view of the z-y plane of the multi-layer slab along the section B-B shown in FIG. 59A.

Figure 60A:
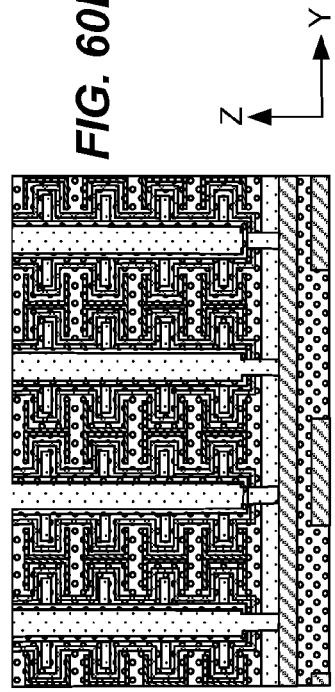
FIG. 60A is a plan view of the x-y plane of the multi-layer slab after removal of the layer of conductive material from the top surface of the multi-layer slab and finishing off with planarization.

FIG. 60A is a plan view of the x-y plane of the multi-layer slab after removal of the layer of conductive material from the top surface of the multi-layer slab and finishing off with planarization.

Figure 60B:
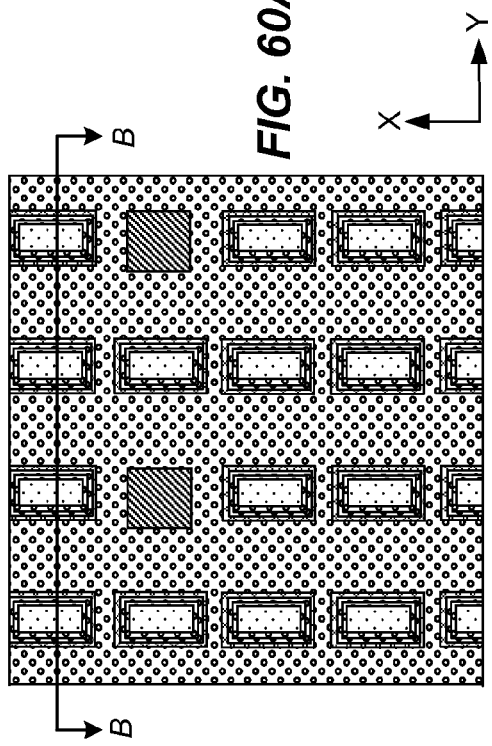

FIG. 60B is a cross-sectional view of the z-y plane of the multi-layer slab along the section B-B shown in FIG. 60A.

Bit Line Contacts

Referring to FIG. 8 and FIG. 12 again, the array of vertical bit lines 230 are connected to global bit lines 240 at the top of the multi-layer slab. Each word line crosses two adjacent rows of bit lines (even and odd rows on either side of the word line). Each row of bit lines are spaced apart along the x-direction and is connected to a corresponding row of global bit lines 240 elongated in the y-direction and spaced apart in the x-direction. Thus, at each column, spaced apart in the y-direction, there is an even set and an odd set of vertical bit lines spaced apart in the y-direction that is connectable respectively to an even and odd global bit line.

Figure 61A:
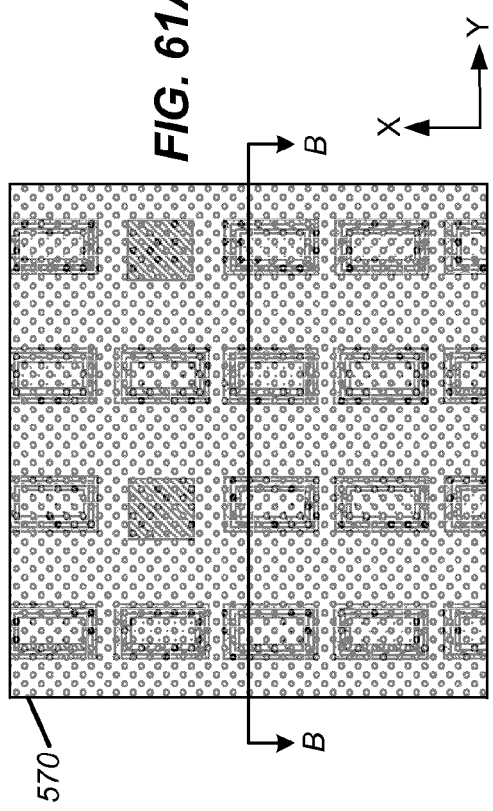

FIG. 61A is a plan view of the x-y plane of the multi-layer slab after depositing a layer of oxide.

Figure 61B:
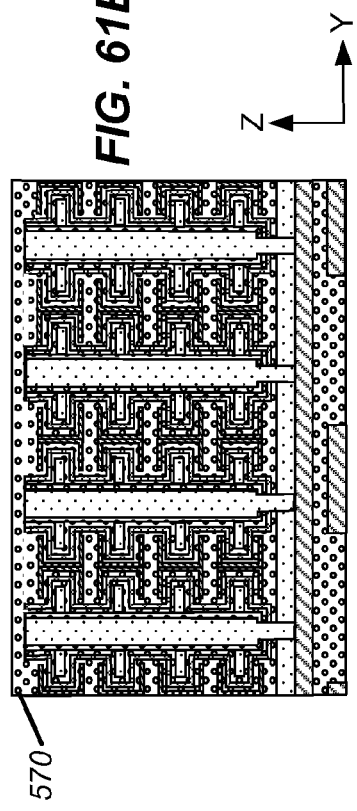

FIG. 61B is a cross-sectional view of the z-y plane of the multi-layer slab along the section B-B shown in FIG. 61A.

Figure 62A:
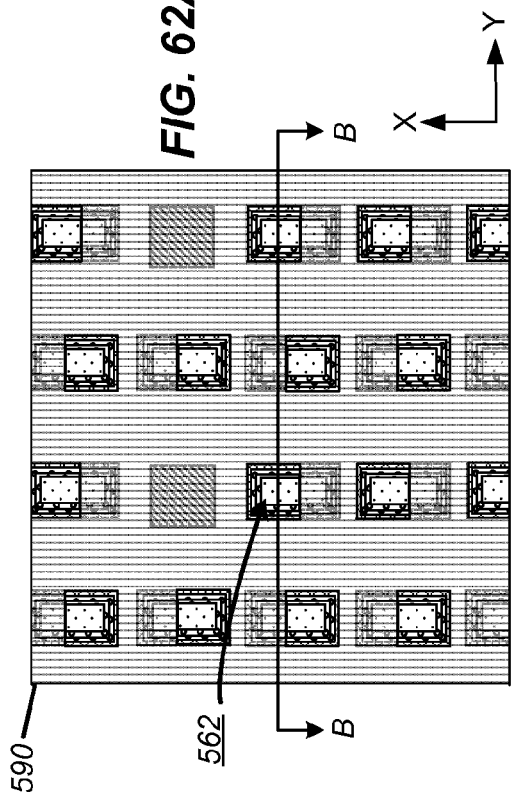

FIG. 62A is a plan view of the x-y plane of the multi-layer slab after masking and etching wells at even and odd contact points to the bit lines in the y-direction.

Figure 62B:
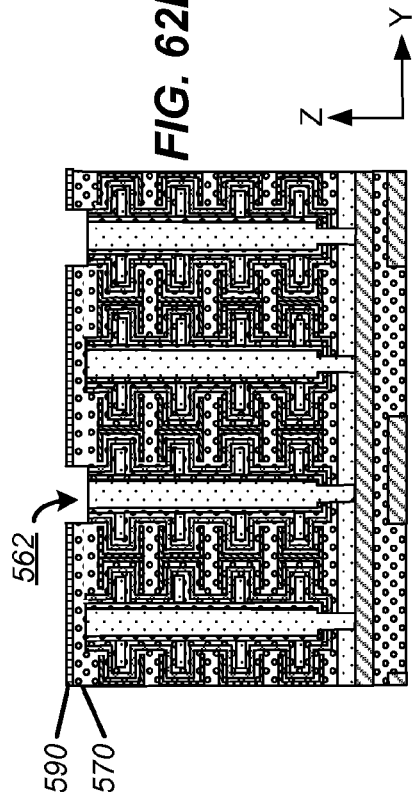

FIG. 62B is a cross-sectional view of the z-y plane of the multi-layer slab along the section B-B shown in FIG. 62A.

Forming Even and Odd Global Bit Lines

FIG. 63A is a plan view of the x-y plane of the multi-layer slab after depositing a layer of metal.

FIG. 63B is a cross-sectional view of the z-y plane of the multi-layer slab along the section B-B shown in FIG. 63A.

FIG. 64A is a plan view of the x-y plane of the multi-layer slab after etching with the aid of a mask to form even and odd metal lines corresponding to the even and odd global bit lines.

FIG. 64B is a cross-sectional view of the z-y plane of the multi-layer slab along the section B-B shown in FIG. 64A.

3-Mask Processes for Fabricating the 3D NAND Memory Having Word Lines with Socket Components FIG. 13 illustrates a process using four masks for fabricating the 3D NAND memory having word lines with socket components. A word line mask is used to partition the multi-layer slab into trenches spaced apart by ledges. Word lines are formed under the ledges elongated in the x-direction. A bit line mask is used to pattern the multi-layer slab along the y-direction. This allows creation of an array of openings at the top of the multi-layer slab, which is then used to create an array of vertical shafts. Using odd and even masks, the array of vertical shafts is further partitioned into a subarray of odd vertical shafts and a subarray of even vertical shafts respectively. The vertical shafts allow bit access to the memory layers in the multi-layer slab to fabricate individual memory cells with word lines having socket components along the x-direction and bit lines in the z-direction. The memory cells are fabricated in two installments. The array of vertical shafts is partitioned into subarrays of odd and even vertical shafts. Odd memory cells are fabricated through the subarrays of odd vertical shafts and even memory cells are fabricated through the subarrays of even vertical shafts. In particular, the even memory cells are fabricated to have their word line socket component overlap with those of the odd memory cells in order to form continuous word lines in the row direction.

Generally, it is desirable to use a minimum number of masks to reduce the total number of process steps. Processes using three masks are possible but at the higher risk of misalignment. The following 3-mask processes include techniques for managing the misalignment, thereby enabling employing a minimum of masks.

First 3-Mask Process Using Nitride as Sacrificial Memory Layers

Figure 65:
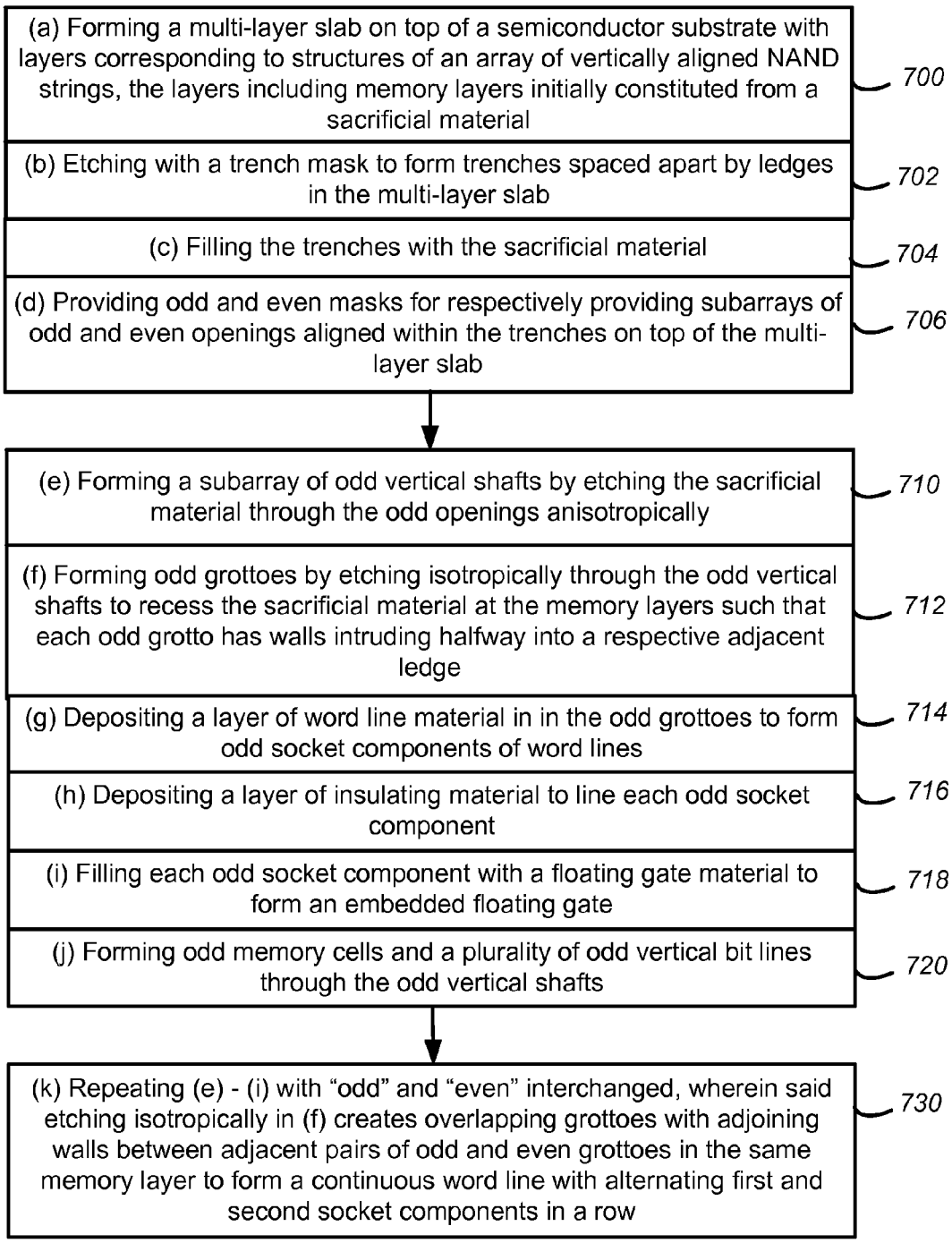

FIG. 65 illustrates a first 3-mask process using nitride as sacrificial material both in the memory layers and to fill the trenches to fabricate the 3D NAND memory. Specifically, the bit line mask in connection with FIG. 13 is omitted. The subarray of odd vertical shafts is formed directly by the odd mask and the subarray of even vertical shafts is formed directly by the even mask. Without the bit line mask, the subarray of even vertical shafts may be slightly misaligned relative to the subarray of odd vertical shafts. However, the misalignment is overcome by over-etching the grottoes of the even memory cells to create larger even grottoes so that its walls still overlap with those of the odd grottoes.

STEP 700: (a) forming a multi-layer slab on top of a semiconductor substrate with layers corresponding to structures of an array of vertically aligned NAND strings, the layers including memory layers initially constituted from a sacrificial material.

STEP 702: (b) etching with a trench mask to form trenches spaced apart by ledges in the multi-layer slab.

STEP 704: (c) filling the trenches with the sacrificial material.

STEP 706: (d) providing odd and even masks for respectively providing subarrays of odd and even openings aligned within the trenches on top of the multi-layer slab.

STEP 710: (e) forming a subarray of odd vertical shafts by etching the sacrificial material through the odd openings anisotropically.

STEP 712: (f) forming odd grottoes by etching isotropically through the odd vertical shafts to recess the sacrificial material at the memory layers such that each odd grotto has walls intruding halfway into a respective adjacent ledge.

STEP 714: (g) depositing a layer of word line material in the odd grottoes to form odd socket components of word lines.

STEP 716: (h) depositing a layer of insulating material to line each odd socket component.

STEP 718: (i) filling each odd socket component with a floating gate material to form an embedded floating gate.

STEP 720: (j) forming odd memory cells and a plurality of odd vertical bit lines through the odd vertical shafts.

STEP 730: (k) repeating (e)-(i) with "odd" and "even" interchanged, wherein said etching isotropically in (f) creates overlapping grottoes with adjoining walls between adjacent pairs of odd and even grottoes in the same memory layer to form a continuous word line with alternating first and second socket components in a row.

FIGS. 66-69B illustrate in more detail the main process steps of the first 3-mask process outlined in FIG. 65. The multi-layer slab is constituted from memory layers that are initially nitride layers acting as first sacrificial layers. The memory layers are interleaved by insulating oxide layers (see FIG. 14). After trenches are created, they are also filled with nitride as a second sacrificial material (see FIGS. 18A and 18B).

FIG. 66 is a plan view of the x-y plane of the multi-layer slab after deep trenches have been etched and then refilled with nitride similar to that illustrated in FIG. 18A and FIG. 18B. Thus, the multi-layer slab has a plurality of trenches 400 spaced apart by ledges 410. As an example of the width of each trench 400 is 70 nm. The trenches 400 are filled with a sacrificial material such as nitride.

FIG. 67A and FIG. 67B illustrate respectively the cross-sectional shape of the shafts near the top of the multi-layer slab and near the bottom of the shafts. Odd shafts are created by anisotropic etching of the nitride in the trenches similar to that illustrated in FIG. 20, except the odd shafts are created directly by an odd mask. The cross section of the odd shafts will be wider near the top of the multi-layer slab than near the bottom due to the anisotropic etching being less effective at greater depth through the shafts.

FIG. 67A is a plan view of the x-y plane showing the odd shafts 432-O near the top of the multi-layer slab. The cross-sectional shape essentially conform to the rectangular shape which is the cross section of the odd shaft 432-0, similar to that shown in FIG. 26 and FIG. 28A. A further isotropic etch of the nitride at the memory layers will recess the nitride isotropically from each odd shaft 432-O (e.g., by about 35 nm) to form a larger rectangular hole with rounded corners 433-O.

FIG. 67B is a plan view of the x-y plane showing the odd shafts 432'-O near the bottom of the multi-layer slab. The cross-sectional shape, which is more oval, will be smaller. A further isotropic etch of the nitride at the memory layers will recess the nitride isotropically from each odd shaft 432'-O to form a larger oval hole 433'-O.

FIG. 68A is a plan view of the x-y plane showing the grottoes near the top of the multi-layer slab after depositing a layer of the word line material 222 similar to that shown in FIG. 33A.

FIG. 68B is a plan view of the x-y plane showing the grottoes near the bottom of the multi-layer slab after depositing a layer of the word line material 222 in the odd grottoes similar to that shown in FIG. 33A.

FIG. 69A is a plan view of the x-y plane near the top of the multi-layer slab after the formation of odd memory cells and the even shafts 432-E in between. The formation of the odd memory cells have been described before (see FIGS. 35A-43B).

Again, owing to the non-uniformity of the isotropic etch in creating the even shafts across the depth of the multi-layer slab, each even shaft 432-E has a rectangular cross section near the top. A further isotropic etch of the nitride at the memory layers will recess the nitride isotropically from each even shaft 432-E to form a larger rectangular hole with rounded corners 433-E. However, the isotropically etch of the nitride at the memory layers is over-etched to compensate for possible misalignment of the even mask. Thus, for example, the nitride will be recessed from each even shaft by more than that for the odd-shaft, such as greater than 35 nm. In this way, the wall of each grotto will overlap with that of an adjacent one either in the same row or an adjacent row to be able to form a continuous word line along the row direction.

FIG. 69B is a plan view of the x-y plane shown in FIG. 69A but near the bottom of the multi-layer slab. It will be seen that cross-section of the even shafts 432-E is more oval and smaller than those near the top. A further isotropic etch of the nitride at the memory layers will recess the nitride isotropically from each even shaft 432'-E to form a larger oval hole 433'-E. The over etch will allow overlap of the walls of adjacent grottoes.

Thus, despite possible misalignment in the process due to employment of only three masks, over etching isotropically when forming the even grottoes will enable a continuous word line to be formed from a row of overlapping socket components.

Second 3-Mask Process Using Polysilicon as Sacrificial Memory Layers

In a second 3-mask process, differential sacrificial materials are employed between the memory layer and the filling in the trenches. For example, polysilicon instead of nitride is used as a first sacrificial material for the memory layer while nitride is used as a second sacrificial material for filling the trenches. This allows better control of the etching in the column direction relative to the row direction.

FIG. 70 illustrates a second 3-mask process using polysilicon as sacrificial memory layers to fabricate the 3D NAND memory.

STEP 800: (a) forming a multi-layer slab on top of a semiconductor substrate with layers corresponding to structures of an array of vertically aligned NAND strings, the layers including memory layers initially constituted from a first sacrificial material.

STEP 802: (b) etching with a trench mask to form trenches spaced apart by ledges in the multi-layer slab.

STEP 804: (c) filling the trenches with a second sacrificial material to form filled trenches.

STEP 806: (d) providing odd and even masks for respectively providing subarrays of odd and even openings aligned within the filled trenches on top of the multi-layer slab.

STEP 810: (e) forming a subarray of odd vertical shafts by etching the second sacrificial material through the odd openings anisotropically and then isotropically.

STEP 812: (f) forming odd grottoes by etching isotropically to recess the first sacrificial material at the memory layers such that each odd grotto has walls intruding halfway into a respective adjacent ledge and a grotto opening with jambs of the second sacrificial material in each odd shaft.

STEP 813: (g) Removing the jambs by etching through each odd shaft the second sacrificial material isotropically to widen the grotto opening.

STEP 814: (h) depositing a layer of word line material in the odd grottoes to form odd socket components of a word lines.

STEP 816: (i) depositing a layer of insulating material to line each odd socket component.

STEP 818: (j) filling each odd socket component with a floating gate material to form an embedded floating gate.

STEP 820: (k) forming odd memory cells and a plurality of odd vertical bit lines through the odd vertical shafts.

STEP 830: (l) repeating (e)-(k) with every occurrence of "odd" replaced by "even", wherein said etching isotropically in (e) removes all the second sacrificial material to create even vertical shafts with a rectangular cross-section hemmed in by a width of the trench and two adjacent odd memory cells and further includes refilling of nitride removed from corners of the even vertical shafts; and said etching isotropically in (f) creates overlapping grottoes with adjoining walls between adjacent pairs of even and odd grottoes in the same memory layer to form a continuous word line with alternating odd and even socket components in a row.

FIGS. 71-81B illustrate in more detail the main process steps of the first 3-mask process outlined in FIG. 70. The multi-layer slab is constituted from memory layers that are initially polysilicon layers acting as first sacrificial layers. The memory layers are interleaved by insulating oxide layers. The trenches are filled with nitride as a second sacrificial material.

FIG. 71 is a plan view of the x-y plane of the multi-layer slab after deep trenches have been anisotropically etched and then refilled with the second sacrificial material such as nitride similar to that illustrated in FIG. 18A and FIG. 18B.

Thus, the multi-layer slab has a plurality of trenches 400 spaced apart by ledges 410. As an example of the width of each trench 400 is 70 nm.

FIG. 72A and FIG. 72B illustrate respectively the cross-sectional shape of the odd shafts near the top of the multi-layer slab and near the bottom of the shafts. Odd shafts are created by anisotropic etching of the second sacrificial material (e.g., nitride) in the trenches similar to that illustrated in FIG. 20, except the odd shafts are created directly by an odd mask. The cross section of the odd shafts will be wider near the top of the multi-layer slab than near the bottom due to the anisotropic etching being less effective at greater depth through the shafts.

FIG. 72A is a plan view of the x-y plane showing the odd shafts 432-O near the top of the multi-layer slab. The cross-sectional shape essentially conform to the rectangular shape which is the cross section of the odd shaft 432-0, similar to that shown in FIG. 26 and FIG. 28A.

FIG. 72B is a plan view of the x-y plane showing the odd shafts 432'-O near the bottom of the multi-layer slab. The cross-sectional shape, which is more oval, will be smaller.

FIG. 73A and FIG. 73B illustrate respectively the cross-sectional shape of the odd shafts 433-O near the top of the multi-layer slab and the odd shafts 433'-O near the bottom of the shafts after a further isotropic etching of the second sacrificial material (e.g., nitride) filling the shafts to expand the shafts. Owing to the difference between the first and second sacrificial material, the expansion of the shaft is limited along the column (y-direction) by the trench walls.

FIG. 74A and FIG. 74B illustrate respectively the cross-sectional shape of the odd shafts near the top of the multi-layer slab and near the bottom of the shafts after a further isotropic etching of the first sacrificial material (e.g., polysilicon) at the memory layers to form the odd grottoes 284-O. It will be seen that each odd grotto 284-O has an opening that is restricted by a pair of jambs 286 from the second sacrificial material in the trench.

FIG. 75A and FIG. 75B illustrate respectively the cross-sectional shape of the odd shafts near the top of the multi-layer slab and near the bottom of the shafts after an isotropic etching of the jambs of the second sacrificial material in the trenches. The opening of each odd grotto 284-O is unblocked after the jambs are removed.

FIG. 76A and FIG. 76B illustrate respectively the cross-sectional shape of the odd shafts near the top of the multi-layer slab and near the bottom of the shafts after depositing a layer of word line material 222 in the odd grottoes 284-O to form socket components of the word lines. This is followed by forming the other portions of the odd memory cells in the odd shafts.

FIG. 77A and FIG. 77B illustrate respectively the cross-sectional shape of the even shafts near the top of the multi-layer slab and near the bottom of the even shafts. The formation of the even shafts 432-E and 432'-E in the trench interleaving the previous odd shafts is accomplished by using an even mask.

FIG. 78A and FIG. 78B illustrate respectively the cross-sectional shape of the even shafts near the top of the multi-layer slab and even shafts near the bottom of the shafts after an isotropic etching of the second sacrificial material in the trenches. Owing to the difference between the first and second sacrificial material, the expansion of the even shafts 432-E and 432'-E is limited along the column (y-direction) by the trench walls and limited in the row (x-direction) by a pair of adjacent odd memory cells. Thus, even if the even mask were a bit out of alignment, the even shafts would still be self-aligned.

FIG. 79A and FIG. 79B illustrate respectively the cross-sectional shape of the even shafts near the top of the multi-layer slab and near the bottom of the even shafts. After the self-aligned even shafts have been formed, each even shaft has a rectangular cross section. A layer of second sacrificial material is reintroduced to seal each of the corners 286 of the even shafts.

FIG. 80A and FIG. 80B illustrate respectively the cross-sectional shape of the even shafts near the top of the multi-layer slab and near the bottom of the even shafts. An isotropic etch of the first sacrificial material at the memory layers creates the even grottoes 284-E. The etching is allowed to proceed until there is overlap between the walls of the odd and even grottoes 284-O.

FIG. 81A and FIG. 81B illustrate respectively the cross-sectional shape of the even shafts near the top of the multi-layer slab and near the bottom of the even shafts. A layer of word line material 222 is then deposited in the even grottoes 284-E. The word line material is also in electric contact with the walls of the odd grottoes 284-O so that a continuous word lines are formed along the row direction.

Third 3-Mask Process Using Polysilicon as Sacrificial Memory Layers

In the second 3-mask process described above, the isotropic etching to recess the first sacrificial layer to form grottoes leaves a pair of jambs of the second sacrificial material at the opening of each grotto. This requires additional steps to remove the jambs.

In a third 3-mask process, as in the second 3-mask process, differential sacrificial materials are employed between the memory layer and the filling in the trenches. Using a technique to pre-recess the first sacrificial material at the memory layers into groves, the formation and removal of jambs of the second 3-mask process are avoided.

FIG. 82 illustrates a third 3-mask process using polysilicon as sacrificial memory layers to fabricate the 3D NAND memory.

STEP 850: (a) forming a multi-layer slab on top of a semiconductor substrate with layers corresponding to structures of an array of vertically aligned NAND strings, the layers including memory layers initially constituted from a first sacrificial material.

STEP 852: (b) etching with a trench mask to form trenches spaced apart by ledges in the multi-layer slab.

STEP 854: (c) etching through the trench the first sacrificial material from each memory layer to create a grove relative to the trench.

STEP 855: (d) filling the trenches with a second sacrificial material to form filled trenches.

STEP 856: (e) providing odd and even masks for respectively providing subarrays of odd and even openings aligned within the filled trenches on top of the multi-layer slab.

STEP 860: (f) forming a subarray of odd vertical shafts by etching the second sacrificial material through the odd openings anisotropically and then isotropically to reach the groves.

STEP 862: (g) forming odd grottoes by etching isotropically to recess the sacrificial polysilicon of the memory layers such that each odd grotto has walls intruding halfway into a respective adjacent ledge.

STEP 864: (h) depositing a layer of word line material in the odd grottoes to form odd socket components of a word lines.

STEP 866: (i) depositing a layer of insulating material to line each odd socket component.

STEP 868: (j) filling each odd socket component with a floating gate material to form an embedded floating gate.

STEP 870: (k) forming odd memory cells and a plurality of odd vertical bit lines through the odd vertical shafts.

STEP 880: (l) repeating (f)-(k) with every occurrence of "odd" replaced by "even", wherein said etching isotropically in (f) removes all the second sacrificial material to create even vertical shafts with a rectangular cross-section hemmed in by the groves and two adjacent odd memory cells and further includes refilling of the second sacrificial material removed from corners of the even vertical shafts; and said etching isotropically in (g) creates overlapping grottoes with adjoining walls between adjacent pairs of even and odd grottoes in the same memory layer to form a continuous word line with alternating odd and even socket components in a row.

FIGS. 83-91B illustrate in more detail the main process steps of the first 3-mask process outlined in FIG. 82. The multi-layer slab is constituted from memory layers that are initially polysilicon layers acting as first sacrificial layers. The memory layers are interleaved by insulating oxide layers. The trenches are filled with nitride as a second sacrificial material.

FIG. 83 is a plan view of the x-y plane of the multi-layer slab after deep trenches have been anisotropically etched. Thus, the multi-layer slab has a plurality of trenches 400 spaced apart by ledges 410, which is shown covered by a layer of oxide 280. As an example, the width of each trench 400 is 70 nm.

FIG. 84A is a plan view of the x-y plane of the multi-layer slab after an isotropic etch through the trenches 400 of the first sacrificial layer 288 to recess a grove 404 in the layer. The trenches 400 are then refilled with the second sacrificial layer 402

FIG. 84B is a cross-sectional view of the y-z plane of the multi-layer slab along the section B-B shown in FIG. 84A.

FIG. 85A and FIG. 85B illustrate respectively the cross-sectional shape of the odd shafts near the top of the multi-layer slab and near the bottom of the odd shafts. The odd shafts 432-O and 432'-O are formed by anisotropically etching the second sacrificial material 402 filling the trenches 400 through an odd mask.

FIG. 86A and FIG. 86B illustrate respectively the cross-sectional shape of the odd shafts near the top of the multi-layer slab and near the bottom of the shafts after an isotropic etch to create expanded odd shafts 433-O and 433'-O. The odd shafts are expanded by isotropically etching the second sacrificial material 402. The expansion is stopped in the y-direction at a back wall of the grooves 404 when the first sacrificial material 288 (e.g., polysilicon) is reached.

FIG. 87A and FIG. 87B illustrate respectively the cross-sectional shape of the odd shafts near the top of the multi-layer slab and near the bottom of the shafts after an isotropic etch to recess the first sacrificial material 288 at the memory layers to form the odd grottoes 284-O.

FIG. 88A and FIG. 88B illustrate respectively the cross-sectional shape of the odd expanded shafts 433-O near the top of the multi-layer slab and odd shafts 433'-O near the bottom of the shafts after depositing a layer of word line material 222 in the odd grottoes 284-O. This is followed by formation of the rest of the odd memory cells.

FIG. 89A and FIG. 89B illustrate respectively the cross-sectional shape of the even expanded shafts near the top of the multi-layer slab and near the bottom of the even expanded shafts. The formation of the even expanded shafts 433-E and 433'-E is accomplished by using an even mask to create the even shafts 432-E and 432'-E in the trench interleaving the odd memory cells. Then the even shafts are expanded by an isotropic etching of the second sacrificial material similar to FIGS. 78A and 78B.

FIG. 90A and FIG. 90B illustrate respectively the cross-sectional shape of the even expanded shafts 433-E and 433'-E near the top of the multi-layer slab and near the bottom of the even expanded shafts. After the self-aligned even shafts have been formed, each even shaft has a rectangular cross section. A layer of second sacrificial material is reintroduced to seal each of the corners 286 of the even shafts. This is followed by an isotropic etching of the first sacrificial material 288 to form the even grottoes 284-E similar to those illustrated in FIGS. 79A-80B.

FIG. 91A and FIG. 91B illustrate respectively the cross-sectional shape of the even shafts near the top of the multi-layer slab and near the bottom of the even shafts after depositing a layer of word line material 222 in the even grottoes 284-E. The process is similar to those in FIGS. 89A and 89B.

Thereafter, the even memory cells are formed as before. In this way, word lines with socket components are formed such that the memory cells controlled by a word line have their floating gates embedded in respective socket components.

CONCLUSION

The foregoing detailed description of the subject matter has been presented for purposes of illustration and description. It is not intended to be exhaustive or to limit the subject matter to the precise form disclosed. Many modifications and variations are possible in light of the above teaching. The described embodiments were chosen in order to best explain the principles of the present subject matter and its practical application. It is intended that the scope of the subject matter be defined by the claims appended hereto.

It is claimed:

1. A method of forming a 3D NAND memory, comprising:
   (a) forming a multi-layer slab on top of a semiconductor substrate with layers corresponding to structures of an array of vertically aligned NAND strings, the layers including memory layers initially constituted from a sacrificial material;
   (b) forming an array of vertical shafts in rows and columns through openings across a top surface of the multi-layer slab, wherein the rows of vertical shafts are interleaved by ledges, each row of vertical shafts provides access for forming memory cells at the memory layers under an adjacent ledge, and wherein the array of vertical shafts is partitioned into first and second subarrays of either odd or even shafts;
   (c) selecting the vertical shafts of the first subarray while masking those of the second subarrays;
   (d) forming grottoes by isotropically recessing the sacrificial material of the memory layers though the selected vertical shafts, each grotto having walls intruding about halfway into a respective adjacent ledge;
   (e) depositing a layer of word line material in each grotto to form a socket component of a word line;
   (f) depositing a layer of insulating material to line the socket component of a word line;
   (g) filling the socket component with a floating gate material to form an embedded floating gate;
   (h) forming other structures of the NAND strings and a plurality of vertical bit lines through the selected vertical shafts; and
   (i) selecting the vertical shafts of the second subarray while masking those of the first subarray and repeating (d)-(h), and wherein said isotropically recessing in (d) has the wall of each grotto contiguous with adjacent one in the same memory layer formed through the vertical shafts of the first subarray to form a continuous word line with socket components in a row.

2. The method of forming a 3D NAND memory as in claim 1, wherein:
   each row of vertical shafts is sandwiched by two adjacent ledges; and
   through each vertical shaft, two memory cells sharing a vertical bit line are formed for every memory layer under the two adjacent ledges.

3. The method of forming a 3D NAND memory as in claim 1, wherein:
   where a ledge is sandwiched by two adjacent rows of vertical shafts such that each vertical shaft has an adjacent vertical shaft across the ledge, a first socket component is formed through a vertical shaft of the first subarray in a first grotto having an intrusion about half into the ledge; and
   a second socket component is formed through the adjacent vertical shaft of the second subarray in a second grotto having an intrusion about half into the ledge.

4. The method of forming a 3D NAND memory as in claim 1, wherein:
   the word line material is metal.

5. The method of forming a 3D NAND memory as in claim 1, wherein:
   the word line material is tungsten.

6. The method of forming a 3D NAND memory as in claim 1, wherein:
   the floating gate material is doped polysilicon.

7. The method of forming a 3D NAND memory as in claim 1, wherein:
   the insulating material is an interpoly dielectric material.

8. The method of forming a 3D NAND memory as in claim 1, wherein:
   the bit lines are formed from doped polysilicon.

9. The method of forming a 3D NAND memory as in claim 1, wherein:
   the sacrificial material is a nitride.

10. The method of forming a 3D NAND memory as in claim 1, wherein:
    the selecting of vertical shafts in the first subarray in c) further comprises:
    filling the array of vertical shafts with nitride;
    masking the openings above the second subarrays at the top of the multi-layer slab; and
    etching to remove the nitride through the vertical shafts of the first subarrays.

11. A method of forming a 3D NAND memory having memory cells arranged in a three-dimensional pattern defined by rectangular coordinates having x, y and z-directions, said method comprising:
    (a) forming a multi-layer slab on top of a semiconductor substrate in an x-y plane, layers of the multi-layer slab being stacked in the z-direction and corresponding to structures of an array in the x-y plane of vertically aligned NAND strings in the z-direction, the layers including memory layers initially constituted from a sacrificial material;
    (b) forming an array of vertical shafts in the z-direction in rows along the x-direction and columns along the y-direction through openings across a top surface of the multi-layer slab, wherein the rows of vertical shafts in the x-direction are spaced apart in the y-direction by ledges, each row of vertical shafts provides access for forming memory cells at the memory layers under an adjacent ledge, and wherein the array of vertical shafts is partitioned into first and second subarrays of either odd or even shafts;
    (c) selecting the vertical shafts of the first subarray while masking those of the second subarrays;
    (d) forming grottoes by isotropically recessing the sacrificial material of the memory layers though the selected vertical shafts, each grotto having walls intruding in the x-y plane about halfway into a respective adjacent ledge;
    (e) depositing a layer of word line material in each grotto to form a socket component of a word line;
    (f) depositing a layer of insulating material to line the socket component of a word line;
    (g) filling the socket component with a floating gate material to form an embedded floating gate;
    (h) forming other structures of the NAND strings and a plurality of vertical bit lines along the z-direction through the selected vertical shafts; and
    (i) selecting the vertical shafts of the second subarray while masking those of the first subarray and repeating (d)-(h), and wherein said isotropically recessing in (d) has the wall of each grotto contiguous with adjacent one in the same memory layer formed through the vertical shafts of the first subarray to form a continuous word line with socket components in a row.

12. The method of forming a 3D NAND memory as in claim 11, wherein:
    each row of vertical shafts is sandwiched by two adjacent ledges; and
    through each vertical shaft, two memory cells sharing a vertical bit line are formed for every memory layer under the two adjacent ledges.

13. The method of forming a 3D NAND memory as in claim 11, wherein:
    where a ledge is sandwiched by two adjacent rows of vertical shafts such that each vertical shaft has an adjacent vertical shaft across the ledge, a first socket component is formed through a vertical shaft of the first subarray in a first grotto having an intrusion about half into the ledge; and
    a second socket component is formed through the adjacent vertical shaft of the second subarray in a second grotto having an intrusion about half into the ledge.

14. The method of forming a 3D NAND memory as in claim 11, wherein:
    the word line material is metal.

15. The method of forming a 3D NAND memory as in claim 11, wherein:
    The word line material is tungsten.

16. The A method of forming a 3D NAND memory as in claim 11, wherein:
    the floating gate material is doped polysilicon.

17. The method of forming a 3D NAND memory as in claim 11, wherein:
    the insulating material is an interpoly dielectric material.

18. The method of forming a 3D NAND memory as in claim 11, wherein:
    the bit lines are formed from doped polysilicon.

19. The method of forming a 3D NAND memory as in claim 11, wherein:
    the memory layers of the multi-layer slab are constituted from a sacrificial material.

* * * * *